United States Patent
Kunori et al.

[19]

[11] Patent Number: 6,144,584
[45] Date of Patent: *Nov. 7, 2000

[54] NON-VOLATILE SEMICONDUCTOR MEMORY DEVICE AND METHOD OF MANUFACTURING THE SAME

[75] Inventors: Yuichi Kunori; Atsushi Ohba, both of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/184,865

[22] Filed: Nov. 3, 1998

[30] Foreign Application Priority Data

May 12, 1998 [JP] Japan ................................. 10-129102

[51] Int. Cl.⁷ ................................................. G11C 16/04
[52] U.S. Cl. .............................. 365/185.18; 365/185.23; 365/185.24
[58] Field of Search ........................ 365/185.18, 185.05, 365/185.06, 185.23, 185.24, 185.11, 185.13

[56] References Cited

U.S. PATENT DOCUMENTS

| | | |
|---|---|---|
| 4,775,958 | 10/1988 | Hashimoto ............................. 365/185 |
| 5,400,276 | 3/1995 | Takeguchi . |
| 5,521,864 | 5/1996 | Kobayashi et al. ................ 365/185.22 |
| 5,596,523 | 1/1997 | Endoh et al. ............................. 365/182 |
| 5,646,585 | 7/1997 | Brahmbhatt ......................... 365/185.16 |
| 5,923,585 | 7/1999 | Wong et al. ....................... 365/185.03 |
| 5,923,589 | 7/1999 | Kaida et al. ....................... 365/185.28 |

FOREIGN PATENT DOCUMENTS 6-275083  9/1994  Japan .

*Primary Examiner*—David Nelms
*Assistant Examiner*—Gene N. Auduong
*Attorney, Agent, or Firm*—McDermott, Will & Emery

[57] ABSTRACT

Source line select transistors are provided corresponding to word lines. The source line select transistors are turned on in response to signal voltages on the corresponding word lines to connect a main source line to corresponding sub-source lines. The sub-source lines are arranged corresponding to sets of word lines. Programming/erasing are performed by using channel hot electrons and a Fowler-Nordheim current, by applying voltages to the word lines and the bit lines such that an excessive voltage may not be transmitted from the main source line to the sub-source line. Memory cell data can be precisely read out without an influence by a leak current of an over-erased or over-programmed memory cell.

20 Claims, 40 Drawing Sheets

F-N TUNNELING CURRENT

WHOLE CHANNEL FN CURRENT

FIG. 18
| MEMORY CELL MT | SOURCE LINE SELECT TRANSISTOR |
|---|---|
| HIGH Vth | LOW Vth |
| HIGH Vth | HIGH Vth |
| LOW Vth | LOW Vth |
FIG. 19
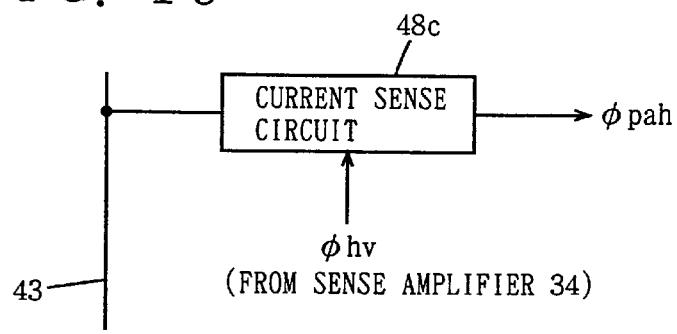
FIG. 20
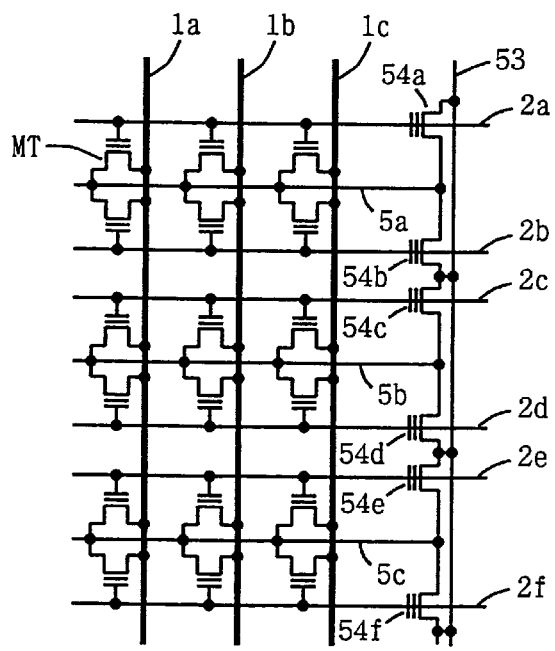

$$V1 = Vr \cdot \frac{CB + CS}{2 \cdot CB + CS} > Vr/2$$

$$\left( Vr' \cdot \frac{CB + CS}{2 \cdot CB + CS} < Vr/2 \right)$$

$$V2 = Vr \cdot \frac{CB}{2 \cdot CB + CS} < Vr/2$$

20Ω/□ OR LESS

NON-VOLATILE SEMICONDUCTOR MEMORY DEVICE AND METHOD OF MANUFACTURING THE SAME

BACKGROUND OF THE INVENTION

1. Field of the Invention

The present invention relates to a nonvolatile semiconductor memory device, and particularly to a nonvolatile semiconductor memory device called a flash memory and including memory cells each formed of one floating gate field effect transistor. More particularly, the invention relates to a structure for stably reading data even if a threshold voltage of the memory cell transistor is low.

2. Description of the Background Art

A memory called a flash memory has been known as one of memories which store information in a nonvolatile manner. In this flash memory, each memory cell is formed of one floating gate field effect transistor. Storage of data is performed by injection/ejection of electrons with respect to a floating gate. In an N-channel MOS transistor, a threshold voltage Vth of a floating gate field effect transistor (memory cell transistor) increases when electrons are injected into the floating gate, and the threshold voltage Vth of the memory cell transistor lowers when electrons are drawn out or ejected from the floating gate. The floating gate is electrically isolated from other portions by an insulating film, and continuously holds electrons. The high and low states of threshold voltages Vth, which are set in accordance with the quantity of electric charges in the floating gate as described above, are correlated to "1" and "0" of binary information.

In reading data, a voltage intermediate the high and low threshold voltages is applied to a control electrode, and data reading is performed by determining whether a current flows through the memory cell transistor or not.

In a nonvolatile semiconductor memory device, the memory cells are arranged in rows and columns, and word lines are arranged corresponding to the respective rows. Also, bit lines are arranged corresponding to the respective columns. Lowering of the threshold voltage is performed on a predetermined number of memory cells at a time. If there are variations in write/erase characteristics of the memory cells, which exhibit the degrees of injection and ejection of electrons into and from the floating gates, a threshold voltage Vth of a certain memory cell may be excessively low and close to 0 V, and a leak current in this memory cell may increase. In an NOR type flash memory, this state in which the threshold voltage is low and close to or below 0 V is called an "over-erased" state. The NOR type flash memory is a memory having a structure in which all memory cells in each column are connected to the same bit line. In a DINOR type flash memory, the state in which the threshold voltage is excessively low is called an "over-programmed" state. In the DINOR type flash memory, a plurality of sub-bit lines are arranged for the memory cells in each column, and the sub-bit lines connected to the memory cells are connected to a main bit line through select transistors, respectively.

If such an over-erased or over-programmed memory cell exists, memory cell data cannot be precisely read out due to the leak current thereof. In the following description, the over-erased state of the NOR type flash memory and the over-programmed state of the DINOR type flash memory may be genericly referred to as an "over-low Vth" state. For preventing an influence by the memory cell in the over-low Vth state, such a structure has been proposed in which memory cell current flows only through memory cells of two bits at most in a selected column.

FIG. 78 schematically shows a structure of an array of a conventional NOR type flash memory. FIG. 78 shows memory cells MT arranged in four rows and three columns. Each memory cell MT is formed of one floating gate field effect transistor. Word lines WLa, WLb, WLc and WLd are arranged corresponding to the respective rows of memory cells MT, and bit lines BLa, BLb and BLc are arranged corresponding to the respective columns of memory cells MT. A sub-source line SSLa is arranged for memory cells MT connected to a set of word lines WLa and WLb adjacent to each other, and a sub-source line SSLb is arranged for memory cells MT connected to another set of word lines WLc and WLd adjacent to each other. Source line select transistors SSTa–SSTd, which are turned on in response to signal potentials on corresponding word lines WLa–WLd, are arranged in the corresponding rows of memory cells MT, respectively. When turned on, these source line select transistors SSTa–SSTd connect a main source line MSL to sub-source lines SSLa or SSLb arranged for the corresponding row. Main source line MSL is connected to sub-source line SSLa and SSLb through diodes Da and Db, respectively.

For reading data, a voltage of about 5 V is applied to a selected word line, and a read voltage of about 1 V is applied to a selected bit line. Also, a voltage of 0 V is applied to main source line MSL. It is now assumed that data is to be read from memory cell MT arranged at the crossing between word line WLa and bit line BLa. In this case, source line select transistor SSTa is turned on in accordance with the signal voltage on word line WLa to electrically connect main source line MSL to sub-source line SSLa. The voltages on unselected word lines WLb–WLd are 0 V, and source line select transistors SSTb–SSTd keep the off state. Therefore, sub-source line SSLb is in an electrically floating state and current paths of the memory cells connected to corresponding word lines WLc and WLd are cut off.

A sense amplifier (not shown) determines whether a current flows through bit line BLa or not. Even if memory cell MT arranged at the crossing between word line WLb and bit line BLa is in the over-low Vth state, the leak current thereof is extremely small, and data can be accurately read from the selected memory cell. Thus, only an influence of the memory cell in the over-low Vth state of one bit at the maximum appears on the selected bit line in the data read operation so that the leak current can be sufficiently small, and data reading can be accurately performed. Even if threshold voltage Vth is negative and the leak current is large, a failure occurs only in one bit, and an error detection and correction circuit can correct such a failure.

Description will now be given on a programming operation for memory cell MT arranged corresponding to the crossing between word line WLa and bit line BLa. In the programming operation, the threshold voltage of memory cell MT is increased. In this case, a voltage of about 12 V is applied to word line WLa, a voltage of about 6 V is applied to bit line BLa, and a voltage of 0 V is applied to main source line MSL. Source line select transistor SSTa is turned on to transmit the ground voltage of 0 V to sub-source line SSLa. Thereby, hot electrons are generated in the selected memory cell MT as a result of avalanche breakdown caused by a high electric field near the drain, and these hot electrons are injected into the floating gate. Unselected bit lines BLb and BLc as well as unselected word lines WLb–WLd are held at the ground voltage level, and source line select transistors SSTb–SSTd are off.

For an erase mode, i.e., when threshold voltage Vth of memory cell MT is to be lowered, a voltage of 0 V is applied to word lines WLa–WLd, a voltage of about 12 V is applied to main source line MSL, and all bit lines BLa–BLc are set to an open state. The high voltage of 12 V on main source line MSL is transmitted to sub-source lines SSLa and SSLb through diodes Da and Db, respectively. Thereby, a high electric field is applied between the floating gate and the source in each memory cell MT, and electrons are moved from the floating gate to the source by a Fowler-Nordheim (FN) tunneling phenomenon. In the erase mode, all word lines WLa–WLd are held at the ground voltage level so that source line select transistors SSTa–SSTd maintain the off state. Therefore, diode elements Da and Db are required for applying a high voltage to the sources of memory cells MT.

In the flash memory, e.g., shown in FIG. 78, each sub-source line is commonly used only by the adjacent two word lines. In reading of data, therefore, each bit line is affected only by the leak current of the over-erased memory cell of one bit at the maximum, and erroneous reading of data due to the over-erased memory cell can be prevented. In the structure shown in FIG. 78, however, it is necessary to provide diodes D (Da and Db) for sub-source lines SSL (SSLa and SSLb), respectively. Accordingly, the pitch of the word lines depends on the size of diodes Da and Db, and therefore cannot be reduced so that high-density integration is difficult.

A structure in which the diodes are removed for reducing the word line pitch has been disclosed, e.g., in Japanese Patent Laying-Open No. 6-275083 (1994).

FIG. 79 schematically shows a structure of a memory array disclosed in the above reference. In FIG. 79, portions corresponding to those in FIG. 78 bear the same reference numerals, and will not be specifically described below. As shown in FIG. 79, sub-source line SSLa is connected to main source line MSL through source line select transistor SSTa and SSTb, and sub-source line SSLb is connected to main source line MSL through source line select transistors SSTc and SSTd.

In the data read operation of the arrangement shown in FIG. 79, voltages are applied in the same manner as in the memory shown in FIG. 78. However, in the programming mode requiring an increase of the threshold voltage, voltages are applied as indicated inside the parentheses. FIG. 79 shows voltages applied to word lines WLa and bit line BLa for writing data into the memory cell.

Thus, word line WLa is set to 12 V, and unselected word lines WLb–WLd are set to the ground voltage level of 0 V. Selected bit line BLa is set at a voltage of 0 V or 6 V depending on the write data, and unselected bit lines BLb and BLc are set to the open state. Main source line MSL is at a voltage of 6 V. In this state, therefore, a voltage of 6 V is transmitted onto sub-source line SSLa through source line select transistor SSTa. The voltage of 0 V or 6 V transmitted onto the selected bit line BLa is selected in accordance with "0" or "1" of write data. When the voltage on bit line BLa is set to 0 V, a channel current flows from sub-source line SSLa to bit line BLa through memory cell MT arranged corresponding to the crossing between bit line BLa and word line WLa. Thereby, a high electric field occurs in the impurity region (source region) connected to sub-source line SSLa, and channel hot electrons are produced as a result of avalanche breakdown caused by this high electric field so that electrons are injected into the floating gate.

When the voltage on bit line BLa is set to 6 V, the source and drain voltages of memory cell MT are equal to each other so that a channel current does not flow, and injection of electrons into the floating gate does not occur. In this state, therefore, the erased state is maintained. In the foregoing arrangement, however, word line WLa is at a high voltage of 12 V. Therefore, the memory cell transistors connected to bit lines BLb and BLc are turned on so that the voltage of 6 V is transmitted to bit lines BLb and BLc from sub-source line SSLa. Accordingly, a voltage of 6 V is transmitted to impurity regions (drain regions), which are connected to the bit lines, in the memory cells connected to unselected word lines WLb and WLd, and a stress called a "disturb stress" is applied. As a result of the bit line voltages of these unselected memory cells, a quantity of electric charges in the floating gates changes due to ejection of electrons caused by the Fowler-Nordheim tunneling current or due to injection of holes into the floating gates caused by interband tunneling currents, resulting in a problem that the threshold voltages change.

In this case, data may be simultaneously written into all the memory cells in one row. In the data write operation, however, a large current, such as hundreds of microamperes per cell flows at the time of injection of hot electrons produced by drain avalanche and at the time of injection of electrons into the floating gate from the channel region caused by channel hot electrons. Therefore, it is usually difficult to effect writing simultaneously on all the memory cells in one row.

In the erase mode, as shown in FIG. 80, all word lines WLa–WLd are set to the ground voltage level of 0 V. A voltage of about 10 V is applied to selected bit line BLa, and unselected bit lines BLb and BLc are set to the open state. In this state, all source line select transistors SSTa–SSTd are off, and sub-source lines SSLa and SSLb are set to the open state. In this state, a large voltage is applied between the floating gate and the drain in each memory cell MT connected to bit line BLa, and electrons are ejected from the floating gate by the Fowler-Nordheim current caused by the high electric field applied between the floating gate and the drain region. In this case, therefore, data in all memory cells MT connected to bit line BLa is erased. According to the structure in which one word line is selected and writing is performed simultaneously for multiple bits, data of the cell to be held is also erased so that it is impossible to employ this scheme of performing the erasing on a row at a time.

In the structure shown in FIGS. 79 and 80, the source and drain regions have their functions merely inverted from those of the conventional flash memory in programming and erase operations. Even in this structure, the drain disturb stress is applied not only to the memory cells in the same column as that of the selected memory cell but also to the memory cells in the unselected columns during writing, and therefore data cannot be held stably.

The foregoing problem of over-erasing occurs as over-programming in a DINOR type flash memory shown in FIG. 81.

FIG. 81 schematically shows a structure of a main portion of a conventional DINOR type flash memory. FIG. 81 representatively shows two sub-bit lines SBLa and SBLb connected to one main bit line MBL. A plurality of sub-bit lines SBL in the column direction are also connected to main bit line MBL. Memory cells MT are arranged corresponding to crossings between sub-bit lines SBLa and SBLb and word lines WLa and WLb. Each memory cell MT is formed of a floating gate field effect transistor. Sub-bit lines SBLa and SBLb are connected to main bit line MBL through sector select gates SGa and SGb, respectively. Sector select gates SGa and SGb are turned on in response to activation of sector select signals φSA and φSB.

In this DINOR type flash memory, memory cells MT are not connected to main bit line MBL, but are connected only to sub-bit lines SBLa and SBLb. Therefore, a load capacitance of the bit line is small during data reading, and data can be read fast.

In the programming operation, a voltage of about −8 V is applied to a selected word line, a voltage of about 6 V is applied to a selected sub-bit line, and the ground voltage of 0 V is applied to unselected word lines. The unselected sub-bit lines are held in the floating state. In this state, a voltage of 0 V or 6 V depending on the write data is applied to the selected sub-bit line. In the memory cells connected to the sub-bit line at the voltage of 6 V, electrons are ejected from the floating gates through Fowler-Nordheim tunneling current so that the threshold voltages thereof lower.

In the erase mode, a voltage of about 10 V is applied to the selected word line, and a voltage of about −8 V is applied to the back gates of the memory cells MT and sub-source line SSL. Electrons are injected into the floating gate through the Fowler-Nordheim tunneling current flowing from the whole surface of the channel in each selected memory cell transistor, and threshold voltage Vth of the memory cell is increased.

In this DINOR type flash memory, the memory cells connected to a sub-bit line are smaller in number than those in the NOR type flash memory, but a large number of memory cells are coupled to each sub-bit line so that data cannot be read out accurately due to a leak current if an over-programmed memory cell is present.

SUMMARY OF THE INVENTION

An object of the invention is to provide a nonvolatile semiconductor memory device allowing accurate data reading without increasing an array area as well as a method of manufacturing the same.

Another object of the invention is to provide a nonvolatile semiconductor memory device allowing stable and accurate reading of data even when a memory cell has a low threshold voltage as well as a method of manufacturing the same.

According to a first aspect of the invention, a nonvolatile semiconductor memory device includes a plurality of memory cells arranged in rows and columns and each formed of a floating gate transistor; a plurality of word lines arranged corresponding to the rows respectively and each connected to control electrode nodes of the memory cells in the corresponding row; a plurality of bit lines arranged corresponding to the columns respectively and each connected to first conduction nodes of the memory cells in the corresponding column; a plurality of select transistors arranged in the respective rows and being responsive to signal voltages on the word lines of the corresponding rows to be selectively turned on to transmit a reference voltage to second conduction nodes of the memory cells in the corresponding rows, and a circuit for setting voltages on the word line and the bit line connected to a selected memory cell such that hot electrons in a channel region between the first and second conduction nodes of the selected memory cell are injected into the floating gate of the selected memory cell in an operation mode for injecting electrons into the floating gate of the memory cell, and that a Fowler-Nordheim tunneling current flows between the floating gate and the channel region of the selected memory cell in an operation mode for ejecting electrons from the floating gate.

According to a second aspect of the invention a nonvolatile semiconductor memory device includes: a plurality of memory cells arranged in rows and columns and each formed of a floating gate transistor; a plurality of word lines arranged corresponding to the respective rows and each connected to control electrode nodes of the memory cells in the corresponding row; a plurality of bit lines arranged corresponding to the columns respectively and each connected to first conduction nodes of the memory cells in the corresponding column; a plurality of select transistors arranged in the respective rows and being responsive to signal voltages on the word lines of the corresponding rows to be selectively turned on to transmit a reference voltage to second conduction nodes of the memory cells in the corresponding rows; and a circuit for setting voltages on the word line and the bit line connected to a selected memory cell such that a Fowler-Nordheim tunneling current flows between the channel region formed between the first and second conduction nodes of the selected memory cell and the corresponding floating gate of the selected memory cell in an operation mode for injecting electrons into the floating gate of the memory cell, and that a Fowler-Nordheim tunneling current flows between the floating gate and the first conduction node in an operation mode for ejecting electrons from the floating gate.

The invention also provides a method of manufacturing a nonvolatile semiconductor memory device including a plurality of nonvolatile memory cells arranged in rows and columns, and each formed of a floating gate field effect transistor having a control electrode; a plurality of word lines arranged corresponding to the respective row, and each connected to the memory cells in the corresponding row; and a plurality of source line select transistors arranged in the respective rows and being responsive to voltages on the word lines of the corresponding rows to be turned on to transmit a reference voltage to the memory cells in the corresponding rows. The memory cell includes an insulating film arranged between the control gate and the floating gate, and having a low etching rate with respect to a first etchant.

A first manufacturing method according to the invention includes a first step of removing the insulating film by effecting wet etching with the first etchant on a boundary region between a region for forming the source line select transistor and a region for forming the memory cell; the second step of forming the word lines after the first step; and the third step of removing the insulating film, after the second step, by effecting etching on a region including the region etched in the first step with a mask covering a region for forming the source line select transistors.

According to a third aspect, the invention provides a method of manufacturing a nonvolatile semiconductor memory device including a plurality of nonvolatile memory cells arranged in rows and columns and each formed of a floating gate field effect transistor; a plurality of word lines arranged corresponding to the respective rows and each connected to the memory cells in the corresponding row; a plurality of select transistors arranged corresponding to the respective rows and each being responsive to a signal voltage on the word line in the corresponding row to be turned on to transmit a reference voltage; and a plurality of reference voltage transmission lines arranged corresponding to the respective word lines, and each transmitting the reference voltage received from the corresponding source line select transistor to the memory cells connected to the corresponding word line. Each of the memory cells includes a first conduction node, and a second conduction node connected to the corresponding reference voltage transmission line. The manufacturing method includes a first step of forming the second conduction node and the reference voltage transmission line by implanting dopant of a first conductivity type into a region for forming the second conduction node with a mask covering the first conduction nodes of the memory cells adjacent in the column direction; and a second step of forming an isolating region after the first step by selectively implanting dopant of a second conductivity type into a region for forming the second conductive node and thereby balancing the first dopant.

According to a fourth aspect, the invention provides a method of manufacturing a nonvolatile semiconductor memory device including a plurality of nonvolatile memory cells arranged in rows and columns and each formed of a floating gate field effect transistor; a plurality of word lines arranged corresponding to the respective rows and each connected to the memory cells in the corresponding row; a plurality of source line select transistors arranged corresponding to the respective rows and each being responsive to a signal voltage on the word line in the corresponding row to be turned on to transmit a reference voltage; and a plurality of reference voltage transmission lines arranged corresponding to the respective word lines and each transmitting the reference voltage received from the corresponding source line select transistor to the memory cells connected to the corresponding word line. Each of the memory cells includes a first conduction node and a second conduction node connected to the corresponding reference voltage transmission line.

The method of manufacturing the nonvolatile semiconductor memory device of the fourth aspect includes the step of forming impurity regions for forming a second conduction node of the memory cell and the reference voltage transmission line by selectively performing ion implantation at a high concentration for forming the second conduction node with a mask covering an isolating region between the second conduction nodes of the memory cells adjacent to each other in the column direction.

According to a fifth aspect, the invention provides a method of manufacturing a nonvolatile semiconductor memory device including a plurality of nonvolatile memory cells arranged in rows and columns and each formed of a floating gate field effect transistor; a plurality of word lines arranged corresponding to the respective rows and each connected to the memory cells in the corresponding row; a plurality of source line select transistors arranged corresponding to the respective rows and each being responsive to a signal voltage on the word line in the corresponding row to be turned on to transmit a reference voltage; and a plurality of reference voltage transmission lines arranged corresponding to the respective word lines and each transmitting the reference voltage received from the corresponding source line select transistor to the memory cells connected to the corresponding word line. Each of the memory cells includes a first conduction node and a second conduction node connected to the corresponding reference voltage transmission line.

The method of manufacturing the nonvolatile semiconductor memory device of the fifth aspect includes a step of forming an isolating and insulating film over node formation regions of the memory cells adjacent to each other in the column direction and a region between the second conduction node formation regions, and effecting a patterning in a predetermined form to expose the second conduction node formation regions; and forming the second conduction nodes and a region for forming the reference voltage transmission line connected to the second conduction node by performing ion implantation using the isolating and insulating film as a mask. The isolating and insulating film is a thermal oxide film.

In a method of manufacturing a nonvolatile semiconductor memory device according to a sixth aspect of the invention, the step of selectively forming the thermal oxide film in the fifth aspect includes the steps of forming a first thermal oxide film at entire surfaces of the second conduction node regions of the memory cells adjacent to each other in the column direction and the regions between the second conduction node regions; and exposing the second conduction node formation regions and the reference voltage transmission line formation region by etching and removing the first thermal oxide film except the second conduction node regions and the reference voltage transmission line isolating region.

In an operation mode for ejecting electrons from the floating gate, the electrons are ejected by a Fowler-Nordheim current between the floating gate and the channel region of the selected memory cell. When injecting the electrons into the floating gate, hot electrons in the channel region between the first and second conduction nodes are injected into the floating gate. A high voltage is not applied to an unselected bit line, and it is possible to prevent unnecessary application of a drain disturb stress of the memory cells on the unselected bit line.

The injection of electrons into the floating gate is performed by the Fowler-Nordheim current between the channel region and the floating gate, and the Fowler-Nordheim tunneling current flows between the floating gate and the second conduction node when electrons are to be ejected from the floating gate. An unnecessary high voltage is not applied to the memory cell through an unselected bit line so that the drain disturb stress can be reduced, and data can be held stably.

The reference voltage transmission line merely transmits the reference voltage through the source line select transistor, and it is not necessary to provide an element such as a diode for applying a high voltage. Therefore, an area occupied by the array can be reduced, and a word line pitch can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 is a table showing a relationship between the threshold voltage of the memory cells in one row and the threshold voltage of the corresponding source line select transistor in the nonvolatile semiconductor memory device shown in FIG. 12;

FIG. 19 schematically shows a structure of a main portion of the source line voltage setting circuit shown in FIG. 16;

FIG. 20 shows a structure of a modification of the embodiment 3 of the invention;

DESCRIPTION OF THE PREFERRED EMBODIMENTS

[Embodiment 1]

Figure 1:
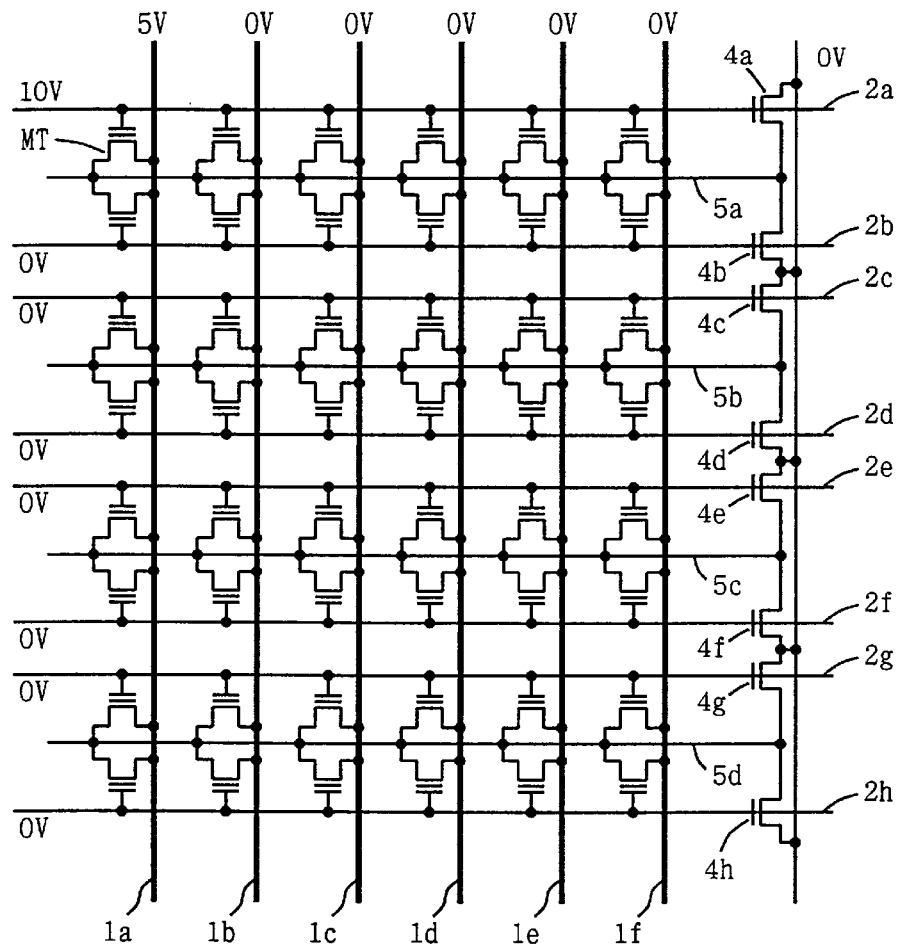
FIG. 1 shows a structure of an array of a nonvolatile semiconductor memory device according to an embodiment 1 of the invention.

FIG. 1 schematically shows a structure of an array of a nonvolatile semiconductor memory device according to an embodiment 1 of the invention. In FIG. 1, memory cells MT each formed of an N-channel floating gate field effect transistor are arranged in rows and columns. FIG. 1 shows memory cells MT arranged in eight rows and six columns. The same structure as that shown in FIG. 1 is repetitively arranged in the row and column directions.

Bit lines 1a–1f are arranged corresponding to the respective columns of the memory cells. Each of bit lines 1a–1f is connected to drain nodes (first conduction nodes) of memory cells in the corresponding column. Word lines 2a–2h are arranged corresponding to the respective rows of memory cells MT. Each of word line 2a–2h is connected to control electrodes of memory cells MT in the corresponding row.

Each of sub-source lines 5a–5d reference voltage transmission lines is arranged commonly for two word lines adjacent to each other in the column direction. Each of these sub-source lines 5a–5d is connected to second conduction nodes (sources) of the memory cells in the corresponding rows. Sub-source line 5a is arranged commonly to word lines 2a and 2b, and sub-source line 5b is arranged commonly to word lines 2c and 2d. Sub-source line 5c is arranged commonly to word lines 2e and 2f, and sub-source line 5d is arranged commonly to word lines 2g and 2h.

In the rows of memory cells MT, there are arranged source line select transistors 4a–4h which are turned on in response to signal voltages on word lines 2a–2h in the corresponding rows for connecting main source line 3 to corresponding sub-source lines 5a–5d. Regardless of an operation mode, a ground voltage (0 V) is normally transmitted to main source line 3. Then, description will be given on programming, erase and read operations of the nonvolatile semiconductor memory device shown in FIG. 1.

(i) Program Mode

The nonvolatile semiconductor memory device shown in FIG. 1 includes bit lines 1a–1f connected to drains of memory cells MT, and is a NOR type flash memory. In the programming mode of this structure, a threshold voltage Vth of memory cell MT is increased, and electrons are injected into the floating gate of memory cell MT. It is now assumed that programming is to be effected on memory cell MT arranged corresponding to the crossing between bit line 1a and word line 2a. In this case, as shown in FIG. 1, a voltage, e.g., of 10 V is applied to selected word line 2a, and a voltage of 5 V is applied to selected bit line 1a. Unselected word lines 2b–2h and unselected bit lines 1b–1f are held at the ground voltage level. In this state, source line select transistor 4a connected to word line 2a is turned on to transmit the ground voltage (0 V) on main source line 3 onto corresponding sub-source line 5a.

Figure 2A:
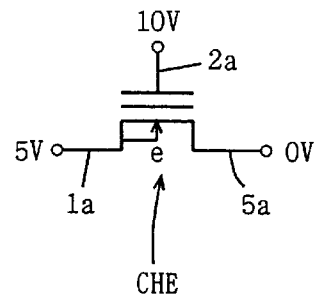
FIGS. 2A to 2C show a manner of applying voltages in a programming operation of the nonvolatile semiconductor memory device shown in FIG. 1.
Figure 2B:
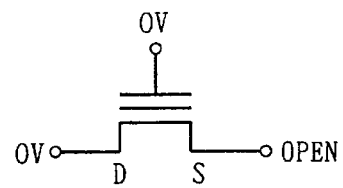

In this state, as shown in FIG. 2A, a channel is formed in the selected memory cell to flow a channel current, electrons are accelerated to produce hot electrons, and these hot electrons are injected into the floating gate. Thus, the operation of programming data into the selected memory cell is performed with channel hot electrons (CHE). In the unselected memory cell, as shown in FIG. 2B, the corresponding source line select transistor is off, and the sub-source line is open so that a channel current does not flow. Also, the drain high electric field is not produced because the drain node is at a voltage of 0 V. Therefore, electrons are not injected into the floating gate in the unselected memory cell.

Figure 2C:
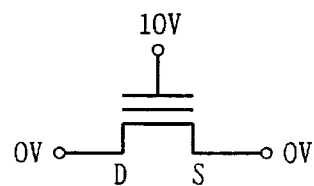
Figure 80:
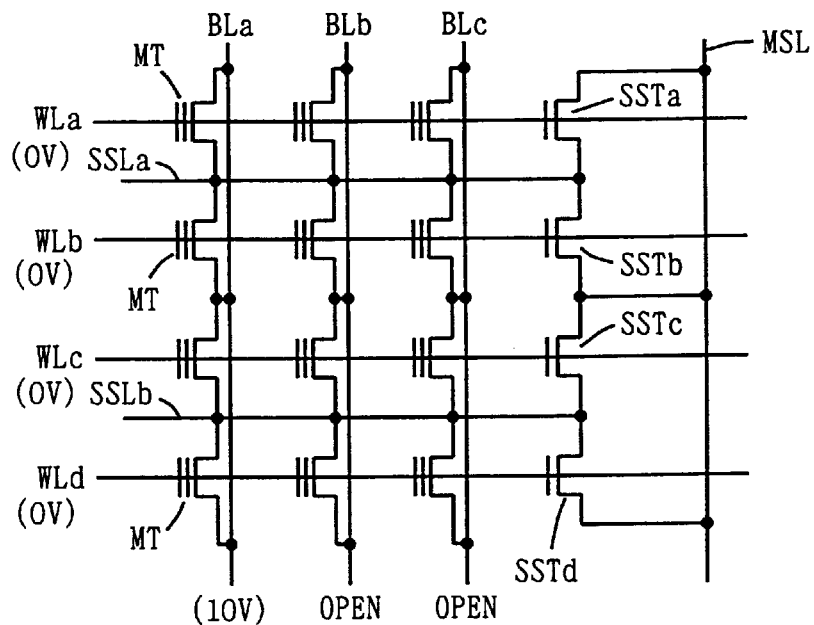
FIG. 80 shows a manner of applying voltages for a programming operation of the nonvolatile semiconductor memory device shown in FIG. 79.
Figure 81:
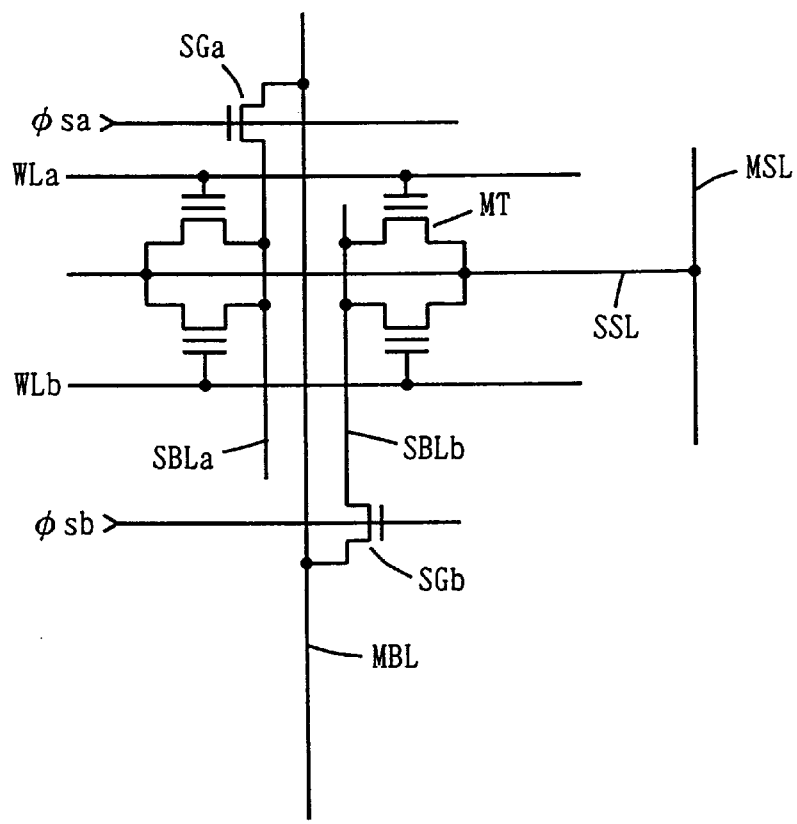
FIG. 81 schematically shows a structure of a conventional nonvolatile semiconductor memory device.

In each unselected memory cell connected to selected word line 2a, as shown in FIG. 2C, the source and drain are at the ground voltage (0 V), and the high voltage of 10 V is applied only to the control electrode node so that the channel current does not flow, and electrons are not injected into the floating gate. In each memory cell connected to the unselected bit line, the bit line is held at the voltage level of 0 V regardless of whether the corresponding word line is at a voltage of 10 V or 0 V. Therefore, a drain disturb stress is applied only to the memory cell connected to selected bit line 1a. Compared with the nonvolatile semiconductor memory device of the structure shown in FIG. 80, it is possible to reduce the number of times of application of the drain disturb stress, and the drain disturb stress can be significantly reduced.

(ii) Erase Mode

Figure 3A:
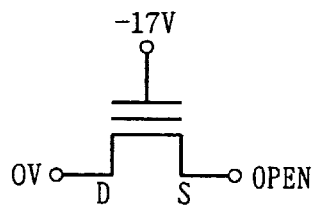
FIGS. 3A to 3E show a manner of applying voltages in an erase operation of the nonvolatile semiconductor memory device shown in FIG. 1.
Figure 3B:
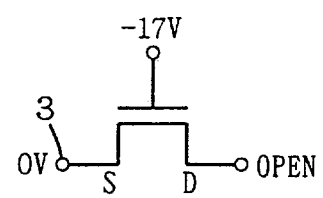
Figure 3C:
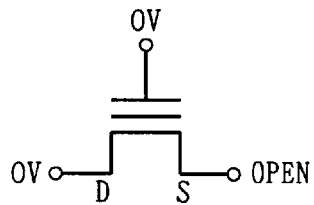
Figure 3D:
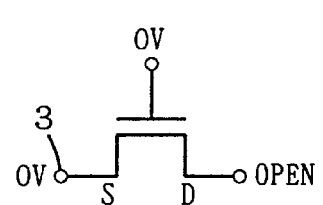
Figure 3E:
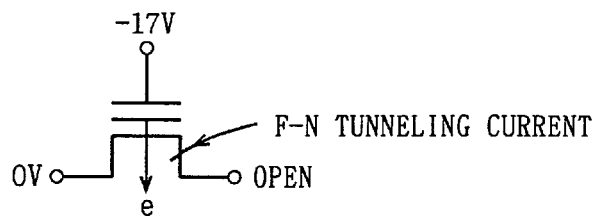

FIGS. 3A–3E show a manner of voltage application in the erase mode. In this erase mode, electrons are ejected from the floating gate of a selected memory cell. In the selected memory cell, as shown in FIG. 3A, the control electrode node is set to a negative voltage level of −17 V, and the corresponding bit line is set to 0 V. The unselected word lines are supplied with the ground voltage (0 V), and the unselected bit lines are also supplied with the voltage of 0 V. In this state, it is now assumed that memory cell MT arranged corresponding to the crossing between bit line 1a and word line 2a shown in FIG. 1 is selected for erasing. In this case, as shown in FIG. 3B, the corresponding source line select transistor received on its gate a voltage of −17 V lower than the voltage (0 V) on main source line 3, and maintains the off state. Sub-source line 5a is rendered open. Each of the memory cells connected to the remaining unselected word lines enters the state shown in FIG. 3C, in which its control electrode node receives a voltage of 0 V, and a voltage of 0 V is transmitted to the bit line. The source line select transistor corresponding to the unselected word line is off as shown in FIG. 3D, and the corresponding sub-source line maintains the open state. In this state, a large electric field is applied between the floating gate and the channel region on the surface of the substrate, and a Fowler-Nordheim tunneling current flows between the whole surface of the channel region and the floating gate as shown in FIG. 3E so that electrons accumulated in this floating gate are ejected into the substrate region. In the other unselected memory cells, the control electrode nodes receive 0 V, and electrons are not ejected. Therefore, erasing is effected on all the memory cells connected to the selected word line at a time. This is because all the bit lines are at the voltage level of 0 V, the control electrodes of the memory cells in the selected one row are supplied with the negative voltage level of −17 V, and the corresponding sub-source line is open.

(iii) Data Read Mode

Figure 4A:
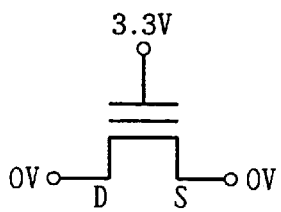
FIGS. 4A to 4D show a manner of applying voltages in a data read operation of the nonvolatile semiconductor memory device shown in FIG. 1.
Figure 4B:
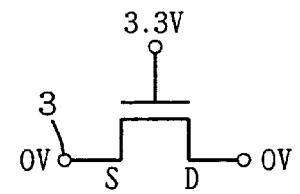

FIGS. 4A–4D show voltages applied to the memory cells during data reading. As shown in FIG. 4A, a voltage of 3.3 V is applied onto the word line connected to the selected memory cell, and a voltage of 1 V is applied onto the bit line connected to the selected memory cell. In the selected memory cell, the impurity region (conduction node) connected to the bit line serves as the drain node, and the conduction node connected to the sub-source line serves as the source. Therefore, the selected memory cell shown in FIG. 4A is turned on and off depending on its threshold voltage. The voltage of 3.3 V on the selected word line is the voltage level between threshold voltage Vth in the programmed state and threshold voltage Vth in the erased state. The selected source line select transistor receives the voltage of 3.3 V on the selected word line to turn on for transmitting the voltage on main source line 3 onto the corresponding sub-source line (see FIG. 4B).

Figure 4C:
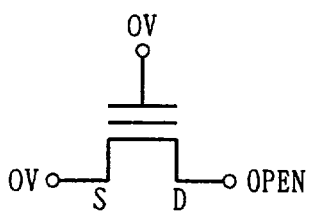
Figure 4D:
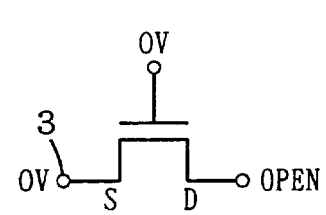

In the unselected memory cell, as shown in FIG. 4C, both the voltages on the word line and bit line are 0 V. Also, the corresponding source line select transistor receives the word line voltage of 0 V on its gate and is off as shown in FIG. 4D. Accordingly, the sub-source line for the unselected cell is open, and the current path for the unselected cell is cut off. This sub-source line portion is merely charged and discharged.

In the operation of determining whether the selected cell causes a current flow through the bit line or not, therefore only the memory cells connected to the same sub-source line as that this of selected memory cell likewise cause the flow of leak currents to the bit lines and therefore the memory cell of one bit at the most causes the leak current flow to the bit line in each column so that the leak current can be significantly reduced. Accordingly, even if the unselected memory cell, which is arranged in the same column as the selected column and uses the same sub-source line, is in the over-erased state and causes the leak current flow, the leak current of the one memory cell is small and is substantially ignorable. Accordingly, the memory cell data can be accurately and stably read out.

By employing the structure wherein the source line select transistor is provided for each word line for transmitting a voltage of 0 V on the main source line to the corresponding sub-source line when the corresponding word line is selected, a high voltage of 5 V for programming is merely applied to the drains of memory cells in the same column even in the programming mode. Even if the memory cells connected to the remaining unselected bit lines are turned on in accordance with the voltage of 10 V on the selected word line, the voltage on each unselected bit line is equal to 0 V on the sub-source line. Therefore, it is possible to prevent the unselected bit lines from attaining the high voltage level, and the drain disturb stress can be significantly reduced. Accordingly, the write operation can be performed stably without destructing data.

In the read mode, only the leak current of the memory cell of one bit at the maximum in the selected column affects the current of the selected memory cell, and data can be read accurately even if this unselected memory cell of one bit is in the over-low Vth state (over-erased state).

Figure 5:
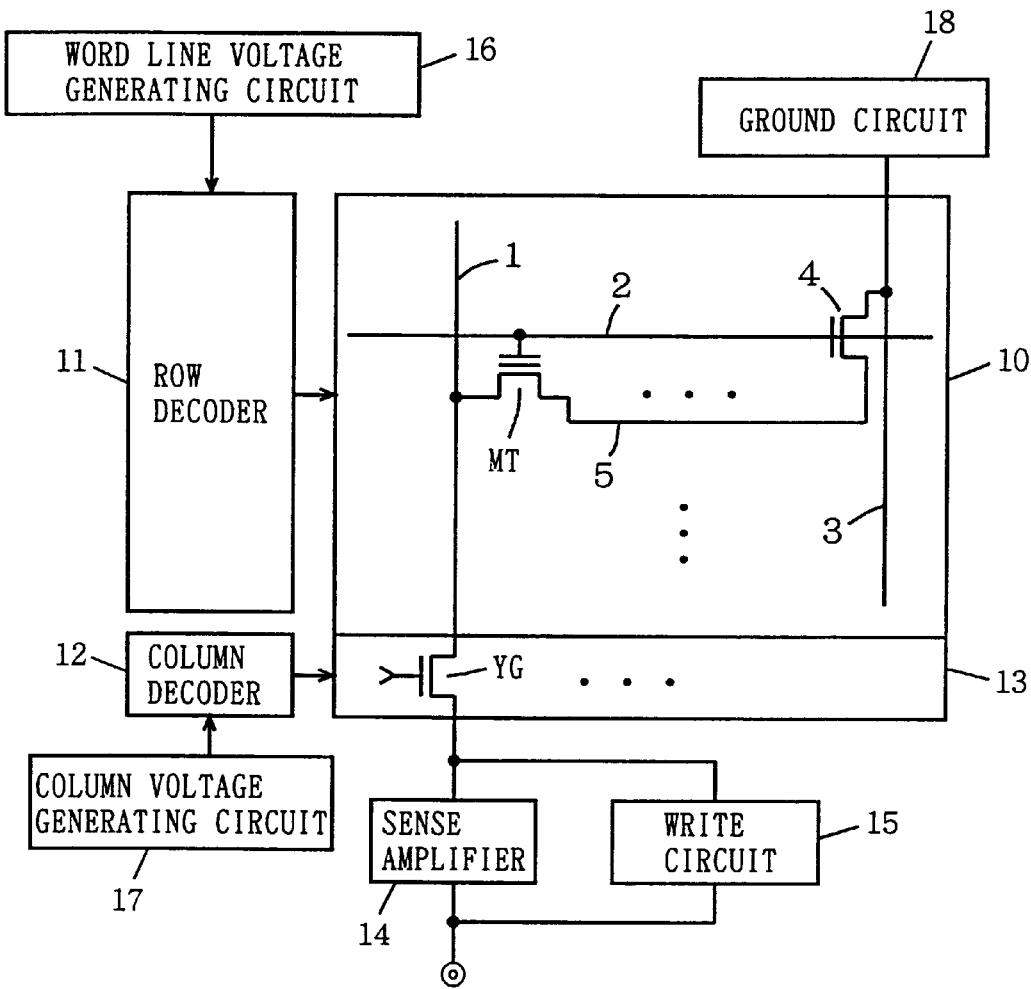
FIG. 5 schematically shows a whole structure of the nonvolatile semiconductor memory device according to the embodiment 1 of the invention.

FIG. 5 schematically shows a whole structure of the nonvolatile semiconductor memory device according to the embodiment 1 of the invention. In FIG. 5, the nonvolatile semiconductor memory device includes a memory cell array 10 including memory cells MT arranged in rows and columns. FIG. 5 representatively shows one word line 2, one bit line 1 and corresponding sub-source line 5 in memory cell array 10 as well as source line select transistor 4 coupled to word line 2 and main source line 3 transmitting the ground voltage as the reference voltage.

This nonvolatile semiconductor memory device further includes a row decoder 11 for decoding an address signal (not shown) and driving the word line, arranged corresponding to the addressed row in memory cell array 10 to the selected state, a column decoder 12 for decoding the address signal (not shown) to generate a column select signal for selecting the addressed column in memory cell array 10 and a column select circuit 13 for selecting the addressed column in memory cell array 10 in accordance with the column select signal from column decoder 12. In column select circuit 13, FIG. 5 representatively shows a column select gate YG connected to bit line 1.

This nonvolatile semiconductor memory device further includes a sense amplifier 14 for determining, in the data read operation, whether a current flows through the bit line selected by column select circuit 13 or not, to effect the data reading, a write circuit 15 for producing a voltage of 0 V or 5 V corresponding to the write data in the data write operation, a word line voltage generating circuit 16 for generating a voltage depending on the operation mode to row decoder 11, a column voltage generating circuit 17 for generating a voltage determining the voltage level of the column select signal in accordance with the operation mode to column decoder 12, and a ground circuit 18 for transmitting the ground voltage to main source line 3. Word line voltage generating circuit 16 generates a high voltage Vp, e.g., of about 10 V in the programming mode, generates a negative voltage Vn, e.g., of, about −17 V in the erase mode, and generates a voltage Vcc of, e.g., 3.3 V in the read mode. These voltages Vp, Vn and Vcc are applied to row decoder 11. Column voltage generating circuit 17 generates a voltage higher than the voltage of write data to column decoder 12 in the programming mode. In the erase and read modes, bit line BL in memory cell array 10 is set to the voltage level of the ground voltage or the read voltage of 1 V. Therefore, the output voltage of column decoder 12 is set to the voltage Vcc level. In the programming mode, column decoder 12 produces the column select signal at a boosted voltage level. The purpose of this is to prevent the threshold voltage loss by column select gate YG included in column select circuit 13. The ground circuit 18 normally supplies the ground voltage to main source line 3.

Word line voltage generating circuit 16 and column voltage generating circuit 17 generate the voltages depending on the operation mode, whereby the voltage required for programming or erasing is transmitted to the selected memory cell.

Figure 6:
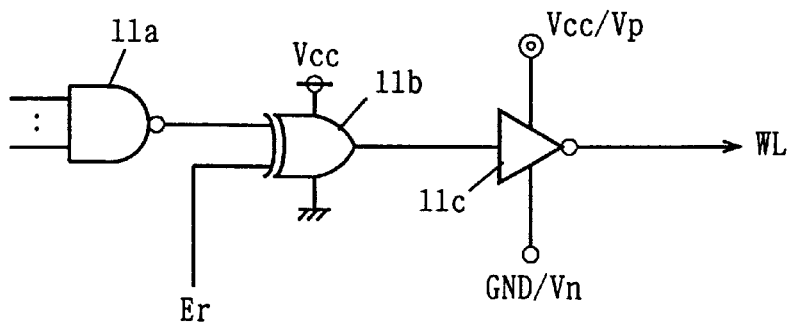
FIG. 6 shows an example of a structure of a row decoder shown in FIG. 5.

FIG. 6 shows a structure of a portion corresponding to one word line in row decoder 11 shown in FIG. 5. Row decoder 11 includes an NAND circuit 11a decoding an address signal (not shown), an EXOR circuit 11b receiving the output signal of NAND circuit 11a and an erase mode instructing signal Er, and an inverter circuit 11c receiving the output signal of EXOR circuit 11b and having a level converting function. EXOR circuit 11b operates using power supply voltage Vcc and ground voltage GND as the operation power supply voltages. Inverter circuit 11c receives power supply voltage Vcc or high voltage Vp on its one power supply node, and also receives ground voltage GND and negative voltage Vn on the other power supply node. The inverter circuit 11c has the level converting function, and converts the voltage level of the output signal of EXOR circuit 11b in accordance with the operation mode.

When erase mode instructing signal Er is inactive at L-level and EXOR circuit 11b operates as a buffer, and the decode signal from NAND circuit 11a is transmitted to inverter circuit 11c. The output signal of NAND circuit 11a is at L-level in the selected state, and voltage Vcc or Vo is transmitted to selected word line WL in the programming and read modes. In the erase mode, erase mode instructing signal Er is at H-level, and EXOR circuit 11b operates as an inverter so that inverter circuit 11c transmits negative voltage Vn onto selected word line WL. In this manner, the voltages depending on the operation modes are transmitted onto the selected word line.

According to the embodiment 1 of the invention, as described above, the NOR type flash memory includes the source line select transistors in the respective rows for selectively connecting the main source line to the sub-source lines, respectively, and channel hot electrons (CHE) are used for injecting electrons into the floating gate in the programming operation. Also, a Fowler-Nordheim tunneling current is used for ejecting electrons from the floating gate through the entire surface of the channel region. Therefore, a high voltage is not applied to the memory cells connected to an unselected bit line, and the drain disturb stress can be significantly reduced. Further, the voltage level on the main source line is normally constant, and the structure of the source line voltage generating portion can be simplified.

In the normal data read operation, the leak current of only the memory cell of one bit at the maximum in each column affects the data of the selected memory cell, and the leak current value thereof is small. Accordingly, the data can be read out accurately.

The description has been given on the NOR type flash memory. However, other structures can also achieve similar effects provided that channel hot electrons (CHE) are used for programming, and a Fowler-Nordheim current through the entire surface of the channel is used for the erase operation.

In the erase mode, the selected word line may be set to the ground voltage (0 V) and the selected bit line may be set to 8 V so that the erasing can be performed by the Fowler-Nordheim tunneling current using the drain of the memory cell transistor. In this case, if the voltage on the selected word line is at the level of the ground voltage (0 V), the corresponding source line select transistor is off, and the sub-source line is open. In this case, selected word line WL may be at a negative voltage, so that the level of the voltage applied to the selected bit line can be reduced. If the selected word line is set to the ground voltage level, entire chip erasing is performed (because all the bit lines are set to about 8 V). This is for the purpose of preventing such a situation that a high voltage is unnecessarily applied to the memory cells connected to an unselected bit line, and the drain disturb stress is increased. For effecting collective erasing on a portion smaller than the entire chip at a time, it is necessary to provide transistors dividing the bit lines, as is done in the DINOR type structure. The number of bits erased at a time depends on the number of divided bit lines.

[Second Embodiment 2]

Figure 7:
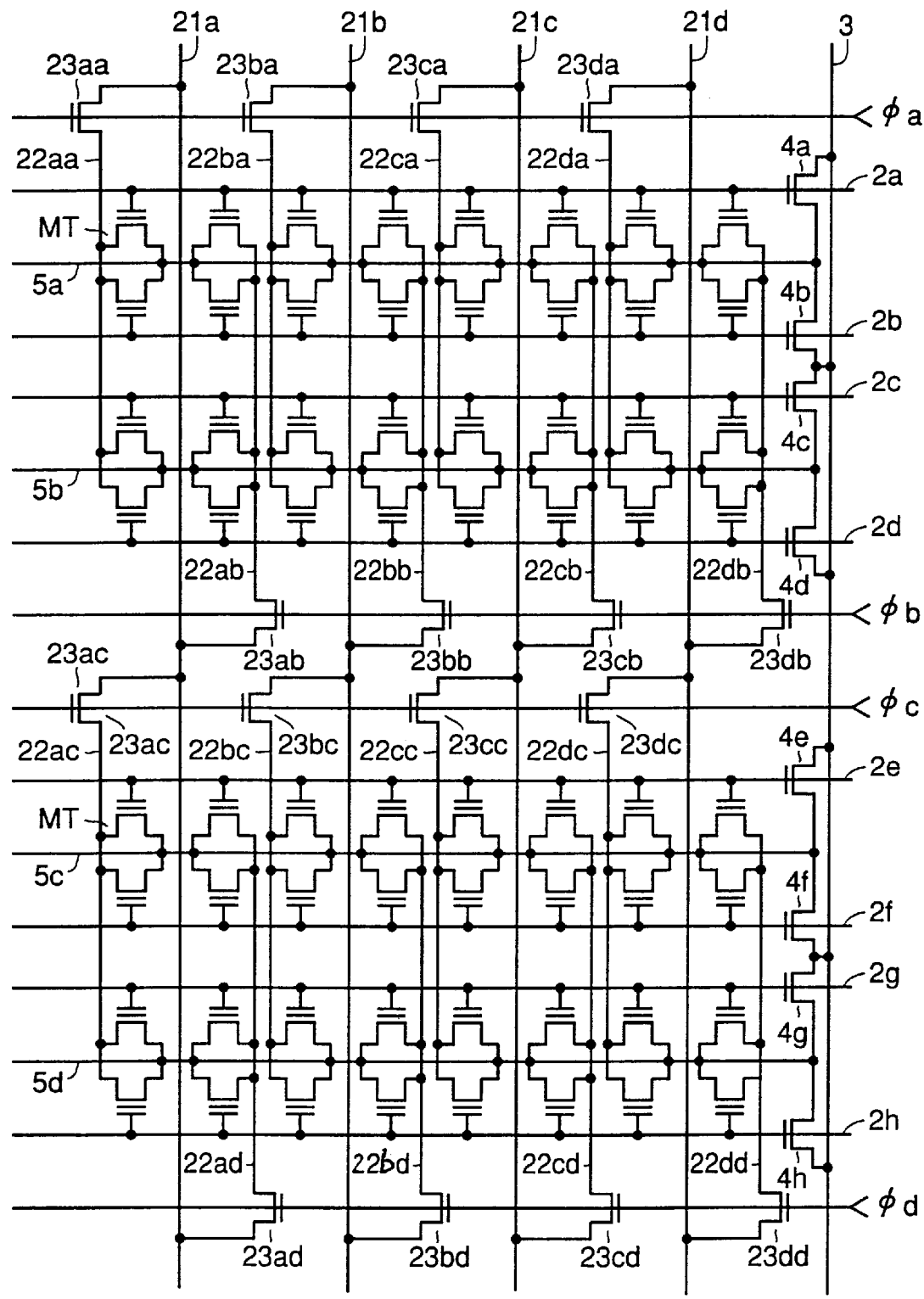
FIG. 7 shows a structure of an array of a nonvolatile semiconductor memory device according to an embodiment 2 of the invention.

FIG. 7 shows a structure of a main portion of a nonvolatile semiconductor memory device according to an embodiment 2 of the invention. FIG. 7 shows a structure of a portion of an array including memory cells MT arranged in eight rows and eight columns. In the structure shown in FIG. 7, bit lines are divided into main bit lines 21 arranged corresponding to the memory cell columns and sub-bit lines 22 connected to memory cells MT. FIG. 7 shows main bit lines 21a, 21b, 21c and 21d each provided for the memory cells arranged in two columns. Sub-bit lines 22aa–22ad are provided for main bit line 21a, and sub-bit lines 22ba–22bd are provided for main bit line 21b. Sub-bit lines 22ca–22cd are provided for main bit line 21c, and sub-bit lines 22da–22dd are provided for main bit line 21d. Sub-bit lines 22aa–22ad are connected to main bit line 21a through section select transistors 23aa–23ad which are turned on in response to section select signals φa–φd, respectively. Sub-bit lines 22ba–22bd are connected to main bit line 21b through section select transistors 23ba–23bd which are turned on in response to section select signals φa–φd, respectively. Sub-bit lines 22ca–22cd are connected to main bit line 21c through section select transistors 23ca–23cd which are turned on in response to section select signals φa–φd, respectively. Sub-bit lines 22da–22dd are connected to main bit line 21d through section select transistors 23da–23dd which are turned on in response to section select signals φa–φd, respectively.

In FIG. 7, each main bit line is provided for the memory cells in two columns, and the sub-bit lines are connected to the corresponding main bit line through section select transistors 23 (23aa–23dd), respectively, so that the pitch of main bit lines is increased.

Word lines 2a–2h are arranged corresponding to the respective rows of memory cells MT, and sub-source lines 5a–5d are arranged corresponding to the respective pairs of the adjacent word lines. Source line select transistors 4a–4h are arranged for word lines 2a–2h, respectively. When turned on, source line select transistors 4a–4h connect main source line 3 to corresponding sub-source lines 5 (5a–5d).

The arrangement of memory cells shown in FIG. 7 is called a DINOR type arrangement. An operation will now be described below.

(i) Programming Mode

Figure 8A:
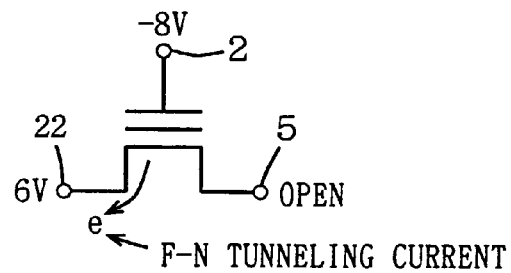
FIGS. 8A to 8D show a manner of applying voltages in a programming operation of the nonvolatile semiconductor memory device shown in FIG. 7.
Figure 8B:
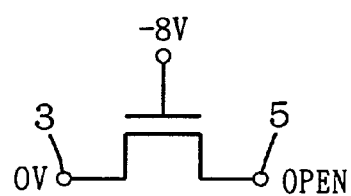

In the DINOR type flash memory, electrons are ejected from the floating gate and the threshold voltage Vth lowers in the programming mode. In this programming mode, as shown in FIG. 8A, a negative voltage of −8 V is applied to the word line connected to a selected memory cell, and a positive voltage of 6 V is applied to sub-bit line 22. The source line select transistor connected to the selected word line receives the negative voltage of −8 V on the selected word line to be turned off, as shown in FIG. 8B, so that the ground voltage on the main source line is not transmitted to corresponding sub-source line 5.

Figure 8C:
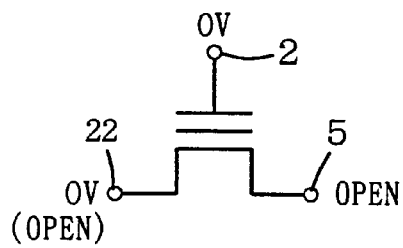
Figure 8D:
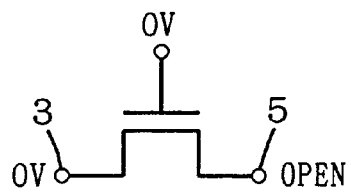

In a memory cell connected to the unselected word line, as shown in FIG. 8C, the ground voltage of 0 V is applied to its gate, and the sub-bit line receives 0 V or is set to the open state (the section select transistor is off). The source line select transistor connected to the unselected word line receives on its gate the voltage of 0 V from the unselected word line, and is turned off, as shown in FIG. 8D, so that corresponding sub-source line 5 is set in the open state.

In the voltage arrangement shown in FIG. 8A, the selected memory cell enters the following state. A large voltage is between the control node and the drain node, and a Fowler-Nordheim current (FN tunneling current) flows between the floating gate and the drain so that electrons e are ejected from the floating gate, and threshold voltage Vth of the selected memory cell lowers. In the unselected memory cell, such a current does not flow, and the state thereof does not change.

The unselected memory cell connected to the selected word line receives a negative voltage of −8 V on its control electrode node, and maintains the off state even in the over-low Vth state. The selected memory cell likewise receives a negative voltage on its control electrode node, and the drain-to-source region is kept non-conductive so that the voltage on corresponding sub-bit line 22 is not transmitted onto corresponding sub-source line 5. Therefore, a high voltage is never transmitted to the unselected bit line through the unselected memory cell connected to the selected word line. The drain disturb stress of the unselected memory cell is applied only to the memory cells connected to the same sub-bit line as that of this selected memory cell, and the drain disturb stress is not applied to the other unselected memory cells so that the drain stress of the memory cell during programming is significantly reduced.

(ii) Erase Mode

In erase mode of the DINOR type flash memory, electrons are injected into the floating gate to increase a threshold voltage Vth.

Figure 9A:
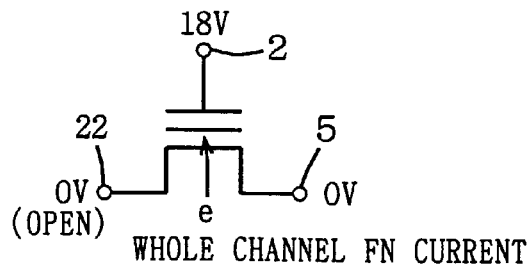
FIGS. 9A to 9D show a manner of applying voltages in an erase operation of the nonvolatile semiconductor memory device shown in FIG. 7.
Figure 9B:
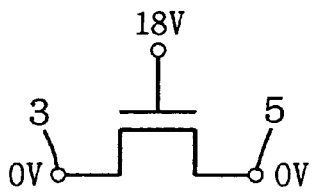

For the selected cell, a high voltage of 18 V is applied onto the selected word line as shown in FIG. 9A. In this state, as shown in FIG. 9B, the source line select transistor connected to the selected word line is turned on, and the ground voltage of 0 V on main source line 3 is transmitted onto corresponding sub-source line 5. The ground voltage is applied to the substrate region of the memory cell. The ground voltage of 0 V is also applied to the unselected word line. Therefore, as shown in FIGS. 9C and 9D, the memory cell connected to this unselected word line maintains the off state, and the source line select transistor connected to the unselected word line maintains the off state so that corresponding sub-source line 5 is open.

In the selected memory cell, as shown in FIG. 9A, a high voltage of 18 V applied to the control electrode node (word line 2) forms a channel at the whole surface of the channel region, and a Fowler-Nordheim current (whole channel surface FN tunneling current) flows between this channel and the floating gate so that electrons e are injected into the floating gate, and the threshold voltage Vth rises.

Figure 9C:
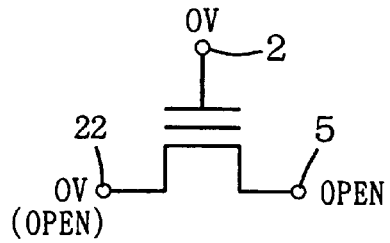
Figure 9D:
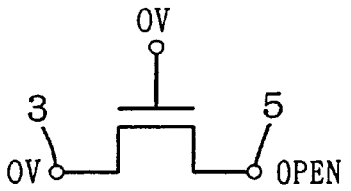

In FIGS. 9A and 9C, sub-bit line 22 may not receive the ground voltage of 0 V but may be open. In the selected memory cell, a high voltage on the selected word line forms a channel at the channel region, and it is not significant to hold sub-bit line 22 (drain node) at the ground voltage level or in the open state as described above.

In the erase mode, the unselected memory cell connected to the selected word line receives on its control electrode node a high voltage of 18 V, and is turned on. However, the corresponding sub-source line is at the level of the ground voltage of 0 V, and the high voltage is not transmitted to the corresponding unselected sub-bit line.

(iii) Read Mode

Figure 10A:
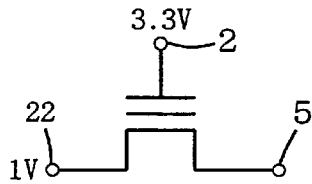
FIGS. 10A to 10D show a manner of applying voltages in a data read operation of the nonvolatile semiconductor memory device shown in FIG. 7.
Figure 10B:
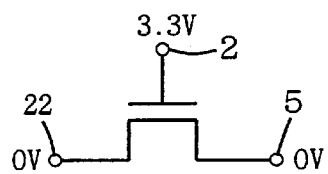

In the read mode, as shown in FIG. 10A, a voltage of about 3.3 V is applied onto the selected word line. In this state, main bit line 21 and sub-bit line 22 are connected together through the corresponding section select transistor, and a read voltage of about 1 V is transmitted to the selected sub-bit line. The source line select transistor connected to the selected word line receives on its gate a voltage of about 3.3 V as shown in FIG. 10B, and is turned on to transmit the voltage on main source line 22 onto corresponding sub-source line 5. In this state, a sense amplifier (not shown) determines whether a current flows through main bit line 21 and sub-bit line 22 or not, and reading of data is effected.

Figure 10C:
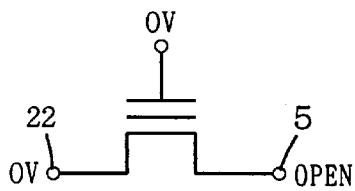
Figure 10D:
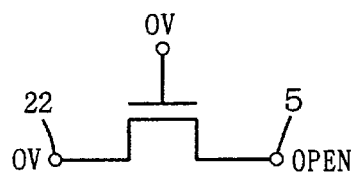

In the unselected memory cell, as shown in FIG. 10C, the unselected word line is at the ground voltage of 0 V, and unselected sub-bit line 22 (memory cell belonging to the selected section) is at 0 V. The source line select transistor connected to this unselected word line receives on its gate the ground voltage of 0 V as shown in FIG. 10D, and is off, and corresponding sub-source line 5 maintains the open state. Accordingly, a path flowing the leak current is not present for the unselected cell even if it is in the over-programmed state, and therefore reading of data from the memory cell can be performed accurately.

In the unselected section (the sub-bit line corresponding to the section select transistor in the off state), the main bit line and the sub-bit line are isolated from each other by the corresponding section select transistor, and each respective drain node is open.

In the structure of the DINOR type flash memory shown in FIG. 7, the source line select transistors are provided for the word lines, respectively, and the ground voltage is transmitted only to the sub-source line provided correspondingly to the selected word line. The FN tunneling current is used in the programming operation, and the whole channel surface FN tunneling current is utilized in the erase mode. Thereby, a high voltage is not applied to the sub-source line at any time, and it is possible to prevent increase in drain disturb stress applied to the unselected memory cell, which stress may be caused by application of the high voltage to the unselected memory cell, so that programming, erasing and reading of the memory cell data can be reliably performed.

This main source line 3 is held at the ground voltage level in any of the programming, erase and read modes, and it is not necessary to change the voltage level on the main source line. Accordingly, an area occupied by the voltage generating portion can be reduced.

Figure 11:
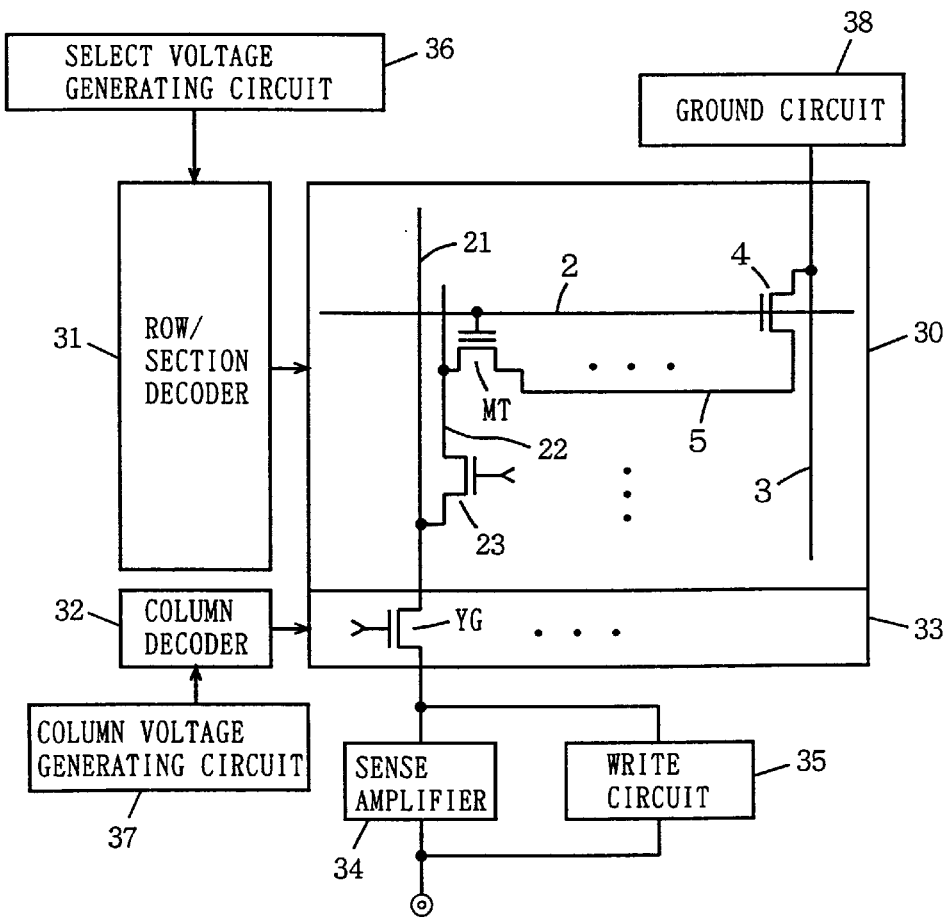
FIG. 11 schematically shows a whole structure of the nonvolatile semiconductor memory device shown in FIG. 7.

FIG. 11 schematically shows a whole structure of the non-volatile semiconductor memory device according to the embodiment 2 of the invention. In FIG. 11, the nonvolatile semiconductor memory device includes a memory cell array 30 which in turn includes a plurality of memory cells MT arranged in rows and columns. Memory cell array 30 is divided into a plurality of sections by selection select transistors 23. FIG. 11 representatively shows one word line 2, one sub-bit line 22, one main bit line 21 arranged corresponding to sub-bit line 22, source line select transistor 4 and main source line 3.

The nonvolatile semiconductor memory device further includes a row/section decoder 31 for decoding an address signal (not shown) to select a section and a row, a column decoder 32 for decoding an address signal (not shown) to generate a signal for selecting a column in memory cell array 30, a column select circuit 33 for selecting a column (main bit line) in memory cell array 30 in accordance with the column select signal from column decoder 32, a sense amplifier 34 for reading out data through determination on whether the current flows in the selected column in the data read operation, and a write circuit 35 for producing and transmitting to the selected column in the programming operation. Column select circuit 33 includes a column select gate YG which is turned on in response to the column select signal from column decoder 32. The main bit line arranged corresponding to the selected column is connected to sense amplifier 34 and write circuit 35 through column select gate YG.

This nonvolatile semiconductor memory device further includes a select voltage generating circuit 36 generating a voltage varying in level depending on the operation mode for application to row/section decoder 31, a column data generating circuit 37 for generating a voltage depending on the operation mode for application to column decoder 32, and a ground circuit 38 for transmitting the ground voltage to main source line 3.

In the programming operation, select voltage generating circuit 36 generates a negative voltage which is supplied to the row decoder included in row/section decoder 31, and also generates a high voltage which is applied to the section decoder included in row/section decoder 31. By applying the high voltage to the section decoder during programming, a voltage, e.g., of 6 V is applied onto the selected sub-bit line. In the erase mode, select voltage generating circuit 36 transmits a high voltage, e.g., of about 18 V to the row decoder included in row/section decoder 31. In the read mode, select voltage generating circuit 36 transmits a voltage at a normal power supply voltage level to row/section decoder 31.

In the programming mode, column voltage generating circuit 37 transmits a voltage higher than a voltage of 6 V which in turn corresponds to the write data. Thereby, the voltage, which is produced by write circuit 35 and corresponds to the write data, is transmitted to the memory cell through the selected main bit line and the selected sub-bit line. However, if a circuit for latching the write data is provided for each main bit line, it is not necessary to provide column voltage generating circuit 37. From write circuit 35, the voltage at the normal power supply voltage level or ground voltage level is transmitted to the main bit line, and is merely latched by the latch circuit. A high voltage for programming is produced in accordance with the latch data.

The high voltage generating circuit and negative voltage generating circuit included in select voltage generating circuit 36 are implemented by usual circuits using, e.g., charge pump circuits.

As can be seen from FIG. 11, main source line 3 is merely supplied with the ground voltage from ground circuit 38, and it is not necessary to change the voltage on main source line 3 dependently on the operation mode. Therefore, an area occupied by the portion generating the main source line voltage can be reduced.

The description has been given on the DINOR type flash memory. However, other structures can also achieve similar effects provided that the Fowler-Nordheim tunneling current between the floating gate and the drain region is used in the programming operation, and the whole channel surface Fowler-Nordheim tunneling current is used in the erase operation. Thus, similar effects can be achieved even in the normal NOR type flash memory by employing a similar manner of voltage application.

According to the embodiment 2 of the invention, as described above, the sub-source lines are provided corresponding to the sets of word lines, and are selectively connected to the main source line transmitting the ground voltage. In this structure, the Fowler-Nordheim tunneling current between the floating gate and the drain region is utilized for ejecting electrons from the floating gate, and the Fowler-Nordheim tunneling current flowing from the whole surface of the channel is utilized for injecting electrons into the floating gate. Therefore, programming and erasing of the memory cell data can be executed without changing the voltage level on the main source line while preventing increase in drain disturb stress of the unselected memory cell. In the read operation, only the leak current of the memory cell of one bit at the maximum affects the read current in each column so that data reading can be performed accurately, and the accurate data reading can be performed even if a memory cell of a low threshold voltage is present.

[Embodiment 3]

Figure 12:
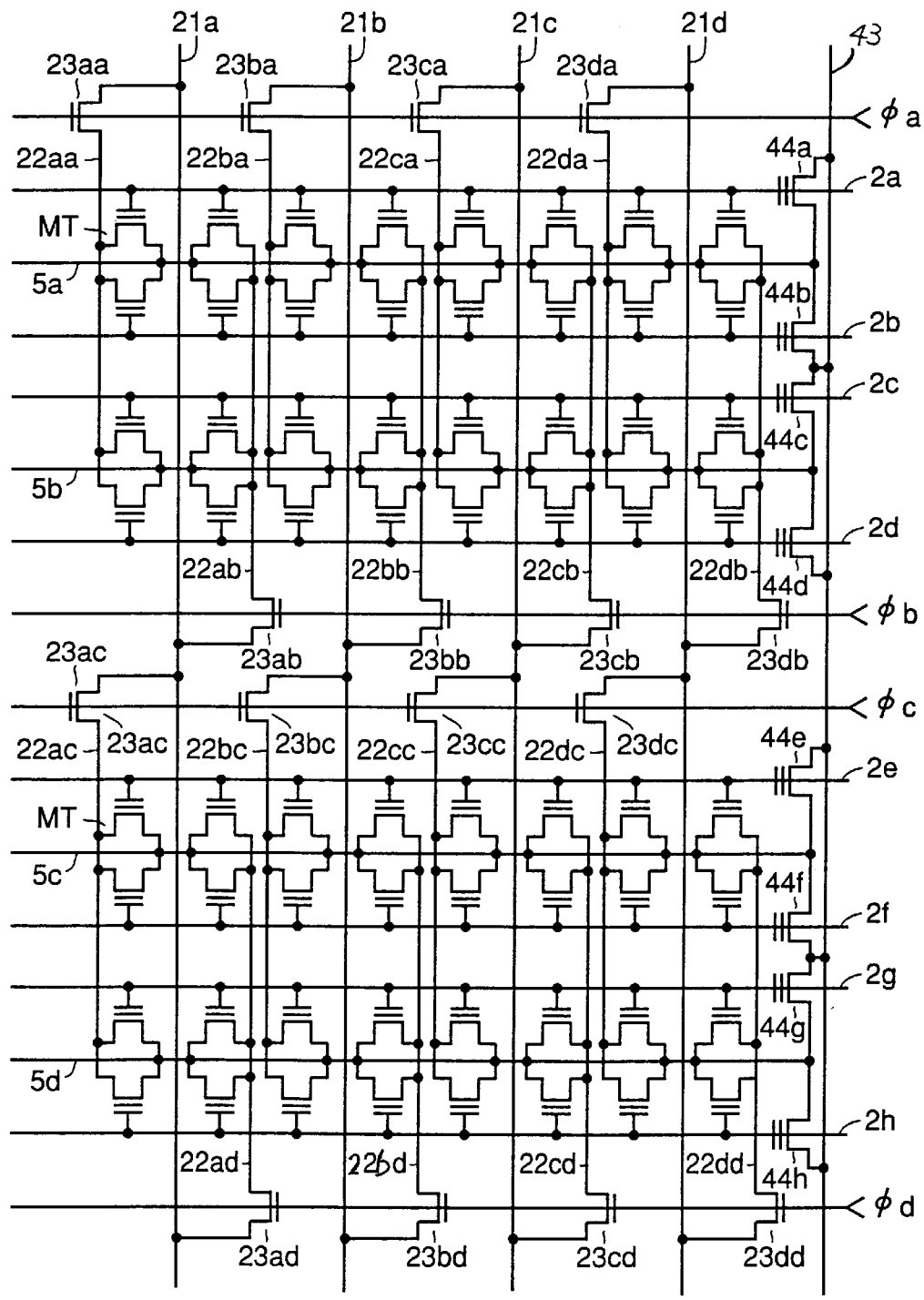
FIG. 12 shows a structure of an array of a nonvolatile semiconductor memory device according to an embodiment 3 of the invention.

FIG. 12 shows a structure of a main portion of a nonvolatile semiconductor memory device according to an embodiment 3 of the invention. The nonvolatile semiconductor memory device shown in FIG. 12 is different from the nonvolatile semiconductor memory device shown in FIG. 7 in the following point.

Source line select transistors 44a–44h, which are provided corresponding to respective word lines 2a–2h for connecting sub-source lines 5a–5d to main source line 43, are formed of floating gate field effect transistors. Source line select transistors 44a–44h formed of these floating gate field effect transistors are merely required to have coupling ratios (i.e., ratios each being a ratio of a capacitance between the floating gate and the substrate with respect to a capacitance between the floating gate and the word line) equal to those of memory cells MT. By employing memory cells MT and source line select transistors 44a–44h having equal coupling ratios, they have the same programming and erasing characteristics. Therefore, source line select transistors 44a–44h formed of these floating gate field effect transistors are not required to have the same sizes as memory cells MT.

By employing the floating gate field effect transistors as source line select transistors 44a–44h, source line select transistors 44a–44h can be implemented by forming the same floating gate field effect transistors as those of memory cells MT, and it is not necessary to provide an isolating region which in turn is usually employed for forming single-insulated gate field effect transistors each having a single control electrode. Therefore, an array area can be reduced. Since the floating gate field effect transistors similar to those of memory cells MT are used as the source line select transistors, the voltage transmitted onto main source line 3 changes depending on the operation mode, and the source line select transistor is set to program/erase states depending on the program/erase states of the memory cells in the corresponding rows, respectively. An operation will now be described below.

(i) Erase Mode

Figure 13A:
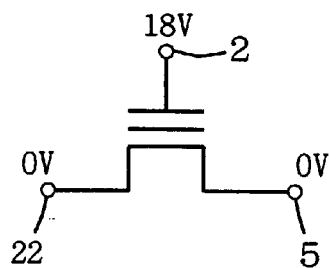
FIGS. 13A to 13D show a manner of applying voltages in an erase operation of the nonvolatile semiconductor memory device shown in FIG. 12.
Figure 13B:
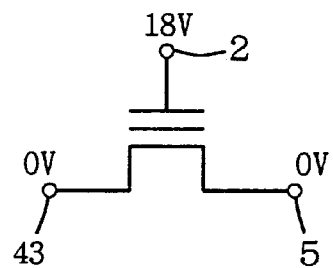

For writing data into the memory cells, erasing is first performed, and data is then written into the memory cells which in turn must store data not corresponding to the erased state. In the erase mode, as shown in FIG. 13A, a voltage of 18 V is applied onto the selected word line. Sub-bit line 22 is supplied with the ground voltage of 0 V through main bit line 21 and section select transistor 23 shown in FIG. 12. In this state, source line select transistor 44 connected to the selected word line receives on its gate a high voltage of about 18 V as shown in FIG. 13B, to be turned on to transmit the ground voltage on main source line 43 onto corresponding sub-source line 5. In the selected memory cell, therefore, a channel is formed at the channel region of the substrate surface as shown in FIG. 13A, and electrons are injected into the floating gate by the Fowler-Nordheim tunneling current flowing through the whole surface of the channel.

Figure 13C:
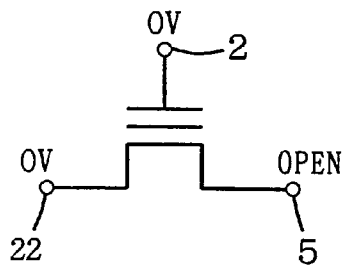
Figure 13D:
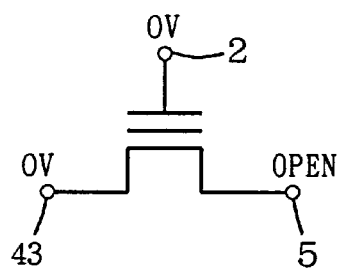

The unselected word line is at the ground voltage of 0 V, as shown in FIG. 13C. In this state, as shown in FIG. 13D, the source line select transistor connected to the unselected word line is likewise off (although threshold voltage Vth must be set to the positive voltage level), and main source line 43 is isolated from sub-source line 5. In the unselected cell, therefore, the source is open as shown in FIG. 13C, and injection of electrons into the floating gate is not performed.

In FIG. 13C, the drain of the unselected cell is at the ground voltage of 0 V, and this memory cell is shown as an example of the memory cells connected to the same sub-bit line as that for the selected cell. In the unselected cell connected to the sub-bit line not connected to the selected memory cell, the drain node (sub-bit line 22) of this unselected cell is open.

In this erase mode, the source line select transistor connected to the selected word line is set to the erased state in which threshold voltage Vth is high. The erasing is performed on a word line at a time (i.e., memory cells in one row provided with a common sub-source line are erased at a time).

(ii) Write Mode

In the write mode, erasing is effected on the memory cells into which data is to be written, and then programming is effected on the memory cells into which data not corresponding to the erased state is to be written.

Figure 14A:
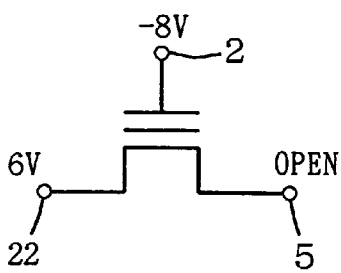
FIGS. 14A to 14D show a manner of applying voltages in a programming operation of the nonvolatile semiconductor memory device shown in FIG. 12.
Figure 14B:
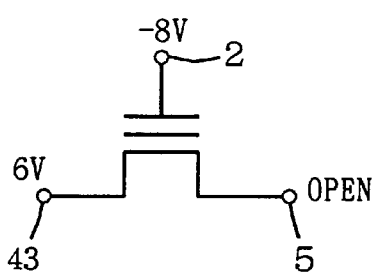

In this write mode, the selected word line is at a negative voltage of −8 V as shown in FIG. 14A. When a writing unit includes a selected memory cell having its state made different from the erased state through writing, the programming voltage of 6 V is transmitted to sub-bit line 22 for this selected memory cell through the main bit line and the section select transistor. When programming is effected on the memory cell(s) of at least one bit in this unit for writing, main source line 43 is set to the voltage level of 6 V equal to the programming voltage. In this case, as shown in FIG. 14B, the source line select transistor connected to the selected word line receives on its gate the voltage of −8 V, and also receives on its drain the programming voltage of 6 V as shown in FIG. 14B. Therefore, when the programming is effected on the selected cell, programming by the Fowler-Nordheim tunneling current is similarly and simultaneously effected on the corresponding source line select transistor. Therefore, when threshold voltage Vth of this source line select transistor is set to a low value, programming is effect on the memory cell(s) of at least one bit on the corresponding word line (or writing unit).

Figure 14C:
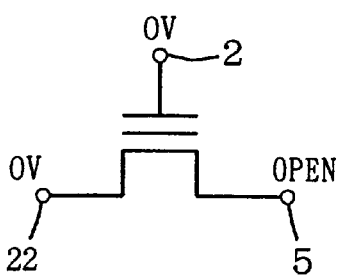
Figure 14D:
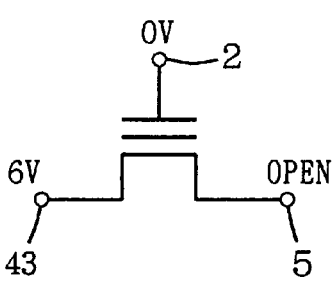

For the memory cell connected to the unselected word line, as shown in FIG. 14C, the ground voltage of 0 V is transmitted onto the word line, and corresponding sub-bit line 22 receives the ground voltage of 0 V or is rendered open (by the section select transistor). In this state, therefore, the unselected source line select transistor is supplied with a voltage of 6 V through main source line 43 as shown in FIG. 14D, but receives on its control electrode node the ground voltage of 0 V so that it is off, and corresponding sub-source line 5 is open. For this unselected source line select transistor, therefore, the voltage of 6 V is applied merely across its control electrode node and the source, and the Fowler-Nordheim current does not flow so that its threshold voltage does not change.

In the programming mode, the source line select transistor receives on its one conduction node (drain) the programming voltage of 6 V through main source line 43. For generating the Fowler-Nordheim tunneling current, it is required only to overlap the floating gate and the drain region each other, and it is not particularly required to generate hot electrons at the drain edge or source edge. The erase operation is performed by the whole channel surface Fowler-Nordheim current. Therefore, the source line select transistor may have a source-drain symmetrical structure, whereby the Fowler-Nordheim tunneling current can be produced between main source line 43 and the floating gate in the source line select transistor in programming.

(iii) Read Mode

Figure 15A:
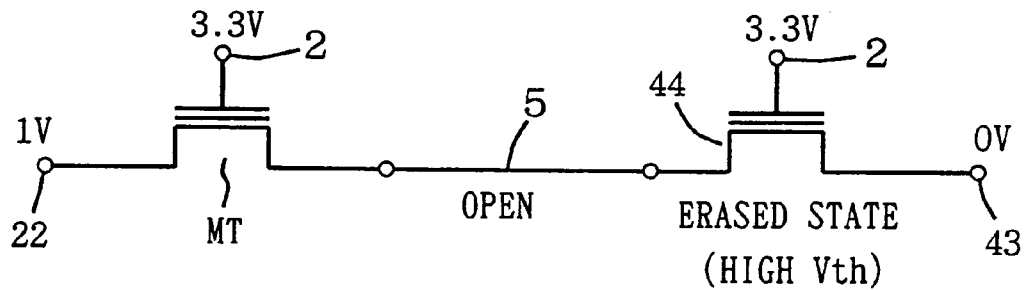
FIGS. 15A to 15C show a manner of applying voltages in a data read operation of the nonvolatile semiconductor memory device shown in FIG. 12.

In the read operation mode, a voltage of 3.3 V is applied onto the selected word line, and a read voltage of 1 V is transmitted onto the selected sub-bit line. In this case, two states are present depending on the state of source line select transistor 44 connected to the selected word line. More specifically, when source line select transistor 44 is in the erased state and the threshold voltage is high (high Vth state) as shown in FIG. 15A, this source line select transistor 44 maintains the off state even if a voltage of 3.3 V is applied onto selected word line 2. In this state, therefore, the selected memory cell MT has a high threshold voltage and is in the erased state, and a current does not flow therethrough so that the data can be read accurately. The state in which source line select transistor 44 is in the erased state represents such a state that all the memory cells connected to this selected word line are in the erased state and high Vth state. By determining whether a current flows through main source line 43 or not, it is possible to determine whether the source line select transistor connected to the selected word line is in the erased state or not, and data in one page can be read out by one access. However, this reading manner is predicated on that threshold voltages Vth of all the source line select transistors are at the positive voltage level, and their leak current are sufficiently small.

Figure 15B:
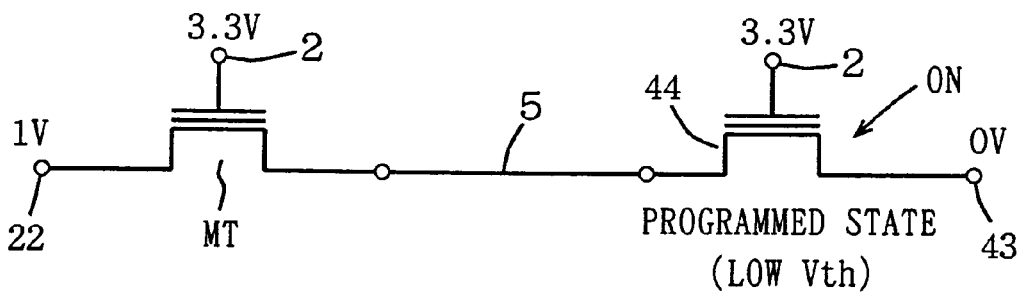

When source line select transistor 44 connected to a selected word line is in the programmed state and has a low threshold voltage (in the low Vth state), this source line select transistor is on in accordance with the voltage of 3.3 V on the selected word line (see FIG. 15B). In this state, therefore, the memory cell(s) of at least one bit in the selected row is in the programmed state, and data reading can be performed similarly to the usual data reading and, more specifically, can be performed by applying the read voltage of 1 V to sub-bit line 22 and determining whether a current flows through the path from this sub-bit line to the main bit line through the section select transistor or not.

Figure 15C:
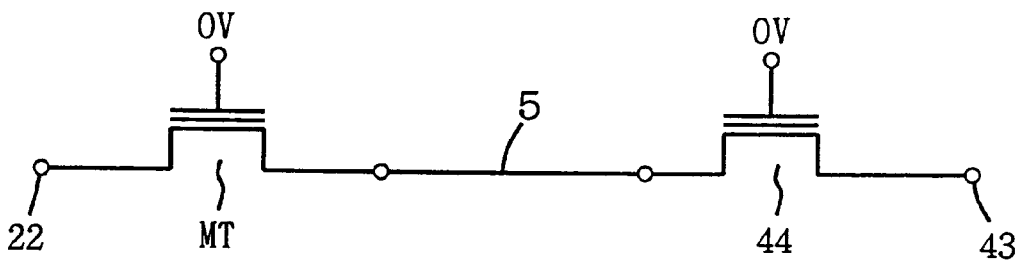

In the unselected memory cell, as shown in FIG. 15C, the ground voltage of 0 V is transmitted onto the unselected word line, and unselected memory cell MT and unselected source line select transistor 44 maintain the off state. In this case, sub-bit line 22 is set to one of the state of the programming voltage of 1 V, the state of the ground voltage of 0 V and the open state depending on the position of this unselected memory cell.

According to the above description, when source line select transistor 44 is in the erased state, it is determined whether the current flows through main source line 43. When selected source line select transistor 44 is in the programmed state, a current flows from main source line 43 to the sub-source line. This sub-source line extends over one row and has a relatively large capacitance so that the current can be sufficiently absorbed even in the open state. By detecting this current, it is possible to determine accurately whether the select transistor is in the erased state or the programmed state.

Figure 16:
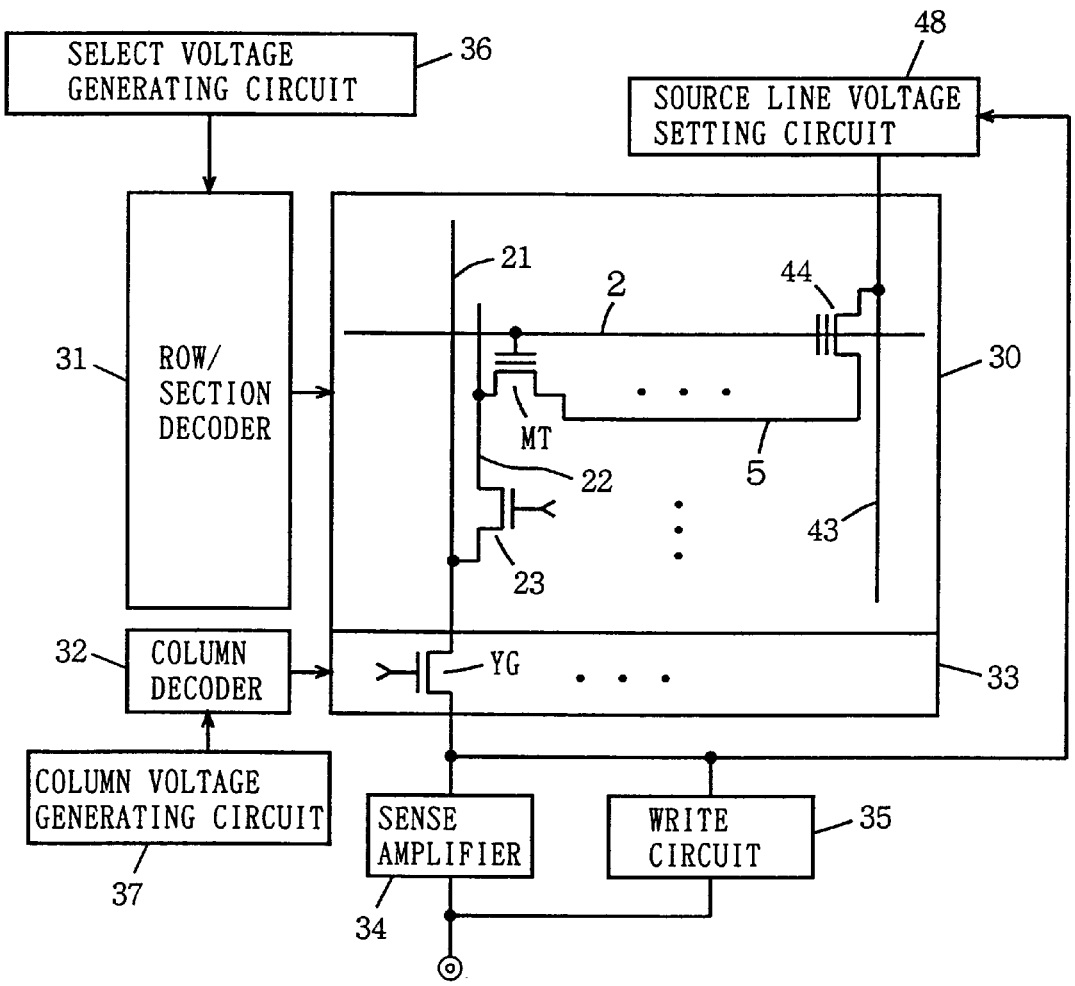
FIG. 16 schematically shows a whole structure of the nonvolatile semiconductor memory device shown in FIG. 12.

FIG. 16 schematically shows a whole structure of a nonvolatile semiconductor memory device of the embodiment 3 of the invention. The nonvolatile semiconductor memory device shown in FIG. 16 differs from the structure shown in FIG. 11 in that source line select transistor 44 is formed of a floating gate field effect transistor having the same program/erase characteristics as the memory cell. For setting the voltage on main source line 3, therefore, a source line voltage setting circuit 48 is additionally provided, which sets the voltage on main source line 3 in accordance with the write data from write circuit 35 in the write mode. Other structures are the same as those shown in FIG. 11.

By applying the write data from write circuit 35 to source line voltage setting circuit 48, main source line 3 can be set to the predetermined voltage of 0 V or the programming voltage of 6 V in the write mode.

Figure 17:
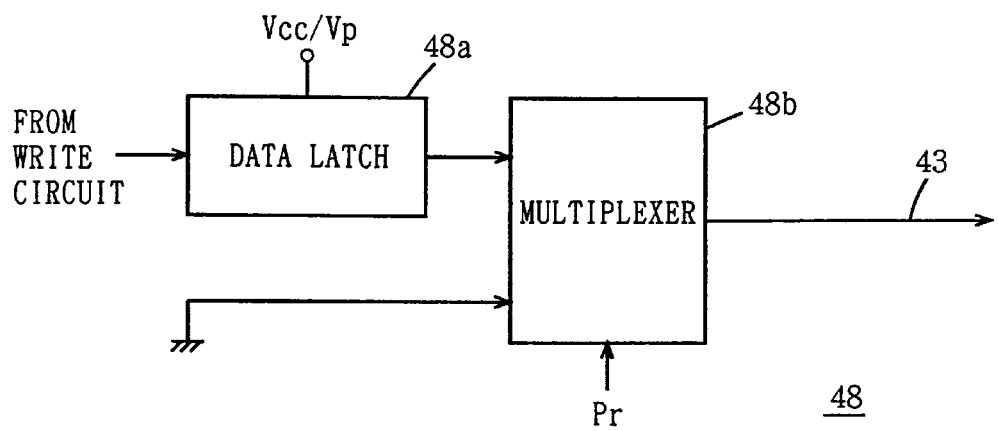
FIG. 17 schematically shows a structure of a source line voltage setting circuit shown in FIG. 16.

FIG. 17 schematically shows an example of the structure of source line voltage setting circuit 48 shown in FIG. 16. In FIG. 17, source line voltage setting circuit 48 includes a data latch 48a latching the write data from write circuit 35 shown in FIG. 16 and corresponding to the low threshold voltage, and a multiplexer 48b for selecting one of the latched data of data latch 48a and the ground voltage in accordance with a programming instructing signal Pr, and transmits the selected one onto main source line 3. Data latch 48a receives a voltage Vcc/Vp on its one power supply node. Voltage Vcc/Vp is set to a level of a high voltage, i.e., programming voltage Vp (6 V) in the programming mode, and is set to power supply Vcc level in the modes other than the programming mode. Multiplexer 48b selects the latched data of data latch 48a and transmits the same onto main source line 3 when programming instructing signal Pr is active and instructs the programming mode. When the memory cell(s) of at least one bit to be programmed is present in the selected row, the latched data corresponds to the low threshold voltage state. In the other operation modes, multiplexer 48b selects the ground voltage and transmits the same onto main source line 3.

During the data write operation on the selected word line, therefore, the data signal voltage on main source line 3 can be set in accordance with the write data.

FIG. 18 is a table showing a relationship between the threshold voltage of the memory cell and the threshold voltage of the corresponding source line select transistor. Memory cell MT can be in the programmed state, or the low threshold voltage (low Vth) state, and can also be in the erase state or the high threshold voltage (high Vth) state. When memory cell MT is in the low Vth state, the corresponding source line select transistor is in the programmed state, and is in the low Vth state. In this case, therefore, the current flows through the main bit line and sub-bit line when a memory cell is selected, and the data of the memory cell is accurately represented. When memory cell MT is in the high Vth state, the corresponding source line select transistor is in the low Vth state or high Vth state. In either case, however, the current does not flow through the main and sub-bit lines. Therefore, reading of the memory cell data can be performed by detecting this current on the main and sub-bit lines.

Besides, it is determined whether the source line select transistor is in the high Vth state or not when the selected memory cell is in the high Vth state, whereby it is possible to determine whether all the memory cells connected to the word line, i.e., one row of interest are in the high Vth state or not. Therefore, when the memory cells in a certain page (one row) are successively accessed, an operation may be simultaneously performed to determine whether the source line select transistor is in the high Vth state or not, whereby it is possible to determine whether all the memory cells in the page to be accessed are in the high Vth state or not, and therefore fast access can be achieved.

FIG. 19 shows another structure of source line voltage setting circuit 48 shown in FIG. 16. The structure shown in FIG. 19 includes, in addition to the structures shown in FIG. 17, a current sense circuit 48c activated in response to a high Vth determining signal φhv from sense amplifier 34 (FIG. 16) to determine whether a current flows through main source line 43 or not. When a current does not flow through main source line 43, current sense amplifier 48c activates its output signal φpah to represent that all the memory cells in the corresponding selected row are in the high Vth state.

According to the above description, current sense amplifier circuit 48c included in source line voltage setting circuit 48 is activated in accordance with the data detected by sense amplifier 34. Alternatively, such a structure may be employed that, in the data read mode, current sense circuit 48c is first activated to determine, after selection of the word line, whether the current flows through main source line 43 or not, and thereafter sense amplifier 34 shown in FIG. 16 performs the sensing.

[Modification]

FIG. 20 shows a structure of a modification of the embodiment 3 of the invention. FIG. 20 shows the structure of the NOR type flash memory shown in FIG. 1. In FIG. 20, floating gate field effect transistors having the same programming/erase characteristics as memory cell MT are used as source line select transistors 54a–54f. Source line select transistors 54a–54f are arranged corresponding to word lines 2a–2f, respectively. Memory cells are aligned in three columns, and bit lines 1a, 1b and 1c are arranged for the columns, respectively. A main source line 53 may be provided for a predetermined number of columns and it is not necessary to provide one main source line 53 for the memory cells in one row.

In the structure of the NOR type flash memory shown in FIG. 20, source line select transistors 54a–54f have the same programming/erase characteristics as memory cell MT, and the threshold voltages of these source line select transistors can be set in accordance with data stored in the memory cells in the corresponding rows, as is done in the foregoing DINOR type flash memory shown in FIG. 12. An operation will be described below.

(i) Erase Mode

Figure 21A:
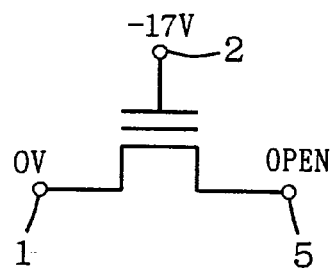
FIGS. 21A to 21D show a manner of applying voltages in an erase operation of the nonvolatile semiconductor memory device shown in FIG. 20.
Figure 21B:
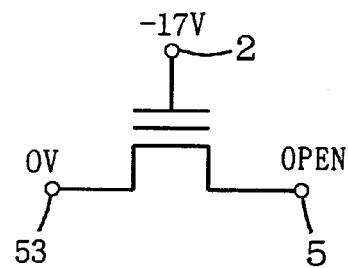

In NOR type flash memory, a negative voltage of −17 V is transmitted onto the selected word line during the erase operation, as shown in FIG. 21A. In this state, as shown in FIG. 21B, source line select transistor 54 connected to the selected word line receives on its gate a negative voltage of −17 V and is off, and corresponding sub-source line 5 is open. In the selected memory cell, a Fowler-Nordheim tunneling current flows between the floating gate and the conduction node (drain) connected to bit line 1 so that electrons are ejected from the floating gate. At this time, the ground voltage of 0 V is likewise transmitted onto main source line 53 for the source line select transistor connected to the selected word line, and electrons are ejected from its floating gate by the Fowler-Nordheim tunneling current.

Figure 21C:
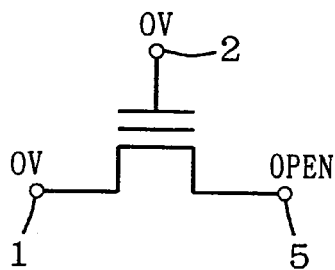
Figure 21D:
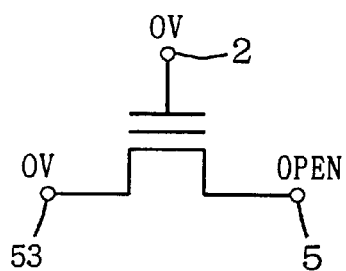

The memory cell connected to the unselected word line is supplied with a voltage of 0 V as shown in FIG. 21C, and the corresponding source line select transistor 54 is off as shown in FIG. 21D so that corresponding sub-source line 5 is open (threshold voltage Vth exceeds 0 V). Therefore, no current flows through the memory cell connected to this unselected word line. Accordingly, erasing of data of memory cells is performed on a selected word line at a time.

(ii) Program Mode

Figure 22A:
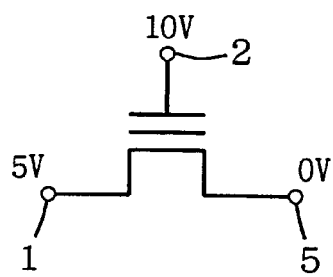
FIGS. 22A to 22D show a manner of applying voltages in a programming mode of the nonvolatile semiconductor memory device shown in FIG. 20.
Figure 22B:
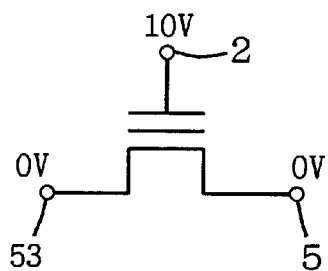

In the program mode, as shown in FIG. 22A, a voltage of 10 V is applied to selected word line 2 and, for the memory cell to be programmed, a voltage of 5 V is selectively transmitted onto corresponding bit line 1, depending on the write data (if the write data is the same as that corresponding to the erased state, the bit line is held at the ground voltage level). In this state, as shown in FIG. 22B, source line select transistor 54 is turned on by the high voltage of 10 V on its control electrode node, to transmit the ground voltage of 0 V onto corresponding sub-source line 5. Thereby, as shown in FIG. 22A, a channel current flows through the selected memory cell, and channel hot electrons are injected into the floating gate so that the programming is performed.

Figure 22C:
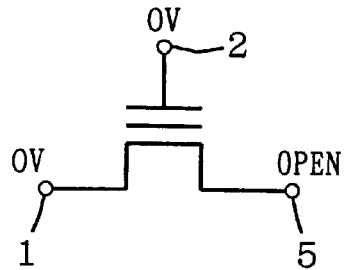
Figure 22D:
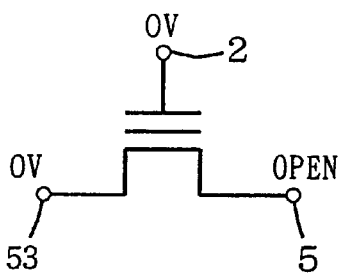

To the unselected bit line, the ground voltage is transmitted as shown in FIG. 22C, and corresponding bit line 1 is held at the ground voltage level. As shown in FIG. 22D, source line select transistor 54 connected to this unselected word line is off to isolate corresponding sub-source line 5 from main source line 53. Therefore, as shown in FIG. 22C, a channel current does not flow in the unselected memory cell, and its threshold voltage does not change.

(iii) Writing of Source Line Select Transistor

Figure 23A:
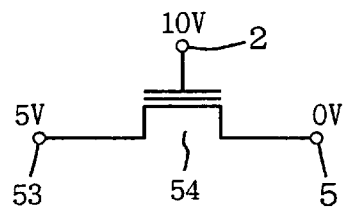
FIGS. 23A and 23B show a manner of applying voltages in a data read operation of the nonvolatile semiconductor memory device shown in FIG. 20.
Figure 23B:
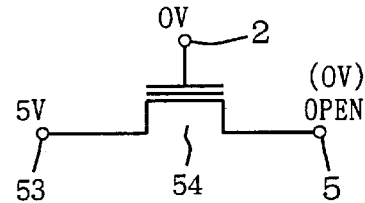

When all the memory cells connected to the selected word line are set to the programmed state, corresponding source line select transistor 54 is set to the programmed state as shown in FIG. 23A. In this state, a voltage of 10 V is transmitted onto word line 2, and a voltage of 5 V is transmitted onto main source line 53, and sub-source line 5 is set to the ground voltage of 0 V (this structure will be described later). The source line select transistor connected to the unselected word line maintains the off state because the voltage on word line 2 is 0 V, as shown in FIG. 23B, and corresponding sub-source line 5 is open. Therefore, when all the memory cells connected to the selected word line are set to the programmed state, the corresponding source line select transistor 54 is likewise set to the programmed state by the whole channel surface Fowler-Nordheim tunneling current. Source line select transistor 54 connected to an unselected word line is held in the erased state.

Figure 24:
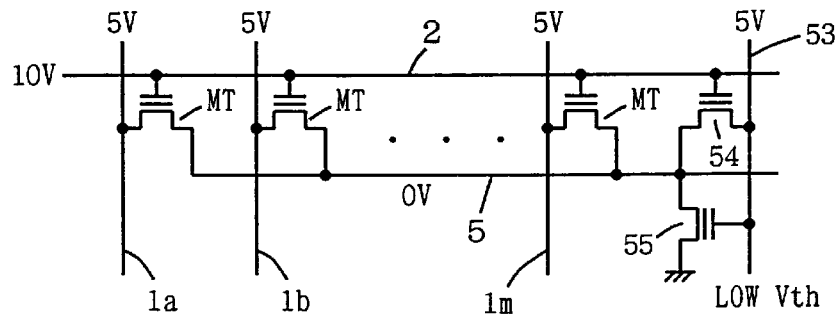
FIG. 24 shows a structure of a source line select transistor of the nonvolatile semiconductor memory device shown in FIG. 20.

FIG. 24 shows an example of the structure for setting this source line select transistor to the programmed state. In FIG. 24, a floating gate field effect transistor 55 for discharging sub-source line 5 to the ground voltage level in response to the voltage level on main source line 53 is provided. Floating gate field effect transistor 55 is held in the erased state. When all memory cells MT connected to word line 2 are set to the programmed state as shown in FIG. 24, a voltage of 5 V is applied to each of bit lines 1a–1m. In this state, a voltage of 5 V is also transmitted to main source line 53. Thereby, floating gate field effect transistor 55 is turned on, and sub-source line 5 is discharged to the ground voltage level. Therefore, all memory cells MT and source line select transistor 54 can be set to the programmed state.

In this structure shown in FIG. 24, floating gate field effect transistor 55 is provided for sub-bit line 5. Therefore, all floating gate field effect transistors 55 connected to main source line 53 are turned on. Accordingly, sub-source line 5 provided for the unselected word line is discharged to the ground voltage level. However, the unselected word line is at the ground voltage level as shown in FIG. 22, and the unselected memory cell maintains the off state and does not allow flowing of a channel current so that it exert any adverse effect.

In FIG. 24 floating gate field effect transistor 55 for discharging is provided, and a special and dedicated region is not required in contrast to a structure employing a usual n-channel MOS transistor of a single gate type. However, floating gate field effect transistor 55 may be replaced with a normal n-channel MOS transistor.

(iv) Read Mode

Figure 25A:
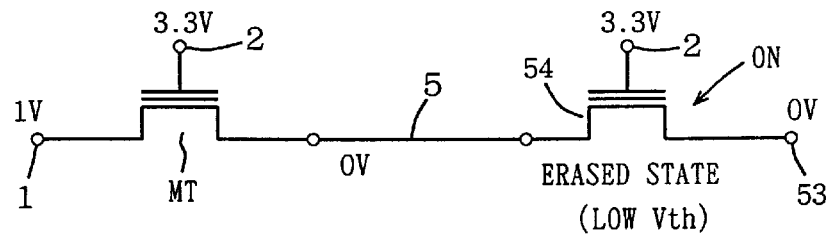
FIGS. 25A to 25C show a manner of applying voltages in the data read operation of the nonvolatile semiconductor memory device shown in FIG. 20.

In the read mode, the ground voltage of 0 V is transmitted onto main source line 53. A voltage, e.g., of about 3.3 V is transmitted onto the selected word line. When source line select transistor 54 connected to the selected word line is in the erased state or in the low threshold voltage state, as shown in FIG. 25A, this source line select transistor 54 is on. Therefore, data stored in this memory cell MT can be read out by determining whether a current flows through bit line 1 or not.

Figure 25B:
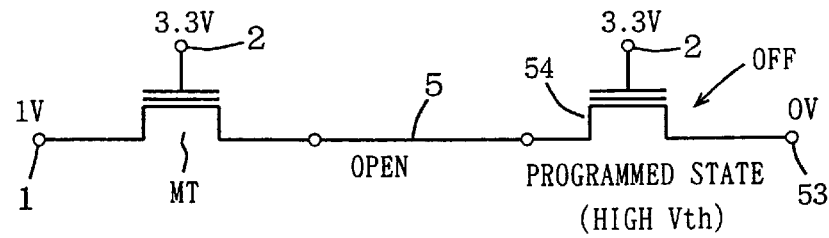

When source line select transistor 54 connected to the selected word line is in the programmed, or in the high threshold voltage (high Vth) state as shown in FIG. 25B, this source line select transistor 54 maintains the off state. Therefore, a current does not flow through bit line 1. However, when source line select transistor 54 is set to the programmed state, all memory cells MT connected to selected word line 2 are set to the programmed state. By detecting that a current does not flow through bit line 1, it is possible to determine accurately that selected memory cell MT is in the programmed state. In this case, such a structure may be additionally employed that can determine whether a current flows through main source line 53 or not, whereby it is possible to determine whether all the memory cells connected to the selected word line are in the programmed state or not.

Figure 25C:
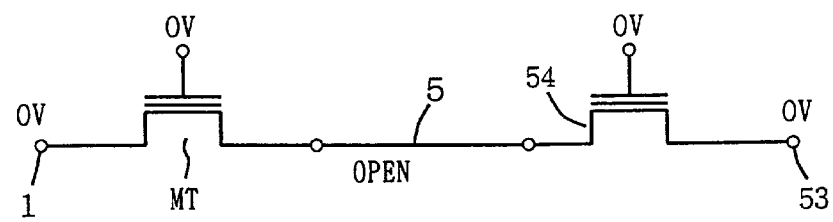

The unselected word line is supplied with a voltage of 0 V as shown in FIG. 25 so that corresponding memory cell MT and source line select transistor 54 are both off. Therefore, sub-source line 5 is set to the open state except for the case that the word line paired with the above unselected word line is in the selected state. Accordingly, these unselected memory cells MT do not supply any current to bit line 1, and do not adversely affect the read operation.

The structure shown in FIG. 24 may include the structures shown in FIGS. 17 and 19, whereby, when all the memory cells connected to a selected word line are in the programmed state, the corresponding source line select transistor can be set to the programmed state, and it is possible to determine, in the read mode, whether a current flows through main source line 53 or not. Thereby, it is possible to determine that all the memory cells in one row are in the programmed state.

Figure 26:
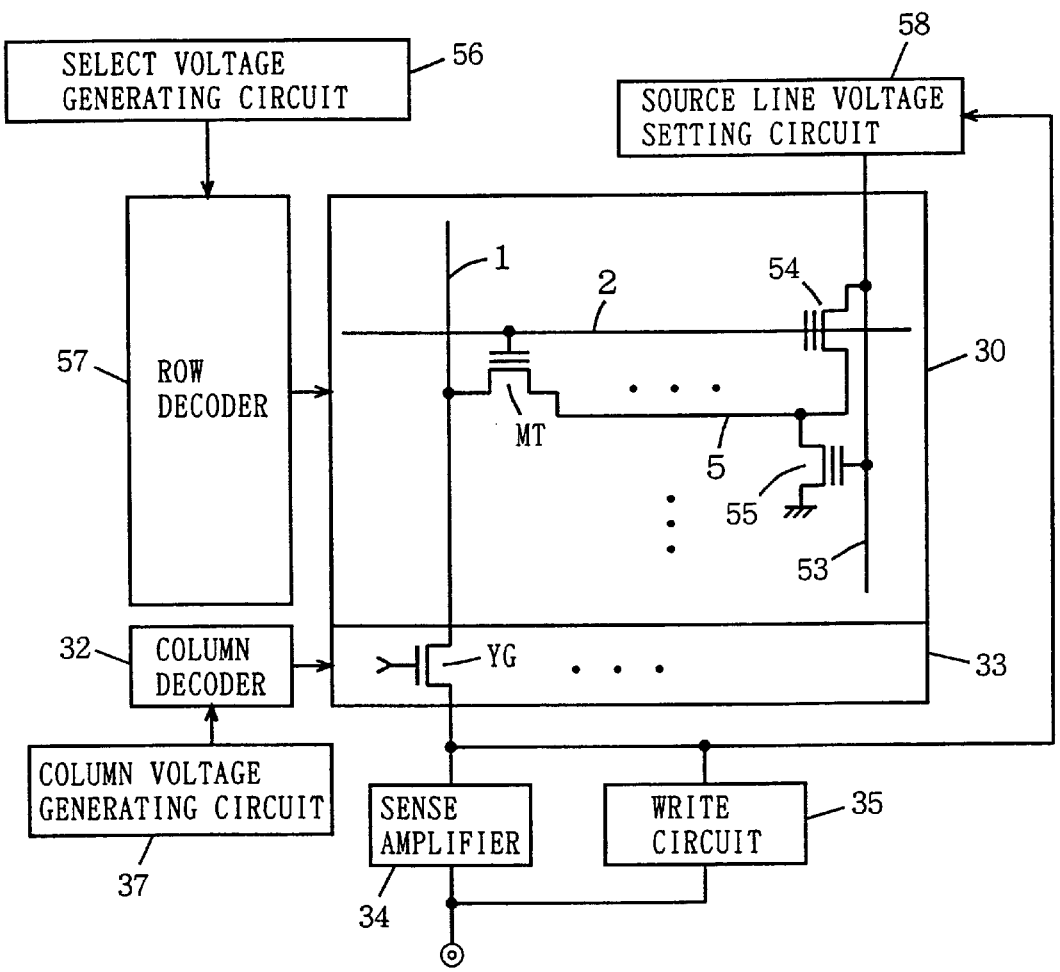
FIG. 26 schematically shows a whole structure of the nonvolatile semiconductor memory device shown in FIG. 20.

FIG. 26 schematically shows a whole structure of a nonvolatile semiconductor memory device of a modification of the embodiment 3 of the invention. The nonvolatile semiconductor memory device shown in FIG. 26 differs from the structure of the nonvolatile semiconductor memory device shown in FIG. 16 in the following points. In memory cell array 30, for the NOR type flash memory, memory cell MT is connected to bit line 1, and source line select transistor 54 and floating gate field effect transistor 55 programming the source line select transistor are provided for sub-source line 5.

Row decoder 57 transmits a voltage, which is generated in accordance with the operation mode by select voltage generating circuit 56, onto a selected word line. In the write mode, source line voltage setting circuit 58 sets the voltage transmitted onto main source line 53 to the programming voltage level when all the memory cells connected to the selected word line are in the programmed state. Structures other than the above are the same as those shown in FIG. 16. The corresponding portions bear the same reference numerals, and will not be specifically described below.

Figure 27:
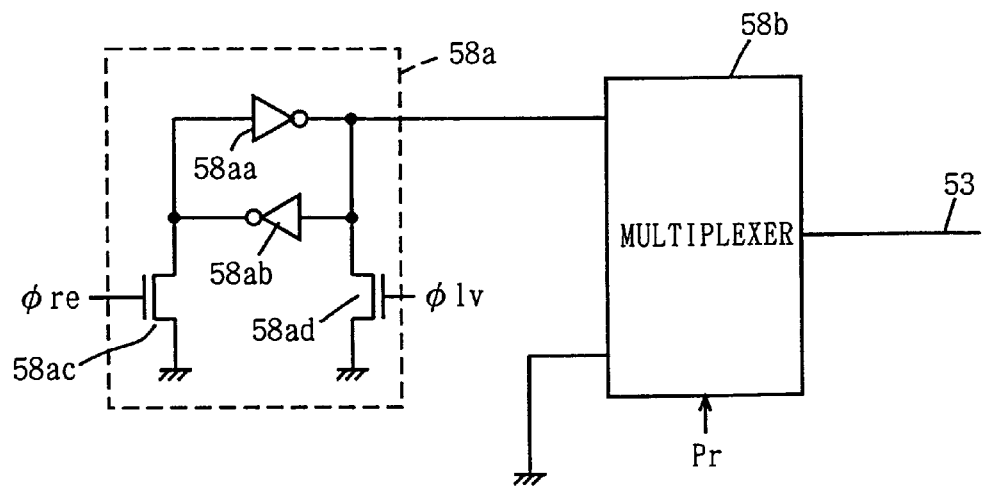
FIG. 27 shows an example of a structure of a source line voltage setting circuit shown in FIG. 26.

FIG. 27 schematically shows an example of a structure of source line voltage setting circuit 58 shown in FIG. 26. In FIG. 27, source line voltage setting circuit 58 includes a data latch 58a storing data representing that the write data requires setting of all the memory cells to the programmed state, and a multiplexer 58b for selecting and transmitting either the latched data of data latch 58a or the ground voltage onto main source line 53 in accordance with programming mode instructing signal Pr.

Data latch 58a includes inverter circuits 58aa and 58ab which forms a latch circuit, an n-channel MOS transistor 58ac which sets an output node of inverter 58ab and an input node of inverter 58aa to the ground voltage level in accordance with an initializing signal φre, and an n-channel MOS transistor 58ad which is turned on in response to a signal φlv representing that the write data requires setting to the erased state, to set the output node of inverter 58aa and the input node of inverter 58ab to the ground voltage level.

In the structure of data latch 58a shown in FIG. 27, upon the data write mode, initializing signal φre is activated, and the input node of inverter 58aa is set to the ground voltage level. In the initialized state, therefore, the output signal of inverter 58aa is at H-level. This signal at H-level is fed back by inverter 58ab to the input of inverter 58aa, and is latched thereby. When write circuit 35 is supplied with the write data and particularly the data requiring setting of the memory cell to the erased state, signal φiv is activated to turn on MOS transistor 58ad, and the output node of inverter 58aa is set to the ground voltage level. Therefore, in the case wherein all the memory cells connected to the selected word line are to be set to the programmed state, signal φlv maintains the inactive state, and data latch 58a latches data at the initially set H-level. Thereby, in the mode of actually writing data into the memory cell, the programming voltage of 5 V is transmitted to main source line 53 through multiplexer 58b, and both memory cell MT and source line select transistor 54 are set to the programmed state.

In the above description, memory cell MT and source line select transistor 54 are simultaneously set to the programmed state. However, source line select transistor 54 may be set to the programmed state after the programming operation of memory cell MT is completed.

According to the embodiment 3 of the invention, the floating gate field effect transistor having the same programming/erase characteristics as the memory cell is used as the source line select transistor. Therefore, it is not necessary to provide an isolating region for forming a normal MOS transistor as the source line select transistor, and therefore the area occupied by the array can be reduced.

When all the memory cells connected to a selected word line are in the high threshold voltage state, the corresponding floating gate field effect transistor for the source line selection is set to the high threshold voltage state. Therefore, by reading out the stored information of the source line select transistor through the main source line, it is possible and easy to determine whether all the memory cells connected to a selected word line are in the high threshold voltage state or not, and all the data of the selected word line can be read out by one access without accessing all the memory cells connected to the selected word line.

[Embodiment 4]

Figure 28:
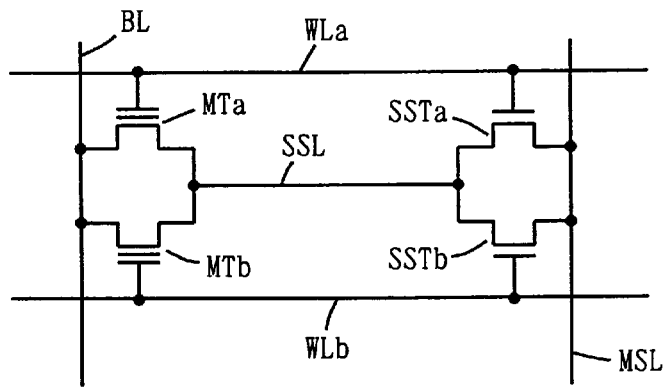
FIG. 28 schematically shows a structure of an array of a nonvolatile semiconductor memory device according to an embodiment 4 of the invention.

FIG. 28 schematically shows a structure of a memory array. FIG. 28 shows word lines WLa and WLb sharing a sub-source line SSL. Memory cell MTa and source line select transistor SSTa are connected to word line WLa. Memory cell MTb and source line select transistor SSTb are connected to word line WLb. Memory cells MTa and MTb are arranged in the same column, and are connected to bit line BL. In this structure, the bit line may be either the bit line of the NOR type flash memory or the sub-bit line of the DINOR type flash memory, and the reference characters "BL" is used. Also, the source line select transistor bears the reference characters "SST" because it may be formed of an n-channel MOS transistor as shown in FIG. 28, or may be formed of a floating gate field effect transistor having the same programming/erase characteristics as the memory cell. In the following description, therefore, bit lines BL generically represent the bit lines of the NOR type flash memory and the bit line (main and sub-bit lines) of the DINOR type flash memory, and source line select transistors SST generically represent the n-channel MOS transistors and the floating gate field effect transistors.

In the structure shown in FIG. 28, it is now assumed that memory cell MTb is in the over-low Vth state. When memory cell MTa is in the low threshold voltage state, erroneous reading of data does not occur even if memory cell MTb in this over-low Vth state causes current flow through bit line BL. However, when memory cell MTa is in the high Vth state, a current flow through bit line BL due to memory cell MTb in the over-low Vth state so that erroneous reading of data may occur (when the threshold voltage thereof becomes negative). Accordingly, a one-bit failure may occur when data of multiple bits is read. For detecting a memory cell in the over-low Vth state, such a scheme is usually employed that word lines WL (WLa and WLb) are set to the voltage level (from 0 V to 0.5 V) lower than that in the normal reading and it is determined whether a current flows through bit line BL or not. In this state, however, source line select transistors SSTa and SSTb are not in complete turn-on state (i.e., the state of performing an operation in the subthreshold region), or are in the off state, and substantially no current flows through a current path from bit line BL to main source line MSL. Therefore, a method similar to the conventional scheme cannot be utilized for detecting a memory cell in the over-low Vth state. Description will now be given on the method of detecting a memory cell in the over-low Vth state.

Figure 29:
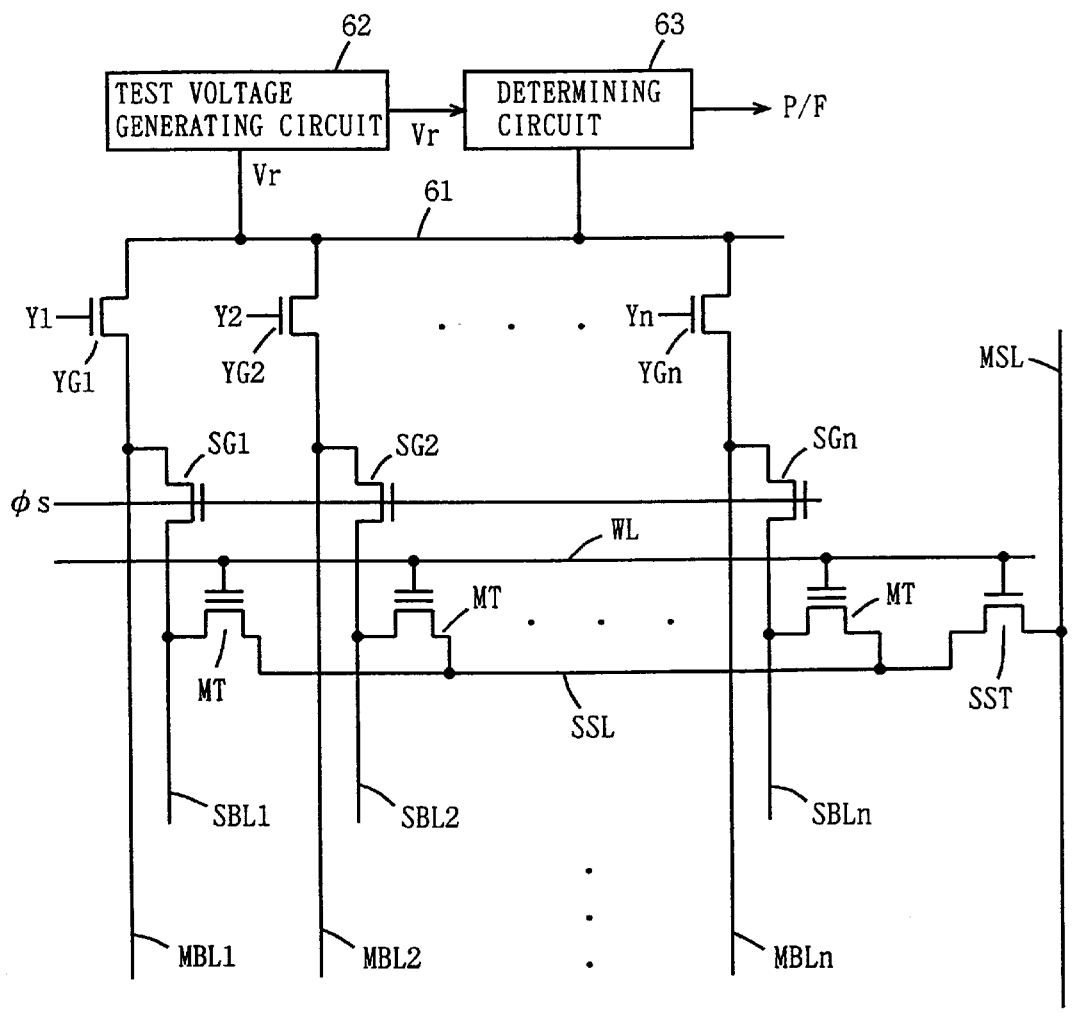
FIG. 29 schematically shows a structure of a main portion of the nonvolatile semiconductor memory device according to the embodiment 4 of the invention.

FIG. 29 shows a structure of a main portion of a nonvolatile semiconductor memory device according to the embodiment 4 of the invention. FIG. 29 shows a structure of a DINOR type flash memory. In FIG. 29, main bit lines MBL1–MBLn are coupled to an internal data bus 61 through column select gates (Y-gates) YG1–YGn which in turn are made conductive in response to column select signals Y1–Yn, respectively. Main bit lines MBL1–MBLn are connected to sub-bit lines SBL1–SBLn through section select transistors SG1–SGn, respectively, which in turn are made conductive in response to a section select signal 4s. Memory cells MT are arranged corresponding to the crossings between word line WL and sub-bit lines SBL1–SBLn, respectively. Memory cells MT are commonly connected to sub-source line SSL, which in turn is connected to main source line MSL through source line select transistor SST. Source line select transistor SST is turned on in response to the signal voltage on word line WL.

For internal data bus 61, a test voltage generating circuit 62 for generating a test voltage Vr at a predetermined voltage level in a test mode of operation, and a determining circuit 63 for comparing test voltage Vr generated by test voltage generating circuit 62 and the voltage on internal data bus 61 are provided. The test voltage Vr from test voltage generating circuit 62 may be equal to a read voltage transmitted to a selected bit line in data reading, or may be equal to a voltage, e.g., of about 0.5 V lower than this read voltage and slightly higher than the ground voltage. Description will now be given on an operation of the nonvolatile semiconductor memory device shown in FIG. 29 for detecting the over-low Vth memory cell.

In the test mode, test voltage generating circuit 62 is activated to generate test voltage Vr at the predetermined voltage level. In this test mode, all column select signals Y1–Yn are simultaneously driven to the selected state and test voltage Vr is transmitted to main bit lines MBL1–MBLn. In this state, section select signal ϕs is inactive. When main bit lines MBL1–MBLn are charged to the level of test voltage Vr after a predetermined time, all column select signals Y1–Yn are set to the unselected state, and main bit lines MBL1–MBLn are kept in the floating state. Then, section select signal ϕs is kept active for a predetermined period, and section select transistors SG1–SGn are turned on. Thereby, electric charges stored in main bit lines MBL1–MBLn are transmitted to the corresponding sub-bit lines SBL1–SBLn, respectively.

All the word lines WL are in the unselected state, and the voltage levels thereof are held at the ground voltage level of 0 V. In this state, if a memory cell in the over-low Vth state (i.e., over-programmed state) exists, the charges transmitted to the sub-bit line flow to sub-source line SSL through the memory cell in the over-low Vth state. Sub-source line SSL has substantially the same length as word line WL, and source line select transistor SST is off so that the voltage level on sub-source line SSL rises. This lowers the voltage level on the main bit line provided for the sub-bit line connected to the memory cell in the over-low Vth state. After keeping the connection between the sub-bit line and the main bit line for a predetermined time, e.g., of about 100 ns, column select signals Y1–Yn are successively driven to the selected state so that main bit lines MBL1–MBLn are successively connected to internal data line 61. Determining circuit 63 compares the voltage transmitted onto internal data line 61 from the main bit line with test voltage Vr, and generates a signal P/F indicating whether the memory cell in the over-low Vth state exists or not.

Figure 30:
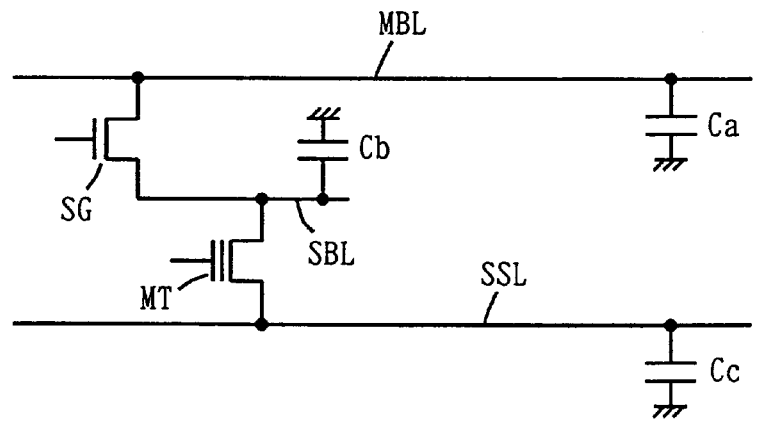
FIG. 30 is a schematic view depicting an operation of the nonvolatile semiconductor memory device according to the embodiment 4 of the invention.

FIG. 30 shows a distribution of capacitances in the main bit line, sub-bit line and sub-source line. In FIG. 30, a parasitic capacitance Ca is present in main bit line MBL, a parasitic capacitance Cb is present in sub-bit line SBL, and a parasitic capacitance Cc is present in sub-source line SSL. The word line is unselected and is at 0 V so that a current path from sub-bit line SBL to sub-source line SSL is cut off if memory cell MT is normal. In this case, therefore, the voltage on main bit line MBL can be expressed by the following equation:

$$V1 = Vr \cdot Ca/(Ca+Cb) \sim Vr$$

In the above equation, the approximation is made based on the consideration that the value of parasitic capacitance of sub-bit line SBL is substantially ignorable compared with the value of parasitic capacitance Ca of main bit line MBL.

When memory cell MT is in the over-low Vth state, a current flows from sub-bit line SBL to sub-source line SSL. In the case, therefore, a voltage V2 on main bit line MBL can be expressed by the following equation:

$$V2 = Vr \cdot Ca/(Ca+Cb+Cc) \sim Vr/2$$

In this equation, the approximation is made based on the consideration that the values of parasitic capacitances of main bit line MBL and sub-source line SSL are equal to each other. Accordingly, by detecting voltages V1 and V2, it is possible to determine whether a memory cell in the over-low Vth state is present in the selected row or not.

According to the arrangement shown in FIG. 29, test voltage generating circuit 62 and determining circuit 63 are connected to main bit lines MBL1–MBLn through internal data line 61. Alternatively, such a structure may be employed that the test voltage generating circuit and the determining circuit are provided for each of main bit lines MBL1–MBLn, and these test voltage generating circuits and the determining circuits are selectively connected to the corresponding main bit lines. The voltage levels on main bit lines MBL1–MBLn can be accurately determined without an influence by the parasitic capacitance of internal data line.

Determining circuit 63 may be formed of a general comparing circuit. Test voltage generating circuit 62 may be formed by a circuit generating a voltage applied to a selected bit line in the read operation or may be formed of a constant voltage generating circuit including a diode or the like.

[Modification]

Figure 31:
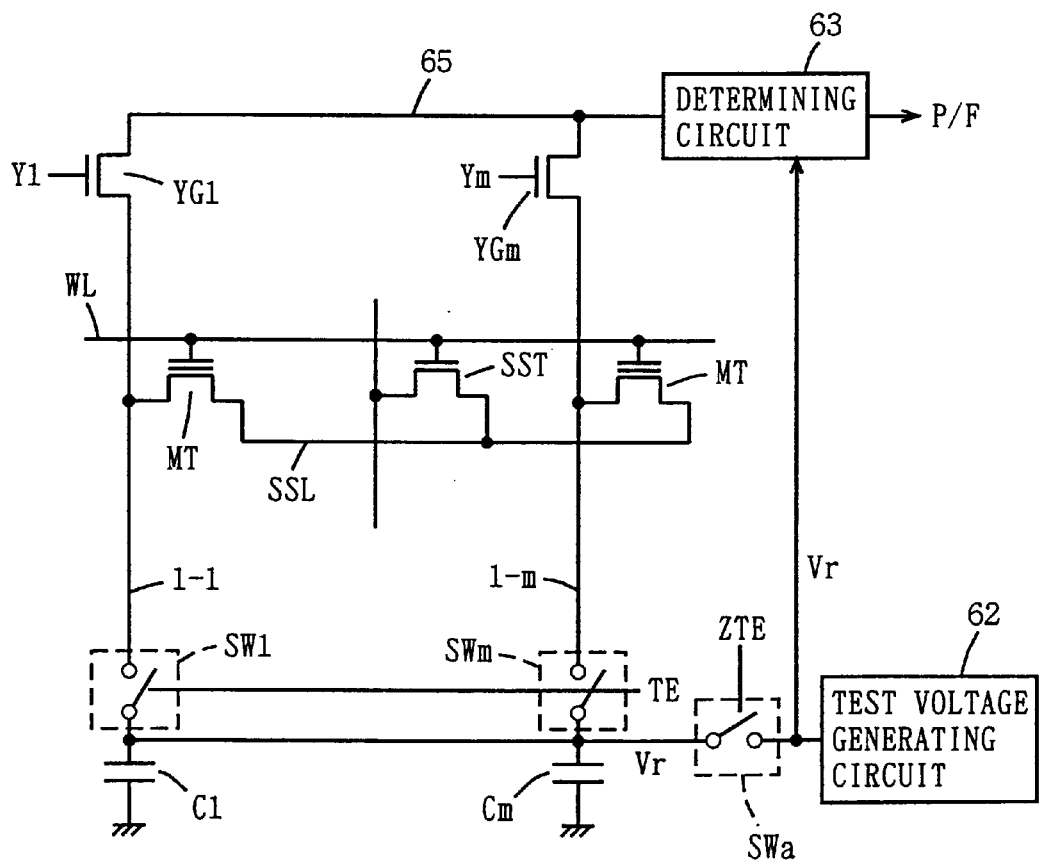
FIG. 31 schematically shows a structure of a modification of the embodiment 4 of the invention.

FIG. 31 shows a structure of a modification of the embodiment 4 of the invention. In FIG. 31, capacitance elements C1–Cm are provided corresponding to bit lines 1-1–1-m, respectively. Bit lines 1-1–1-m are connected to internal data line 65 through column select gates YG1–YGm which are turned on in response to column select signals Y1–Yn, respectively. Ends of bit lines 1-1–1-m remote from internal data line 65 are connected to capacitance elements C1–Cm through switching elements SW1–SWm, respectively, which in turn are made conductive in response to test mode instructing signal TE. Capacitance elements C1–Cm receive test voltage Vr from test voltage generating circuit 62 through a switching element SWa. Switching element SWa is turned on in response to a complementary test mode instructing signal ZTE. Internal data line 65 is provided with determining circuit 63 which makes a comparison between test voltage Vr generated by test voltage generating circuit 62 and the voltage on a selected bit line.

In the test mode, switching element SWa is first turned on, and switching elements SW1–SWm are turned off. In this state, capacitance elements C1–Cm are charged by test voltage Vr generated by test voltage generating circuit 62. When charging of capacitance elements C1–Cm is completed, switching elements SW1–SWm are then turned on, and switching element SWa is turned off so that charges accumulated in capacitance elements C1–Cm are transmitted to corresponding bit lines 1-1–1-m, respectively. Each of bit lines 1-1–1-m is connected to the memory cells. If a memory cell in the over-low Vth state (over-erased state) is present, charges transmitted onto the bit line are transmitted through the over-erased memory cell onto the corresponding sub-source line. Therefore, the voltage level on the bit line connected to the memory cell in the over-low Vth state lowers below the level of test voltage Vr, similarly to the arrangement shown in FIGS. 29 and 30. After a predetermined time elapses, column select signals Y1–Ym are successively driven to the selected state, and determining circuit 63 is connected successively to bit lines 1-1–1-m for performing the determination.

In the structure of the NOR type flash memory shown in FIG. 31, the capacitance elements are provided to the respective bit lines, and charges accumulated in these capacitance elements are utilized, whereby it is possible to determine easily whether an over-erased memory cell is present or not even in the structure with the source line select transistor. In the arrangement shown in FIG. 31, all the word lines are held in the unselected state during the test mode.

According to the embodiment 4 of the invention, as described above, the charges of the capacitance portion (i.e., capacitance element or main bit line) which is charged to the predetermined voltage level, are transmitted to a bit line or sub-bit line, and it is determined whether the voltage level on the bit line or main bit line lowers or not. Therefore, even in the structure including the source line select transistor, it is possible to determine whether the memory cell in the over-low Vth state is present or not.

[Embodiment 5]

Figure 32:
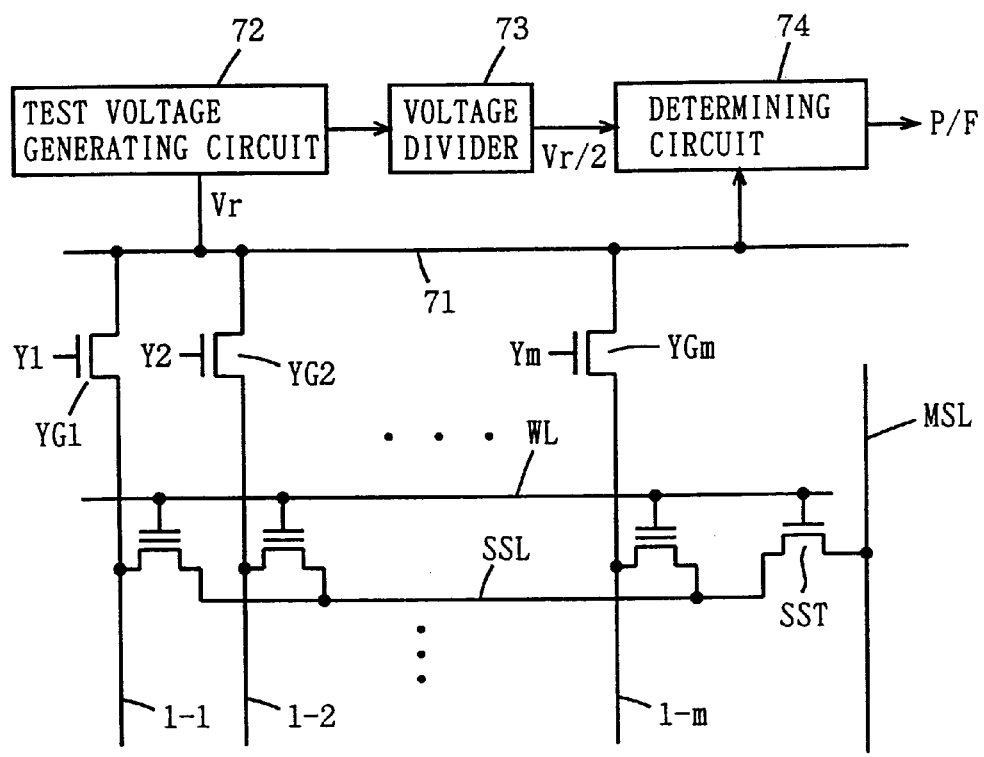
FIG. 32 schematically shows a structure of a main portion of the nonvolatile semiconductor memory device according to the embodiment 5 of the invention.

FIG. 32 shows a structure of a main portion of a nonvolatile semiconductor memory device of an embodiment 5 of the invention. FIG. 32 schematically shows a structure of an array and a peripheral portion of an NOR circuit. In FIG. 32, bit lines 1-1–1-m are connected to an internal data line 71 through column select gates YG1–YGm which are turned on in response to column select signals Y1–Ym, respectively. Internal data line 71 is provided with a test voltage generating circuit 72 which generates test voltage Vr in the test mode, and a determining circuit 74 which makes a comparison between the voltage on internal data line 71 and a voltage of Vr/2 supplied from a voltage dividing circuit 73. Test voltage generating circuit 72 is set to an output high impedance state when it is inactive. Voltage dividing circuit 73 divides test voltage Vr generated by test voltage generating circuit 72 by a dividing ratio of 2.

Figure 33:
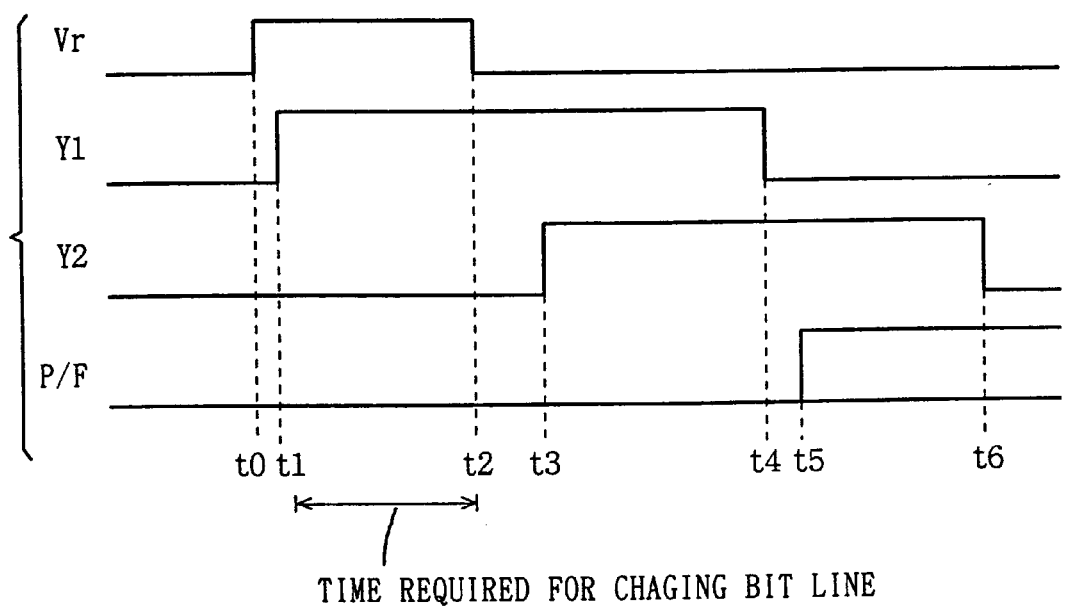
FIG. 33 is a signal waveform diagram representing an operation of the nonvolatile semiconductor memory device shown in FIG. 32.

FIG. 32 representatively shows bit lines 1-1–1-m and word line WL crossing the same as well as sub-source line SSL arranged corresponding to the word line WL. Sub-source line SSL is connected to main source line MSL through source line select transistor SST which is turned on in response to the signal voltage on word line WL. An operation of the nonvolatile semiconductor memory device shown in FIG. 32 will be described below with reference to a signal waveform diagram of FIG. 33. FIG. 33 shows signal waveforms in the operation of determining whether a memory cell in the over-low Vth state is present or not on bit lines 1-1 and 1-2.

At time t0, test voltage generating circuit 72 is activated to generate test voltage Vr at the predetermined voltage level and transmit the same onto internal data line 71.

At time t1, column select signal Y1 is driven to the selected state to turn on column select gate YG 1 so that test voltage Vr is transmitted onto bit line 1-1, and bit line 1-1 is charged to the level of test voltage Vr.

When a predetermined period required for charging bit line 1-1 elapses, test voltage generating circuit 72 is deactivated at time t2 and attains the output high impedance state. In this state, column select signal Y1 still maintains the active state.

Then, column select signal Y2 is activated at time t3 to turn on column select gate YG2 so that bit lines 1-1 and 1-2 are electrically connected together. In this state, charges accumulated in bit line 1-1 are transmitted to bit line 1-2. After elapsing of a period required for this movement of charges between bit lines 1-1 and 1-2, column select signal Y1 is driven to the unselected state at time t4, and column select gate YG1 is turned off.

While keeping column select gate YG2 on, determining circuit 74 is activated to compare the voltage level on data line 71 with the voltage of Vr/2 supplied from dividing circuit 73. At time t5, signal P/F representing the result of determination from determining circuit 74 is made definite. Upon completion of the determining operation, column select signal Y2 is driven to the unselected state at time t6, and the operation of determining whether a memory cell in the over-low Vth state (over-erased state) is present on bit line 1-2 or not.

For effecting the determining operation on bit line Y1, the sequence of activating column select signals Y1 and Y2 is inverted. Thus, column select signal Y2 is first kept active for a predetermined period, and then column select signal Y1 is kept active for a predetermined period. The determining operation of determining circuit 74 will now be described below.

(i) Both Bit Lines 1-1 and 1-2 are Normal.

Figure 34:
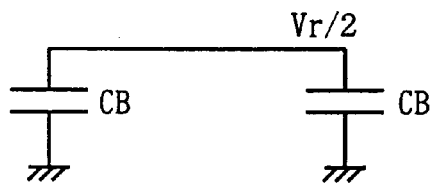
FIG. 34 depicts an operation of the nonvolatile semiconductor memory device shown in FIG. 32.

In this case, charges accumulated in bit line 1-1 are merely transmitted to bit line 1-2 when bit lines 1-1 and 1-2 are connected together. Therefore, charges are divided by bit line capacitance CB as shown in FIG. 34. Accordingly, the voltage level on each of bit lines 1-1 and 1-2 goes to Vr/2. When the charged voltage on bit line 1-2 is at the level of Vr/2, determining circuit 74 determines that a memory cell in the over-low Vth state is not present.

(ii) One of the Bit Lines is Defective.

Figure 35A:
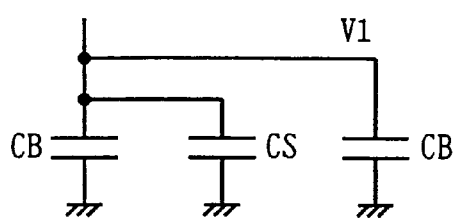
FIGS. 35A and 35B depict the operation of the nonvolatile semiconductor memory device shown in FIG. 32.
Figure 35B:
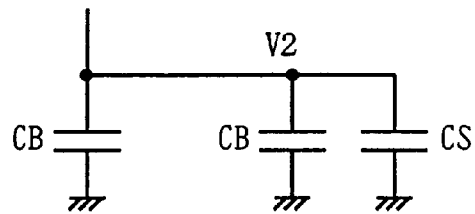
Figure 36:
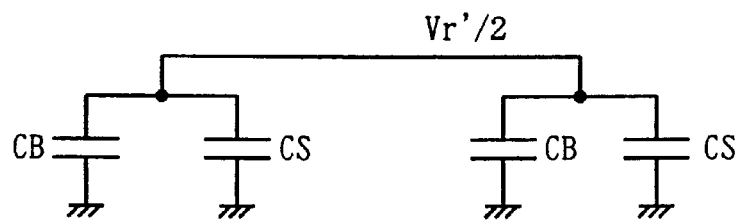
FIG. 36 depicts the operation of the nonvolatile semiconductor memory device shown in FIG. 32.

In the case where a memory cell in the over-low Vth state is connected to bit line 1-1, bit line capacitance CB and sub-source line capacitance CS are connected in parallel to bit line 1-1 as shown in FIG. 35A. This is because all the word lines are unselected, and all the source line select transistors are off. When bit line 1-2 is normal and is not connected to a memory cell in the over-low Vth state, only the capacitance CB of bit line 1-2 affects the bit line voltage. In this case, therefore, a charged voltage V1 on each of bit lines 1-1 and 1-2 is expressed by the following relation:

$$V1=Vr\cdot(CB+CS)/(2\cdot CB+CS)$$

Voltage V1 is at a higher level than the voltage of Vr/2 supplied from the voltage dividing circuit.

When the memory cell in the over-low Vth state is connected to bit line 1-2, charges accumulated in capacitance CB of bit line 1-1 are distributed to the parasitic capacitance CB+CS of bit line 1-2. In this state, therefore, charged voltage V2 is expressed by the following representation $$V2=Vr\cdot CB/(2\cdot CB+CS)$$

This voltage level is lower than the level of voltage of Vr/2 supplied from voltage dividing circuit 73. When the charged voltage on bit line 1-2 is different from charged voltage of Vr/2, determining circuit 74 determines that a memory cell in the over-low Vth state is connected to one of bit lines 1-1 and 1-2, and the bit line connected to the memory cell in the over-low Vth state is identified depending on which of V1 and V2 has the charged voltage different from Vr/2. Another method may be employed for the above identification, as will be described later.

(iii) Both Bit Lines 1-1 and 1-2 are Defective.

Upon charging of bit line 1-1, the memory cells commonly connected to the sub-source line may be in the over-low Vth state. In this case, this sub-source line is charged in charging of bit line 1-1. Therefore, this state is the same as that shown in FIG. 35A. Alternatively, if memory cells in the over-low Vth state are present in different rows, respectively, the sub-source line charged by bit line 1-1 is different from the sub-source line charged by bit line 1-2. In this case, the parasitic capacitance of each of bit lines 1-1 and 1-2 is formed of bit line capacitance CB and sub-source line capacitance CS, and the charged voltage is at the level of intermediate voltage of Vr/2. Since the capacitance CS of the sub-source line is sufficiently large even in this state, the abnormal state can be detected by setting the charging time of the bit line to a length required for charging a normal bit line. Thus, the charged voltages of the bit line and sub-source line are set to the level of voltage Vr' lower than the test voltage Vr by setting the charging time between times t2 and t1 in FIG. 33 to a length required for charging only the bit line. Therefore, the charged voltage level after connection of bit lines 1-2 and 1-1 goes to the level of Vr'/2 lower than the intermediate voltage level of Vr/2, and the voltage level can be determined accurately.

In the structure shown in FIG. 35A, if bit line capacitance CB and sub-source line capacitance CS are substantially equal to each other in charging of the bit line 1-1, charging voltage Vr' of bit line 1-1 substantially equals to Vr/2 in charging of bit line 1-1, and charged voltage V1 which appears when bit lines 1-1 and 1-2 are connected is lower than intermediate voltage of Vr/2 as represented inside the parentheses in FIG. 35A. In this case, therefore, it is possible to determine that either bit line 1-1 or 1-2 is defective. Thus, it is possible to identify a defective bit line by performing the tests using bit lines 1-1 and 1-2 as the charge supply sources, respectively.

In this case, determining circuit 74 is required only to determine whether the bit line charge voltage is higher or lower than the intermediate voltage of Vr/2 supplied from dividing circuit. Therefore, the circuit structure can be simplified.

Figure 37:
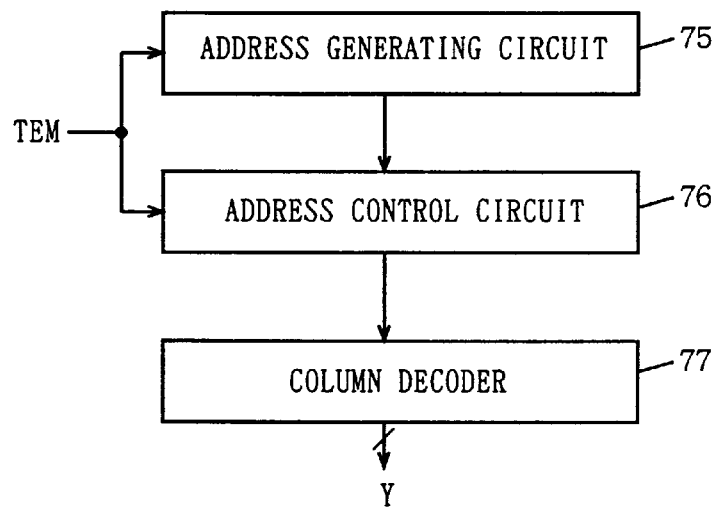
FIG. 37 schematically shows a structure of a column address generating portion of the nonvolatile semiconductor memory device shown in FIG. 32.

FIG. 37 schematically shows a structure of a portion of generating the column select signal in the embodiment 5 of the invention. In FIG. 37, the column select signal generating portion includes an address generating circuit 75 which is activated in response to a test mode instructing signal TEM, to generate a column address in a predetermined sequence, an address control circuit 76 which is activated in response to activation of test mode instructing signal TEM, to produce, at a predetermined timing, an address signal designating a corresponding column and the adjacent column based on the address received from address generating circuit 75 as to-be-charged bit line specifying address, and a column decoder 77 which statically performs decoding and produces a column select signal Y in accordance with the address signal from address control circuit 76.

Address generating circuit 75 and address control circuit 76 are activated in response to activation of test mode instructing signal TEM, and to apply the column address signal to column decoder 77 at predetermined timings. Column decoder 77 merely operates to statically decode the column address applied from address control circuit 76 to produce column select signal Y. Address generating circuit 75 and address control circuit 76 may be also utilized in the programming/erase modes. In the operation mode for performing usual data reading, column decoder 77 is supplied with a column address signal from a column address input buffer (not shown).

[Modification 1]

Figure 38:
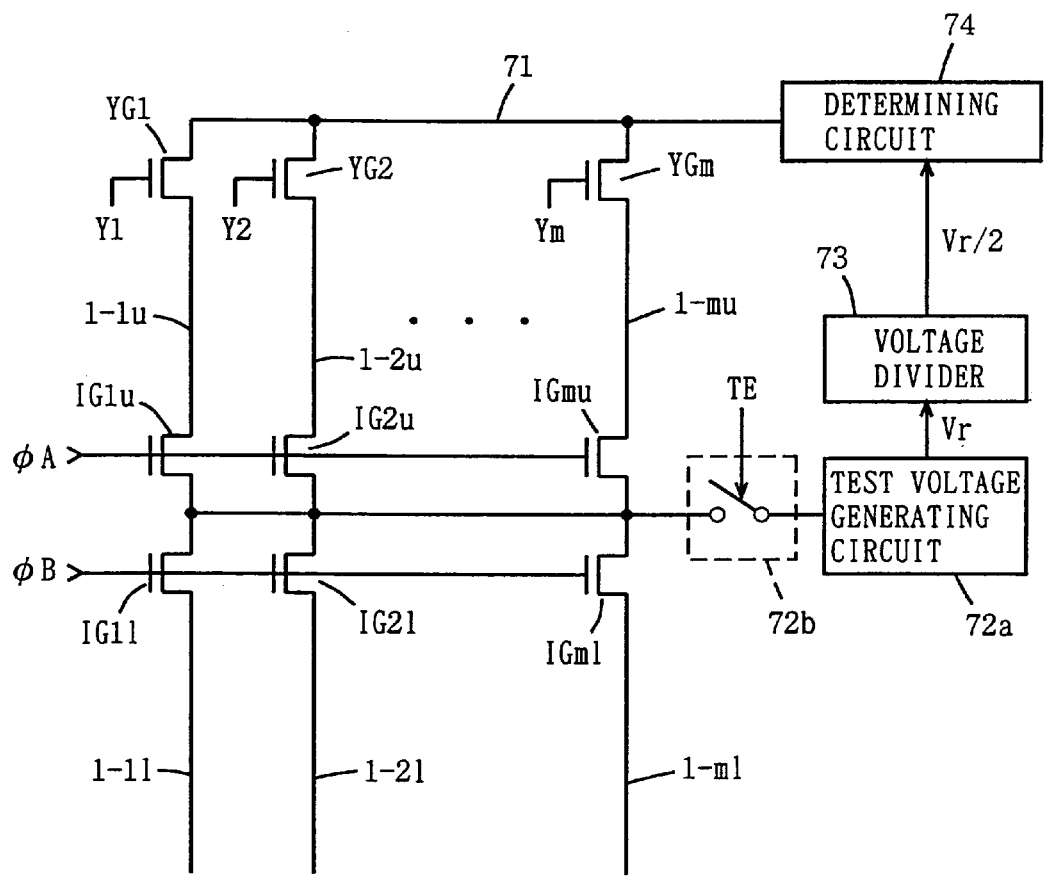
FIG. 38 schematically shows a structure of a modification of the embodiment 5 of the invention.

FIG. 38 schematically shows a structure of a modification 1 of the embodiment 5 of the invention. In the structure shown in FIG. 38, bit lines 1-1–1-m are divided into upper bit lines 1-1u–1-mu and lower bit lines 1-1l–1-ml by isolation gates IG1u–IGmu and IG1l–IGml. Test voltage Vr is transmitted to connection nodes between isolation gates IG1u–IGmu and corresponding isolation gates IG1l–IG1m from a test voltage generating circuit 72a through a switching element 72b. Test voltage Vr generated by test voltage generating circuit 72a is applied to determining circuit 73 through voltage dividing circuit 72.

In the structure shown in FIG. 38, switching element 72b is turned on in response to activation of test instruction signal TE, and to transmit test voltage Vr generated by test voltage generating circuit 72a to the respective connection nodes of the isolation gates. When the voltages on the connection nodes between isolation gates IG1u–IGmu and IG1l–IGml are stabilized, control signal φA is then activated under the control by a control circuit (not shown) so that isolation gates IG1u–IGmn are turned on, and upper bit lines 1-1u–1-mu are charged to the test voltage Vr. After this charging is performed for a predetermined period, bit test instructing signal TE is deactivated, and bit lines 1-1u–1-mu are set to the floating state. In this state, both control signals φA and φB are then activated so that upper bit lines 1-1u–1-1mu are electrically connected to corresponding lower bit lines 1-1l–1-ml, respectively, and charges are transmitted. After holding control signals φA and φB are made active for a predetermined period, both control signals φA and φB are deactivated.

Then, column select signals Y1–Ym are successively driven to the selected states, and determining circuit 73 determines the charged voltage levels on upper bit lines 1-1u–1-mu. The determining operation of determining circuit 73 is the same as the determining operation of determining circuit 73 already described. If a memory cell in the over-low Vth state is present on the upper or lower bit line, the charged voltage of this bit line is lower in level than intermediate voltage of Vr/2. Therefore, it is possible to determine whether a memory cell in the over-low Vth state is present on each bit line or not.

In the structure of the modification 1, the time for charging with test voltage Vr generated by test voltage generating circuit 72a is set to a predetermined value, and it is likewise possible to prevent the sub-source line from being charged to the level of test voltage Vr through a memory cell in the over-low Vth state. In the modes other than the test mode, both control signals φA and φB are active, and all isolation gates IG1u–IGmu and IG1l–Gml are held in the on state.

In the structure shown in FIG. 38, it is impossible to determine which of the upper and lower bit lines is connected to the memory cell in the over-low Vth state. However, it is possible to determine whether the memory cell in the over-low Vth state is present every bit line.

[Modification 2]

Figure 39:
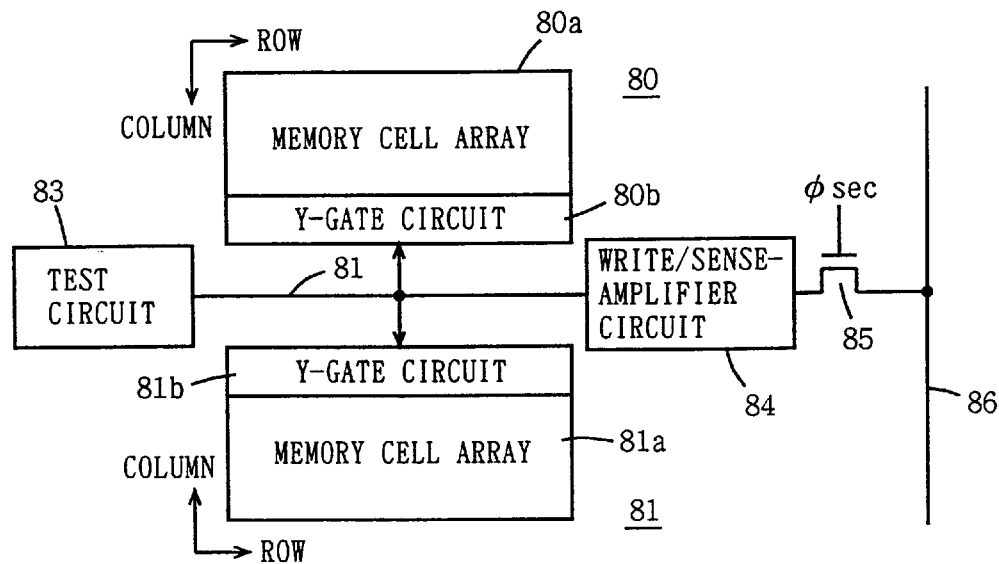
FIG. 39 schematically shows a structure of another modification of the embodiment 5 of the invention.

FIG. 39 schematically shows a structure of a modification 2 of the embodiment 5 of the invention. In the structure shown in FIG. 39, sectors 80 and 81 commonly use a local data bus 82. Sector 80 includes a memory cell array 80a having memory cells arranged in rows and columns, and a Y-gate circuit 80*b* for selecting the column in memory cell array 80*a* in accordance with a column select signal from a column decoder (not shown). Sector 81 includes a memory cell array 81*a* having memory cells arranged in rows and columns, and a Y-gate circuit 81*b* for connecting a selected column in memory cell array 81*a* to local data bus 82 in accordance with the column select signal from a column decoder (not shown). Local data bus 82 is provided with a write/sense amplifier circuit 84 for reading/writing data, and is also provided with a test circuit 83. Test circuit 83 includes the test voltage generating circuit, dividing circuit and determining circuit already described with reference to FIGS. 32 and 38.

Write and sense amplifier circuit 84 is connected to a global data bus 86 through a sector select gate 85. The sector select gate 85 receives on its gate a sector select signal φsec.

In the structure shown in FIG. 39, the Y-gates included in Y-gate circuits 80*b* and 81*b* are selectively connected to local data bus 82. Thereby, bit lines in one of the sectors are charged to the level of the test voltage supplied by test circuit 83. Also, the bit lines in the two sectors are connected, and the levels of the charged voltages of the bit lines in the other sector are determined. This operation of determining the voltage level is performed by test circuit 83 in the same manner as that already described with reference to FIG. 32. This structure utilizes neither the charged voltages on the adjacent columns in the same memory cell array nor the charged voltage on the same bit line, but utilizes the charged voltage on the bit line in the memory cell array included in the adjacent sector. In this case, since each bit line likewise has the same capacitance value, the charged voltage on the normal bit line attains the level of intermediate voltage of Vr/2 so that the determining operation can be performed in a similar manner.

According to the embodiment 5 of the invention, as described above, the charged voltage on a bit line is utilized for determining whether the corresponding bit line is charged to the predetermined voltage level or not, and presence or absence of a memory cell in the over-low Vth state (over-erased state) is determined in accordance with the result of this determination. Therefore, presence or absence of a memory cell in the over-low Vth state can be easily determined by a simple circuit structure.

[Embodiment 6]

Figure 40:
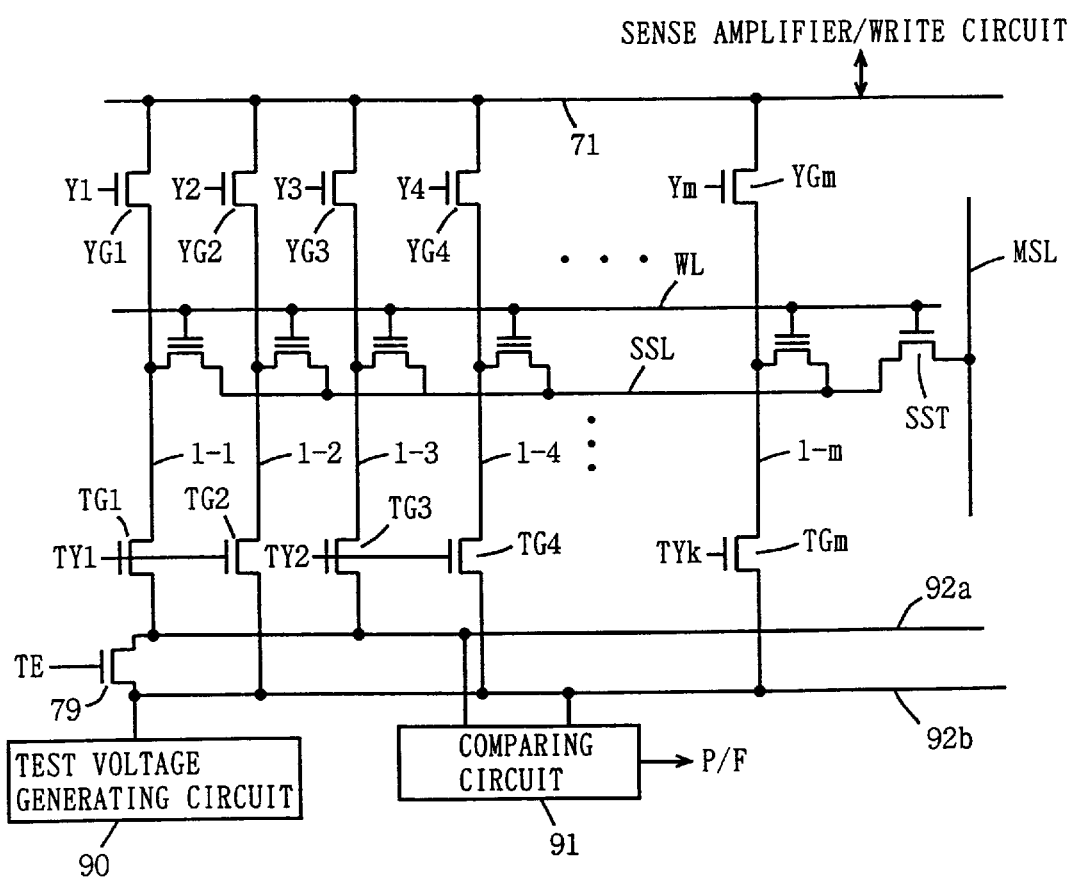
FIG. 40 schematically shows a structure of a main portion of the nonvolatile semiconductor memory device according to the embodiment 6 of the invention.

FIG. 40 shows a structure of a main portion of a nonvolatile semiconductor memory device according to an embodiment 6 of the invention. In FIG. 40, test signal lines 92*a* and 92*b* are provided independently of internal data line 71. Bit lines 1-1–1-m are connected to test signal lines 92*a* and 92*b* through test column select gates TG1–TGm which are turned on in response to test column select signals TY1–TYk, respectively. Each of test column select signals TY1–TYk is generated commonly for two bit lines, and the two bit lines are simultaneously selected and connected to test signal lines 92*a* and 92*b*, respectively.

For test signal lines 92*a* and 92*b*, there are arranged a transfer gate 79 which is turned on in accordance with activation of test mode instructing signal TE, to transfer the test voltage from test voltage generating circuit 90 onto test signal lines 92*a* and 92*b*, and a comparing circuit 91 which makes a comparison between signal voltages on test signal lines 92*a* and 92*b*. Other structures are the same as those shown in FIG. 32, and the corresponding portions bear the same reference numerals.

Figure 41:
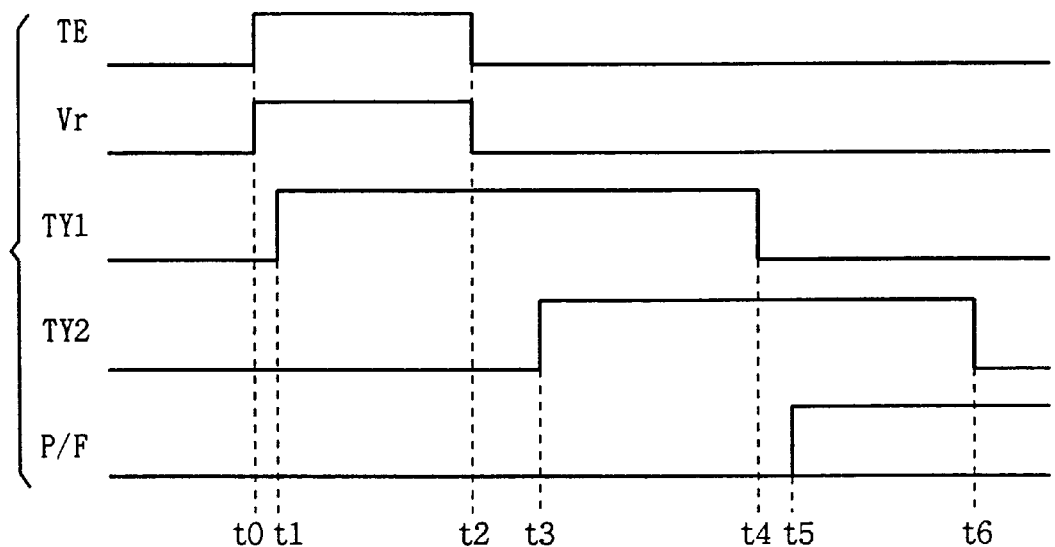
FIG. 41 is a signal waveform diagram representing an operation of the nonvolatile semiconductor memory device shown in FIG. 40.

The structure shown in FIG. 40 does not use column select signals Y1–Ym used in the normal operation mode. Charging of the bit lines and determination of levels of the charged voltages are performed through signal lines 92*a* and 92*b* dedicated to the test. An operation of the nonvolatile semiconductor memory device shown in FIG. 40 will be described below with reference to a signal waveform diagram of FIG. 41.

At time t0, test voltage generating circuit 90 is activated and released from the output high impedance state, and produces test voltage Vr. When test mode instructing signal TE is activated at an appropriate time, the transfer gate is turned on, and test signal lines 92*a* and 92*b* are supplied with test voltages Vr at the same level.

At time t1, test column select signal TY1 is driven to the selected state so that test column select gates TG1 and TG2 are turned on, and bit lines 1-1 and 1-2 are connected to test signal lines 92*a* and 92*b*, respectively. In this manner, bit lines 1-1 and 1-2 are charged to test voltage Vr level.

After a predetermined time elapses, test voltage generating circuit 90 is deactivated at time t2 and attains the output high impedance state, and transfer gate 97 is turned off in response to deactivation of test mode instructing signal TE. Thereby, the operation of charging bit lines TY1 and TY2 is completed.

In this state, test column select signal TY2 is driven to the selected state at time t3, and bit lines 1-1 and 1-2 are electrically connected to bit lines 1-3 and 1-4, respectively, so that charges move between these lines.

At time t4, test column select signal TY1 is driven to the unselected state to turn off test column select gates TG1 and TG2. During this period, test column select signal TY2 is active, and test column select gates TG3 and TG4 are on. Bit lines 1-3 and 1-4 are connected to test signal lines 92*a* and 92*b*, and voltage levels on test signal lines 92*a* and 92*b* attain the voltage levels corresponding to the charged voltage levels on bit lines 1-3 and 1-4, respectively.

After the voltage levels on test signal lines 92*a* and 92*b* become stable, comparing circuit 91 is activated at time t4 to perform a comparison between the voltage levels on signal lines 92*a* and 92*b*, and drives output signal P/F based on the result of this comparison.

When all bit lines 1-1–1-4 are normal and no memory cell in the over-low Vth state is present, bit lines 1-3 and 1-4 are precharged to the level of intermediate voltage of Vr/2. Comparing circuit 91 determines that the bit lines are normal when the voltage levels on bit lines 1-3 and 1-4 are equal.

When bit lines 1-1 and 1-2 are normal, and one of bit lines 1-3 and 1-4 is abnormal (i.e., a memory cell in the over-low Vth state is connected thereto), a difference in voltage level appears between bit lines 1-3 and 1-4. Comparing circuit 91 detects this difference, whereby the bit line 1-3 or 1-4 actually connected to the memory cell in the over-low Vth state is identified.

In the arrangement shown in FIG. 40, if both the paired bit liens are defective and are connected to the memory cells in the over-low Vth state, comparing circuit 91 generates a signal representing that the voltage levels are equal.

As shown in FIG. 40, the test voltage generating circuit and the comparing circuit are provided independently of the data bus for comparing the levels of charged voltages on the paired bit lines, whereby presence of the memory cell in the over-low Vth state can be detected without difficulty.

The arrangement for generating test column select signals TY1–TYk can be easily achieved by setting the least column address bit to the degenerated state in the structure shown in FIG. 37. In the structure of reading multi-bit data by simultaneously selecting a plurality of memory cells from the memory cells in one row, the internal data bus lines may be used as the test signal lines.

[Modification]

Figure 42:
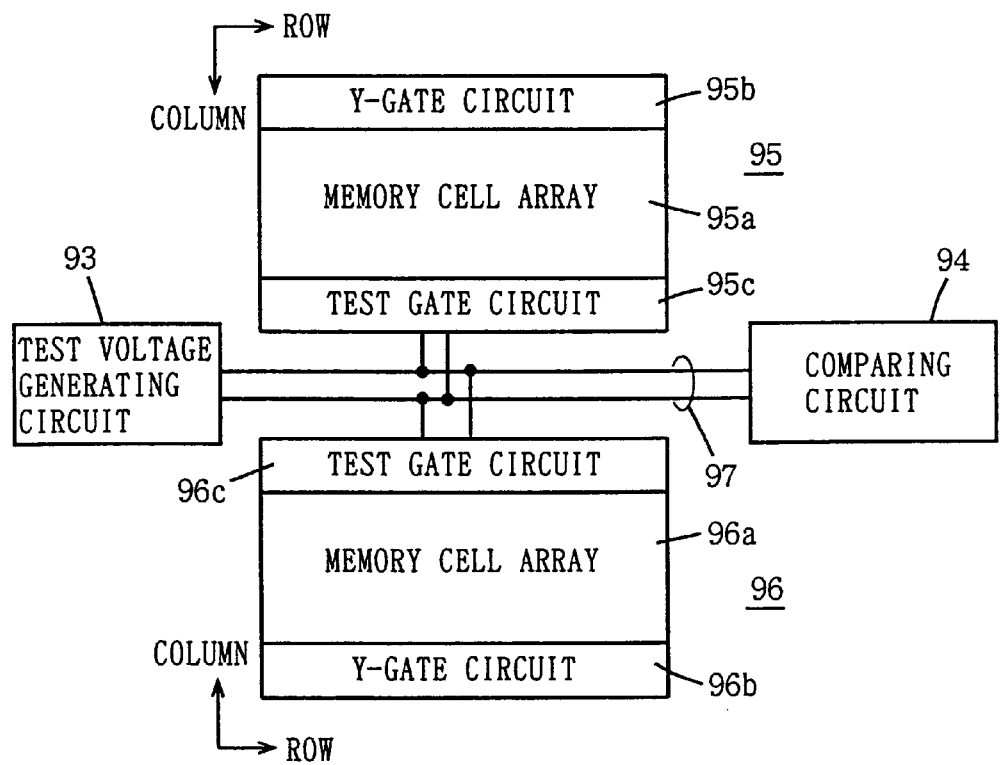
FIG. 42 schematically shows a structure of a modification of the embodiment 6 of the invention.

FIG. 42 schematically shows a structure of a modification of an embodiment 6 of the invention. FIG. 42 shows a structure of a main portion of two sections 95 and 96. Section 95 includes a memory cell array 95a having a plurality of memory cells arranged in rows and columns, a Y-gate circuit 95b for selecting an addressed column in memory cell array 95a, and a test gate circuit 95c for simultaneously selecting two columns in memory cell array 95a to connect them to test signal bus 97 in the test mode. Test gate circuit 95c is equivalent to test column select gates TG1–TGm shown in FIG. 40.

Section 96 includes a memory cell array 96a having a plurality of memory cells arranged in rows and columns, a Y-gate circuit 96b for selecting an addressed column, and a test gate circuit 96c for simultaneously selecting two columns to connect them to test signal bus 97 in the test mode. Test data bus 97 is provided with a test voltage generating circuit 93 which generates a voltage at a predetermined voltage level in the test mode, and a comparing circuit 94 which compares the signal voltages on test signal bus 97. Test signal bus 97 has signal lines of 2 bits to be electrically connected to the bit lines in two columns selected by test gate circuits 95c and 96c, respectively.

In the structure shown in FIG. 42, test voltage generating circuit 93 charges the two bit lines in one of memory cell arrays 95a and 96a with the test voltage. After this charging, mutual connection of the two bit lines between memory cell arrays 95a and 96a is performed. Subsequently, the signal voltages on the two bit lines in the other memory cell array are transmitted onto test signal bus 97, and are compared by comparing circuit 94.

As shown in FIG. 42, both memory cell arrays 95a and 96a are charged. Even in this structure, a similar effect can be achieved.

According to the embodiment 6 of the invention, the charging and the detection of the charged voltage levels are performed on a basis of two bit lines at a time. Therefore, the test time is reduced, and accurate determination can be performed.

[Embodiment 7]

Figure 43:
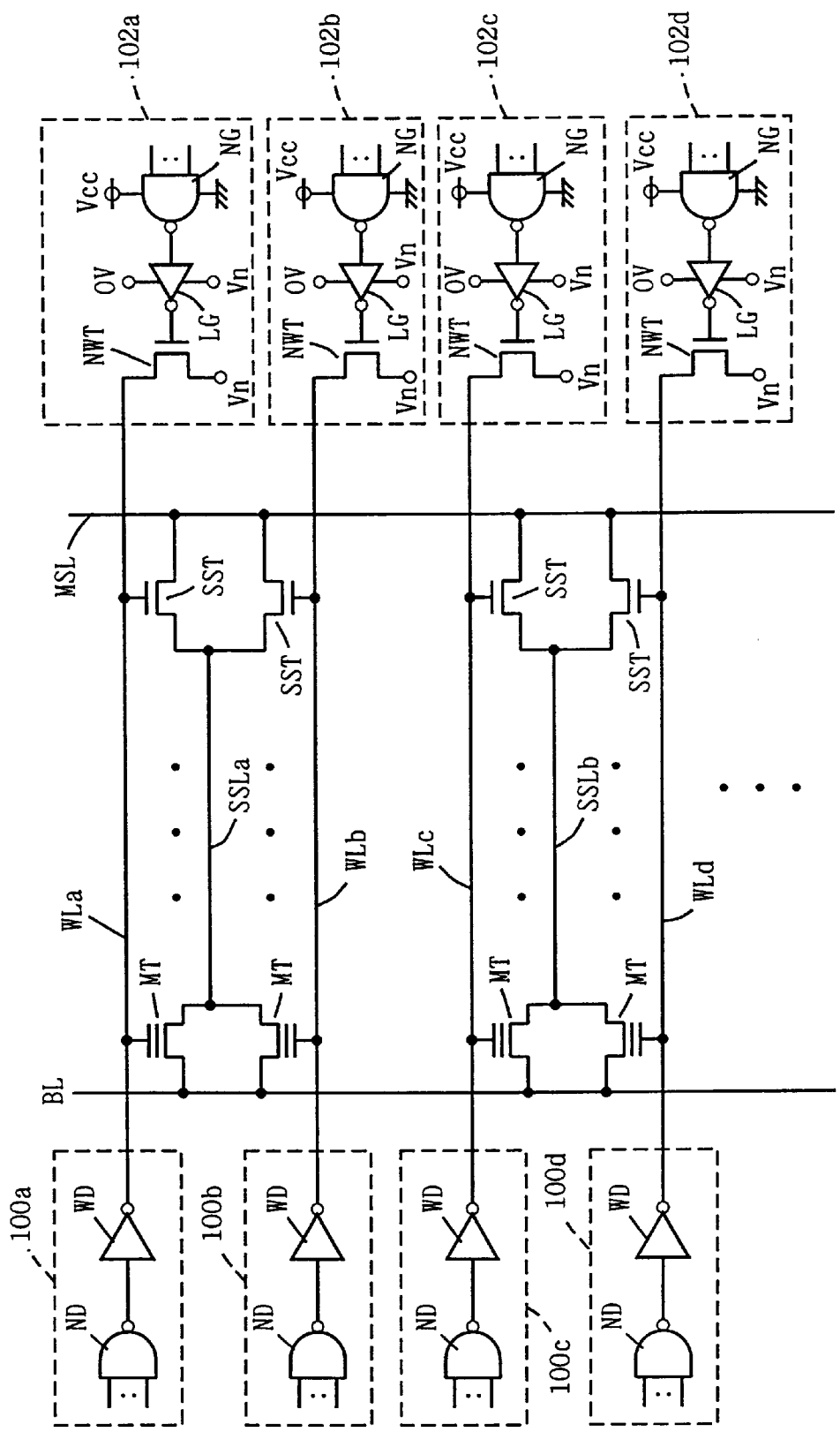
FIG. 43 schematically shows a structure of a main portion of the nonvolatile semiconductor memory device according to the embodiment 7 of the invention.

FIG. 43 schematically shows a structure of a main portion of a nonvolatile semiconductor memory device according to an embodiment 7 of the invention. FIG. 43 shows a structure of a portion related to four word lines WLa–WLd. Word lines WLa and WLb share a sub-source line SSLa, and word lines WLc and WLd share source line SSLb. Memory cells MT and source line select transistors SST are provided corresponding to word lines WLa–WLd and sub-source lines SSLa–SSLb. Each source line select transistor SST transmits the ground voltage on main source line MSL to the corresponding sub-source line when the corresponding word line is driven to the selected state.

For word lines WLa–WLd, there are provided word line select circuits 100a–100d for decoding the applied address signal to drive the corresponding word lines to the selected state, respectively. Each of word line select circuits 100a–100d includes a NAND decode circuit ND for decoding the applied address signal, and a word line drive circuit WD for inverting the output signal of NAND decode circuit ND, to drive the corresponding word line to the selected state. NAND decode circuit ND and word line drive circuit WD uses power supply voltage Vcc of 3.3 V and the ground voltage as its operation power supply voltages.

On the other sides of word lines WLa–WLd, there are arranged negative voltage drive circuits 102a–102d which can drive the word lines paired with a selected word line to a negative voltage level, respectively. Each of word line negative voltage drive circuits 102a–102d includes an NAND decode circuit NG for decoding an applied address signal, an inverter circuit LG with a level converting function for inverting an output signal of NAND decode circuit NG, and an n-channel MOS transistor NWT for transmitting a negative voltage Vn onto a corresponding word line in accordance with the output signal of level converting inverter circuit LG.

NAND decode circuit NG operates using power supply voltage Vcc and the ground voltage as its operation power supply voltages. Level converting inverter circuit LG operates using the ground voltage of 0 V and negative voltage Vn as its operation power supply voltages, and converts the amplitude of the output signal of NAND decode circuit NG into an amplitude between 0 V and negative voltage Vn.

In word line select circuits 100a–100d and word line negative voltage drive circuits 102a–102d, the lowest bits of the row address signal applied to paired word lines are exchanged. More specifically, when word line WLa is selected by word line select circuit 100a and is driven to power supply voltage Vcc level, word line negative voltage drive circuit 102b is selected to transmit negative voltage Vn onto word line WLb. Unselected word lines WLc and WLd are held at the ground voltage level because output signals of word line select circuits 100c and 100d are at the ground voltage level, and the word line negative voltage drive circuits 102c and 102d attain the output high impedance state.

More specifically, when the output signal of NAND decode circuit ND of word line select circuit 100a attains L-level representing the selected state, the output signal of corresponding word line drive circuit WD attains H-level. At this time, the output signal of NAND decode circuit ND in word line select circuit 100b is at H-level, and the output signal of corresponding word line drive circuit WD is at L-level. In word line negative voltage drive circuit 102a, the lowest bit of the address signal applied to NAND decode circuit NG is different, and the output signal of NAND decode circuit NG attains H-level representing the unselected state so that the output signal of corresponding level converting inverter circuit LG attains the level of negative voltage Vn, i.e., L-level, and MOS transistor NWT is turned off. In word line negative voltage drive circuit 102b, the output signal of NAND decode circuit NG attains L-level, and the output signal of corresponding level converting inverter circuit LG attains the ground voltage level or H-level so that MOS transistor NWT is turned on, and negative voltage Vn is transmitted onto word line WLb.

In the structure shown in FIG. 43, when word line WLa is selected, word line WLb is driven to the level of negative voltage Vn. Even if memory cell MT connected to word line WLb is in the over-low Vth state, threshold voltage Vth thereof is higher than the level of negative voltage Vn transmitted onto word line WLb, and the leak current is reliably suppressed. Therefore, only the current caused by memory cell MT connected to word line WLa flows on bit line BL, and data reading can be performed accurately.

In the nonvolatile memory, threshold voltage Vth of the memory cell in the over-low Vth state is usually near the ground voltage (0 V) in many cases, and the probability that threshold voltage Vth equals to a deeper negative voltage is extremely low. Therefore, if the voltage level is equal to the level of voltage of –VWL (about –3.3 V) opposite in sign to voltage VWL transmitted onto selected word line WLa, the leak current of the memory cell in the over-low Vth state can be reliably suppressed.

Memory cells are usually manufactured to have such memory cell characteristics that the threshold voltages of memory cells in the low threshold voltage state are distributed within a range between the ground voltage (0 V) and voltage VWL transmitted onto a selected word line. If threshold voltage Vth is to be lowered, a Fowler-Nordheim tunneling current is utilized regardless of the type (i.e., the NOR type or DINOR type) of the flash memory. The Fowler-Nordheim tunneling current exponentially decreases with lowering of threshold voltage Vth by 1 V. When threshold voltage Vth lowers and the memory cell attains the over-low Vth state, the Fowler-Nordheim tunneling current extremely decreases so that lowering of threshold voltage Vth is suppressed.

Figure 44:
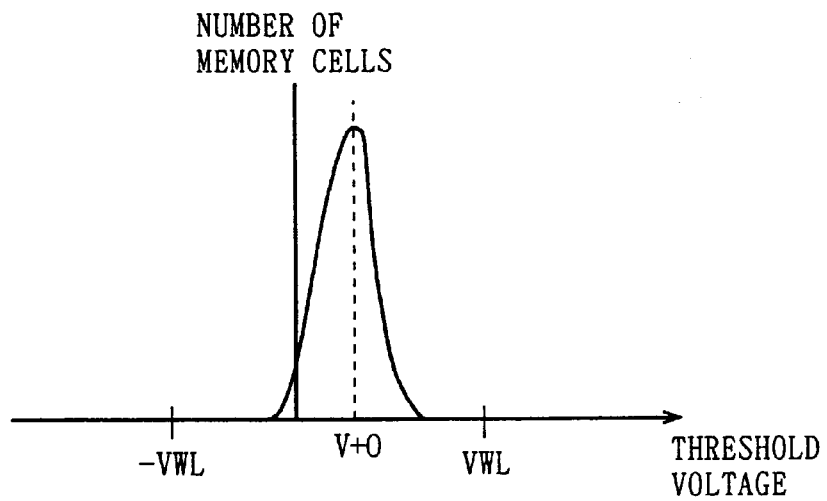
FIG. 44 schematically shows a distribution of the threshold voltages of the memory cells.

As shown in FIG. 44, the memory cells in the low threshold voltage state are present in an extremely narrow range with threshold voltage Vt0 being a center, and the memory cells having negative threshold voltages are extremely small in number. Therefore, by transmitting negative voltage −VWL onto the word line paired with a selected word line (i.e., the word line sharing the same sub-source line as a selected word line), the allowable distribution range of the threshold voltages of memory cells is between VWL and −VWL, and can be much wider than the actual distribution range of the threshold voltages so that the probability that a memory cell has a threshold voltage Vth lower than negative voltage of −Vth can be deemed to be substantially zero. Accordingly, the leak current of the memory cell in this over-low Vth state can be suppressed.

In the structure shown in FIG. 43, when the negative voltage is transmitted onto a word line, the corresponding word line select circuit transmits the voltage at the ground voltage level. In this case, word line drive circuit WD may be configured into a structure that a p-channel MOS transistor receiving on its gate a signal on a paired word line is interposed between the ground node and the word line, and thereby the word line drive circuit provided for the word line paired with a selected word line is set to the output high impedance state. Thereby, the current consumption during transmission of this negative voltage can be reliably suppressed, and an unselected word line can be reliably driven to the negative voltage VN level.

According to the embodiment 7 of the invention, as described above, the negative voltage is transmitted onto an unselected word line paired with a selected word line. Therefore, a memory cell in the over-low Vth state sharing a sub-source line can be turned off, and the data can be precisely read from a selected main memory cell.

[Embodiment 8]

Figure 45:
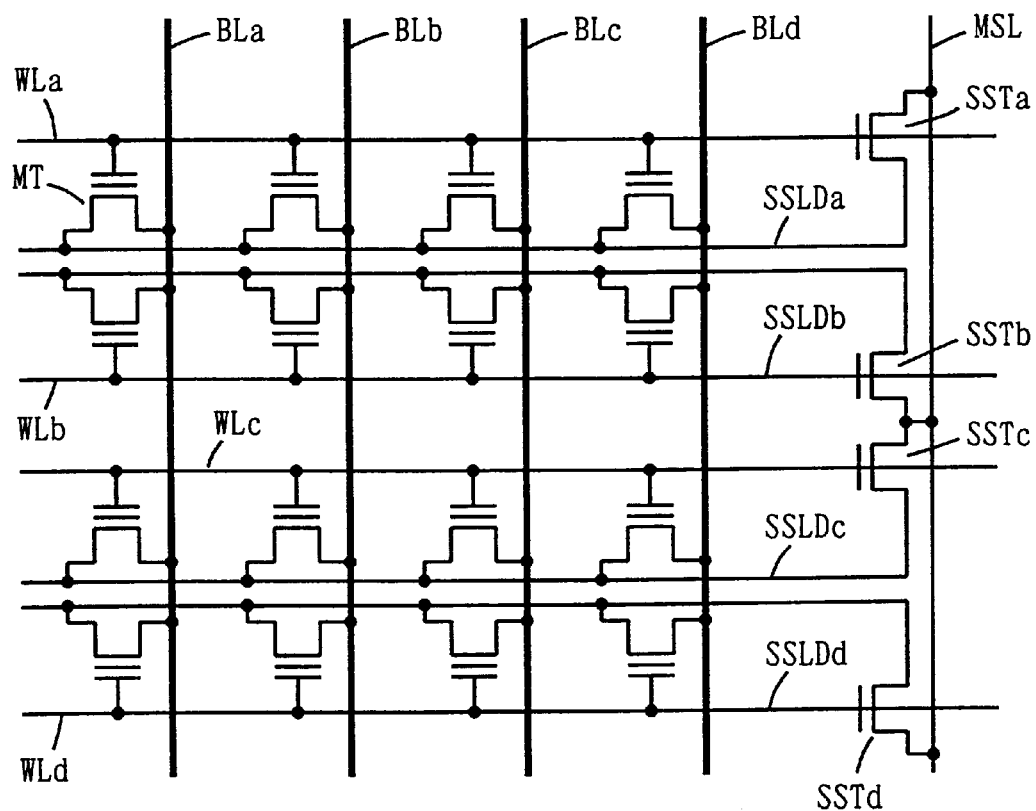
FIG. 45 schematically shows a structure of a main portion of the nonvolatile semiconductor memory device according to the embodiment 8 of the invention.

FIG. 45 shows a structure of a main portion of a nonvolatile semiconductor memory device according to an embodiment 8 of the invention. FIG. 45 shows memory cells MT arranged in four rows and four columns. In the structure shown in FIG. 45, sub-source lines SSLDa–SSDLd are provided corresponding to word lines WLa–WLd. These sub-source lines SSLDa–SSLDd are connected to main source line MSL through corresponding source line select transistors SSTa–SSTb, respectively.

According to the arrangement shown in FIG. 45, only a sub-source line corresponding to the selected row is connected to main source line MSL. A sub-source line corresponding to the unselected word line is isolated from main source line MSL. When a word line is selected, the current flows from a bit line to the main source line only through the path including the memory cell connected to the selected word line and the corresponding sub-source line. The sources (i.e., nodes connected to the sub-source lines) of the memory cells connected to the other unselected word lines are made open, and the current paths thereof are cut off. When reading a memory cell data, the data of a selected memory cell can be precisely read out without an influence by other memory cells in the over-low Vth state.

Now, description will be given on methods of providing the sub-source lines corresponding to the respective word lines.

Manufacturing Method 1

Figure 46A:
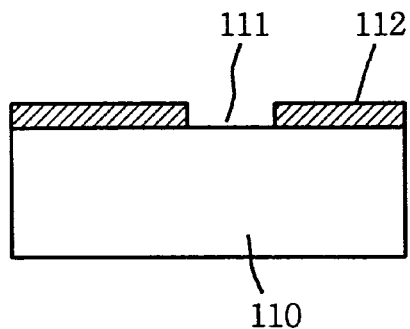
FIGS. 46A to 46C represents steps of manufacturing a sub-source line shown in FIG. 45.
Figure 46B:
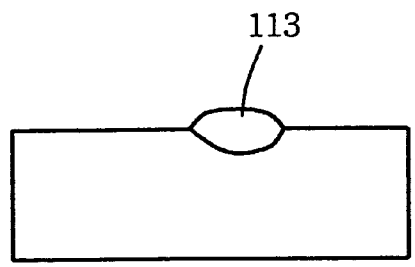
Figure 46C:
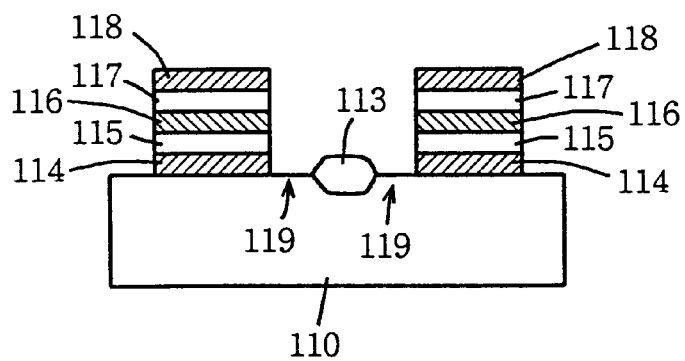

Referring to FIGS. 46A–46C, a first method of manufacturing the sub-source lines will now be described.

As shown in FIG. 46A, a nitride film 112 is formed on a semiconductor substrate 110 except a sub-source line isolating region 111. Using nitride film 112 as a mask, thermal oxidation is effected to form a thermal oxide film (LOCOS film) 113 as shown in FIG. 46B.

As shown in FIG. 46C, a gate insulating film 114, a conductive layer to be a floating gate, and an interlayer isolating and insulating film 116 are then successively formed. Interlayer insulating film 116 isolates the floating gate from a word line (control electrode) to be formed at an upper layer.

A conductive layer 117 to be a word line (control electrode) is formed on interlayer insulating and isolating film 116, and an interlayer insulating film 118 is formed thereon. Then, patterning is performed. Through a series of these steps, the gate structures of the memory cells are formed. Using these gate structures as a mask, ion implantation is then performed to form drain regions, source regions and sub-source lines. Owing to formation of thermal oxide film 113, the sub-source lines formed at regions 119 are isolated from each other. In this manner, the sub-source line can be provided for each word line.

Manufacturing Method 2

Figure 47:
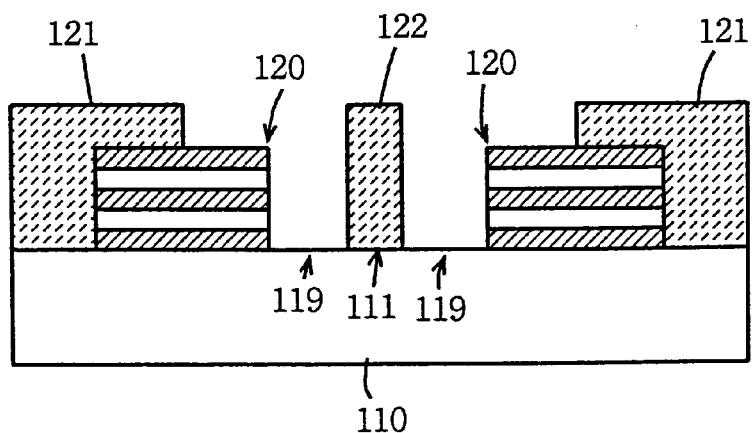
FIG. 47 schematically represents a step in a second method of manufacturing the sub-source line shown in FIG. 45.

FIG. 47 shows a main step in a second method of manufacturing the sub-source lines in the embodiment 8 of the invention. As shown in FIG. 47, gate structures 120 are formed on the surface of semiconductor substrate 110. The gate structure 120 is similar to that shown in FIG. 46C, and has a gate insulating film, a conductive film to be a floating gate on the gate insulating film, a conductive layer formed on the floating gate with an interlayer isolating and insulating film thereunder to be a word line, and an interlayer insulating film formed on the word line conductive layer. After forming gate structures 120, a mask 121 formed of a resist film is formed over the drain regions of the memory cells for implanting ions into the source regions. At the same time, a mask 122 formed of a resist film is formed over sub-source line isolating region 111 at the surface of semiconductor substrate 1 10. With these masks 121 and 122, the ion implantation is performed to from the memory cell source regions and the sub-source lines. Ions are not implanted into the surface portion of semiconductor substrate 110 immediately under mask 122. Therefore, sub-source line isolating region 111 has the same impurity concentration as the channel region immediately under gate structure 120 of a memory cell. Since a gate electrode or the like is not formed on sub-source line isolating region 111, isolating region 111 is always in a high resistance state. In particular, substantially no potential difference occurs between source/sub-source line regions 119 (in either of the open state and the state that the ground voltage is transmitted). Therefore, sub-source line isolating region 111 can satisfactorily function as a region for electrically isolating the source/sub-source line regions 119.

Manufacturing Method 3

Figure 48A:
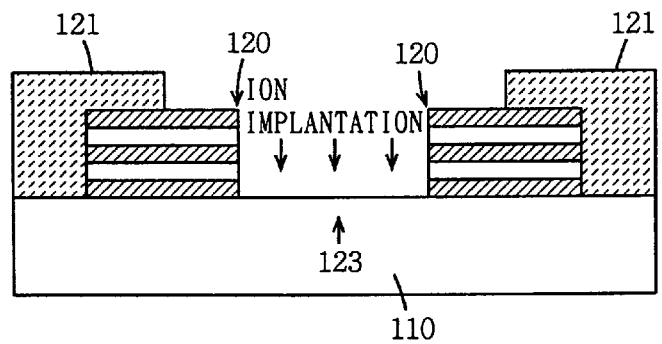
FIGS. 48A and 48B schematically represent steps in a third method of manufacturing the sub-source line shown in FIG. 45.
Figure 48B:
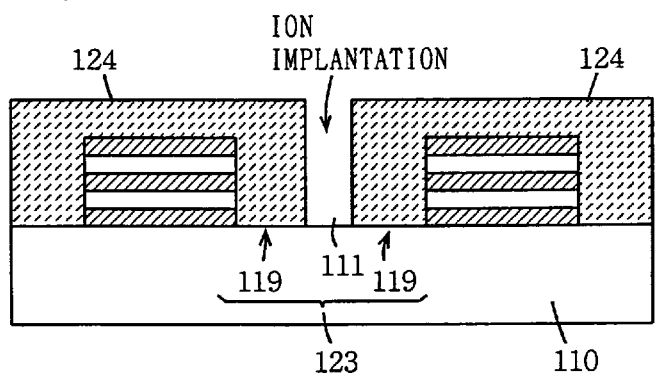

FIGS. 48A and 48B show steps in a third method of the structure of embodiment 8 of the invention. As shown in FIG. 48A, gate structures 120 are formed on the surface of semiconductor substrate 110, and a source implantation mask 121 made of, e.g., a resist film is formed over drain regions of the memory cells for implanting ions into the source region. Using mask 121 and gate structures 120 as a mask, N-type impurity such as phosphorus or arsenic is implanted. Thereby, an impurity region is formed at a region 123 of semiconductor substrate 110 between gate structures 120, and thereby the source region of each memory cell and the sub-source line are formed.

Then, as shown in FIG. 48B, a mask 124 made of, e.g., a resist film is formed over the source regions of memory cells and the sub-source lines in region 123. In this state, only the surface of isolating region 111 of semiconductor substrate 110 is exposed. Ions of P-type impurity such as boron opposite in a conductivity type to the N-type impurity already implanted into entire region 123, are implanted with mask 124. The dopant of the opposite conductivity type implanted into isolating region 111 cancels the N-type impurity region already implanted into isolating region 111 in the step shown in FIG. 48A so that isolating region 111 equivalently forms a lightly doped high resistance region. As a result, isolating region 111 functions as the isolating region between source/sub-source line regions 119.

Manufacturing Method 4

Figure 49A:
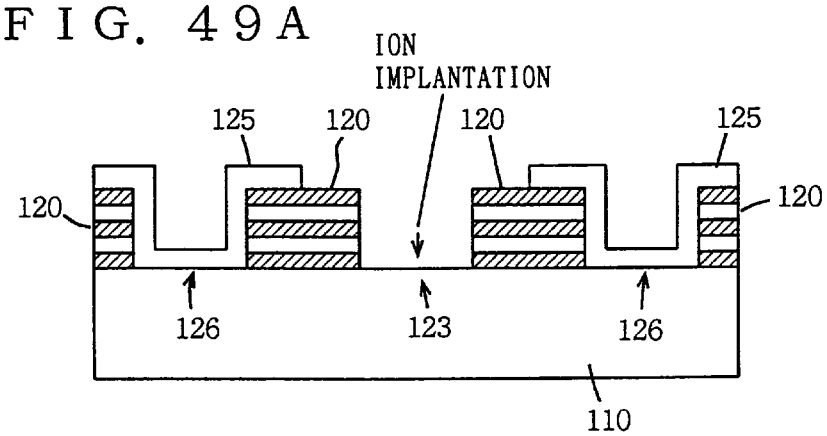
FIGS. 49A and 49B schematically represent steps in a fourth method of manufacturing the sub-source line shown in FIG. 45.

FIGS. 49A through 50B show steps in a fourth method of manufacturing the sub-source line isolating structure in the embodiment 8 of the invention. As shown in FIG. 49A, gate electrode structures 120 each having a predetermined configuration are formed on the surface of semiconductor substrate 110. An oxidation-resistant film 125 such as a nitride film with a sufficient resistance against thermal oxidation is formed over each memory cell drain region 126 and a portion of each gate structure 120 except source/sub-source line region 123. This oxidation-resistant film 125 also covers transistor formation regions of peripheral circuit in a similar manner.

P-type dopant such as boron for source isolation is implanted into region 123 using oxidation-resistant films 125 and gate structures 120 as a mask.

Figure 49B:
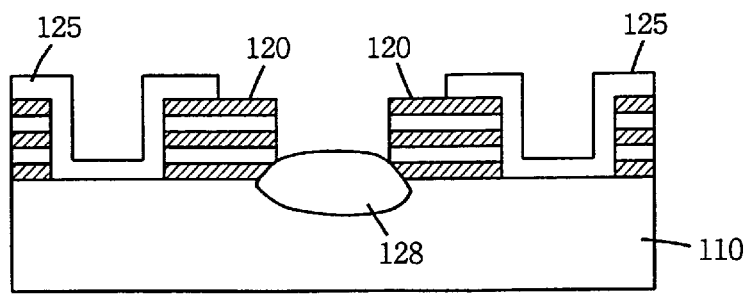

Then, as shown in FIG. 49B, thermal oxidation using oxidation-resistant film 125 as a mask is performed to form a thermal oxide film 128 at region 123. Thermal oxide film 128 functions as a mask against ion implantation to be performed in a later step of forming the source region and sub-source line, and therefore may have a thickness smaller than 100 nm.

Figure 50A:
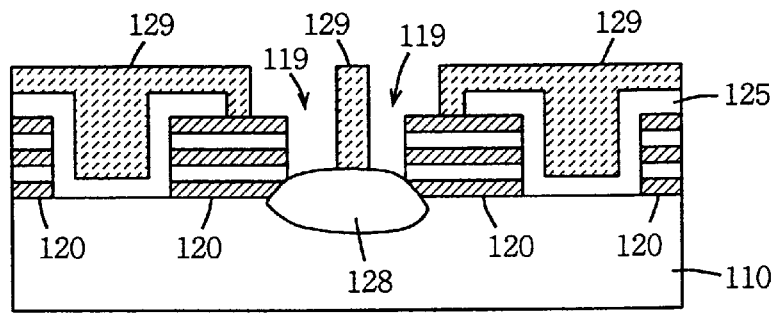
FIGS. 50A and 50B schematically represent steps in a fifth method of manufacturing the sub-source line shown in FIG. 45.

As shown in FIG. 50A, a mask 129 made of, e.g., a resist film is formed over an area except source/sub-source line region 119. Mask 129 is formed also on a portion to be the isolating region between the sub-source lines. In this step, the resist film is not formed in the peripheral circuitry (not shown) in order that the nitride film provided for preventing the thermal oxidation is removed. Etching is effected on thermal oxide film 128 masked with mask 129 made of the resist film. In the peripheral circuitry, since nitride film 125 is removed by etching, it is necessary to adjust the selection ratio (etching rates) of the etchant with respect to thermal oxide film 128 and nitride film 125.

In FIG. 50A, nitride film 125 is covered with mask 129. However, nitride film 125 is left merely for using the same as the mask during ion implantation into the source, and therefore nitride film 125 may be exposed and removed by the etching. A later step of implanting ions into the source can be performed by forming a new resist film.

Figure 50B:
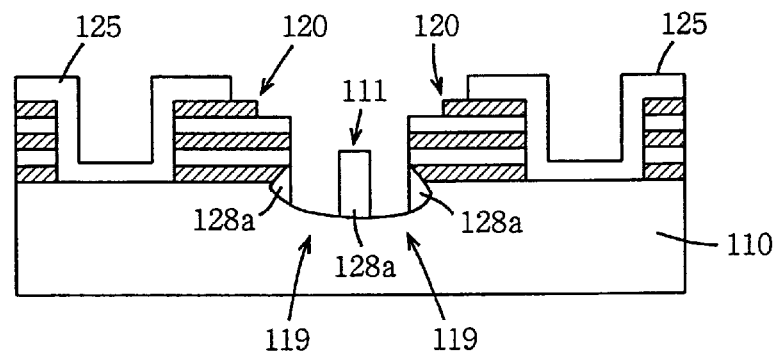

By removing mask 129 after the above etching, a thermal oxide film 128a is left in source/sub-source line isolating region 111 as shown in FIG. 50B, and parts of thermal oxide film 128 are left at lower portions of gate structures 120. Even in this state, an interlayer insulating film at the top of each gate structure 120 is partially removed by the etching. However, an interlayer insulating film will be formed in a later step, and therefore no problem arises from the exposure of the conductive layer forming the word line is exposed in this stage.

Then, ion implantation for the source region is performed to form the source/sub-source lines, using a mask shown in FIG. 48A. In this step of ion implantation, thermal oxide film 128a formed at isolating region 111 acts as a mask and prevents implantation of ions into the source/sub-source line region 111. Thereby, it is possible to provide isolation between the sub-source lines because non-doped high resistance region is left.

In the state shown in FIG. 50B, thermal oxide film 128a is partially left at the lower portion of gate structure 120. In spite of this, the source region can be reliably formed at the lower portion of gate structure 120 owing to a later step of diffusing impurity by thermal processing effected after implantation of ions into region 119.

Figure 51A:
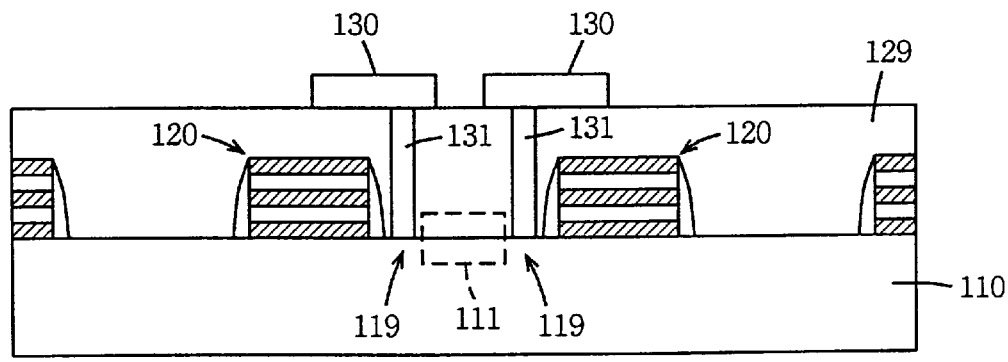
FIGS. 51A and 51B schematically show a structure of the sub-source line shown in FIG. 45.

Any one of the manufacturing methods 1 through 5 shown in FIGS. 46A through 50B may be employed, and the sub-source lines can be arranged corresponding to the word lines, respectively. Sub-Source Line Structure:

FIG. 51A schematically shows a sub-source line structure. After forming gate structures 120 and then completing isolating regions 111 as shown in FIG. 51A, which also shows side wall oxide films formed on gate structures 120 for reducing a drain electric field, interlayer insulating film 129 is formed over the surfaces of gate structures 120 and substrate 110.

Contact holes spaced from each other by a predetermined distance in the direction of the sub-source line are formed in interlayer insulating film 129, and conductive materials 131 for making electrical contact with source/sub-source lines 119 are arranged in the contact holes, respectively.

Conductive materials 131 are connected to conductive layers 130 of a low resistance formed thereover and are made of, e.g., aluminum or doped polycrystalline silicon.

Figure 51B:
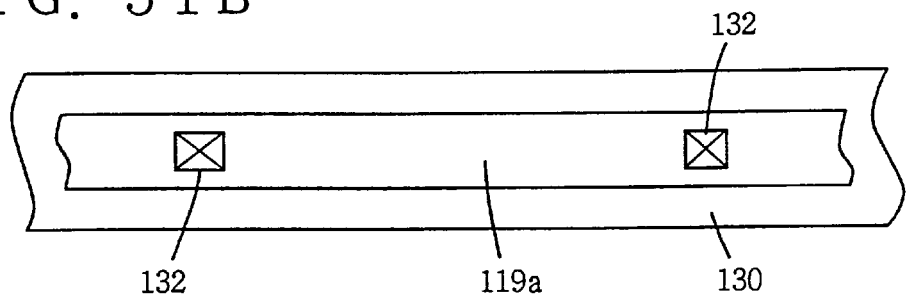

FIG. 51B schematically shows a planar layout of the sub-source line.

In FIG. 51B, sub-source line 119a formed of a diffusion layer (impurity region) and low resistance conductive layer 130 formed above and in parallel with sub-source line 119 are electrically connected together through contact holes 132 spaced by a predetermined distance from each other. By connecting diffusion layer (impurity region) 119a to conductive layer 130 of a low resistance through portions spaced by the predetermined distance, the sub-source line can have a so-called "shunt structure" and therefore can have a reduced resistance.

Figure 52:
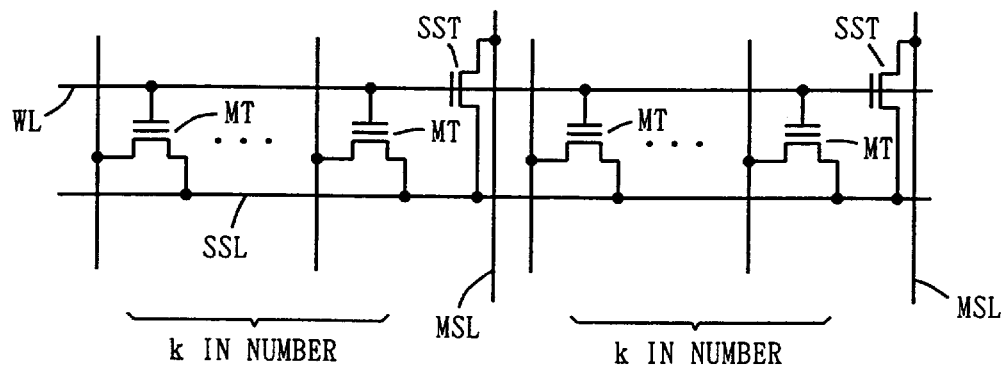
FIG. 52 depicts an effect of the sub-source line structure shown in FIG. 51.

FIG. 52 schematically shows a structure of one row in the memory cell array. In FIG. 52, each source line select transistor SST is arranged for a predetermined number (k) of memory cells MT. Main source lines MSL are arranged corresponding to these source line select transistors SST, and are coupled to sub-source lines SSL arranged corresponding to word lines WL, respectively. When channel hot electrons (CHEs) are used for programming, as is done in the NOR type flash memory, a large current of about 100 μA per memory cell flows through sub-source line SSL. By employing sub-source lines SSL of a low resistance and source line select transistors SST provided one for a predetermined number of memory cells MT, the current can flow dispersely through sub-source lines SSL, and can be supplied through relatively small source line select transistors SST so that it is not necessary to extremely increase the channel width of the source line select transistors. Since the sub-source line SSL has a low resistance, it is possible to prevent rising of the source voltage of memory cells even when a large current flows through a sub-source line SSL, and the programming operation with channel hot electrons can be stably performed.

If an area of the memory cell array is restricted, memory cells MT provided per source line select transistor SST is increased in number (k), and the channel width of source line select transistor SST is slightly increased. Even in this case, since the sub-source line SSL has a small resistance value, distribution (rising) of the voltage due to the resistance value thereof and to the current does not occur even when a current such as a Fowler-Nordheim current flows through sub-source line SSL, and programming/erasing can be performed precisely.

Figure 53:
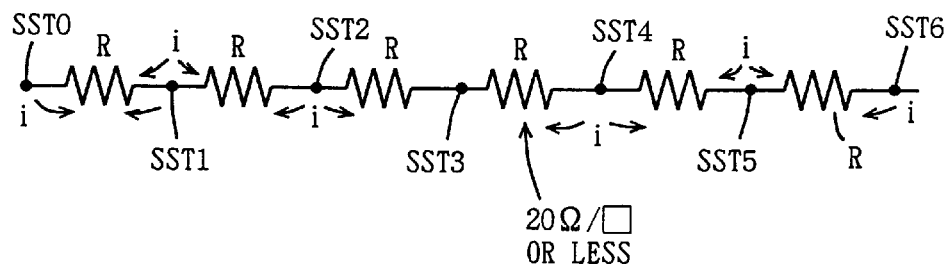
FIG. 53 depicts an advantage of the sub-source line shown in FIG. 51.

It is now assumed that the sub-source line has a resistance R between the source line select transistors as shown in FIG. 53. Source line select transistors SST0–SST6 are connected in parallel with each other, and are connected to main source lines MSL not shown in FIG. 53. It is now assumed that source line select transistor SST3 is removed. In the case where source line select transistor SST3 is removed, it is necessary that source line select transistors SST1, SST2, SST4 and SST5 at the opposite sides thereof supply the current to be supplied by source line select transistor SST3. Since each resistance element R is driven to the ground voltage level by the source line select transistors at the opposite sides thereof, currents equivalently flow on the opposite sides of each resistance element R. Therefore, a change in current driving power caused by removing source line select transistor SST3 affects source line select transistors SST1, SST2, SST4 and SST5 on the opposite sides thereof, and likewise affects source line select transistors SST0 and SST6. In this case, source line select transistors SST0 and SST6 each equivalently supply a current to source line select transistor SST3 from one side.

Therefore, removal of source line select transistor SST3 affects the five source line select transistors, because the removal exerts an influence on each of source line select transistors SST1, SST2, SST4 and SST5 to vary the currents thereof, and also exerts half an influence on each of source line select transistors SST0 and SST6. Thus, the influence is exerted on the current of the region including five resistance elements R connected in series, assuming that the influence by source line select transistors outside source line select transistors SST0 and SST6 can be approximately ignored. Therefore, if a diffusion layer is not used as the sub-source line, but the sub-source line of the shunt structure with the metal conductive layer of a low resistance is used, it is necessary that the conductive layer has a sheet resistance smaller than at least about ⅕ of a sheet resistance of the diffusion layer in order to achieve an intended effect. Usually, the diffusion layer made of an N-type impurity region has a sheet resistance of about 100 Ω/square, and therefore the sub-source line of the shunt structure with low resistance conductive layer 130 must have a sheet resistance of 20 Ω/□ or less in order to achieve the intended effect.

According to the embodiment 8 of the invention, as described above, the sub-source lines are provided corresponding to the respective word lines. Therefore, the memory cell data can be reliably and accurately read out without an influence by a memory cell in the over-low Vth state.

[Embodiment 9]

Figure 54:
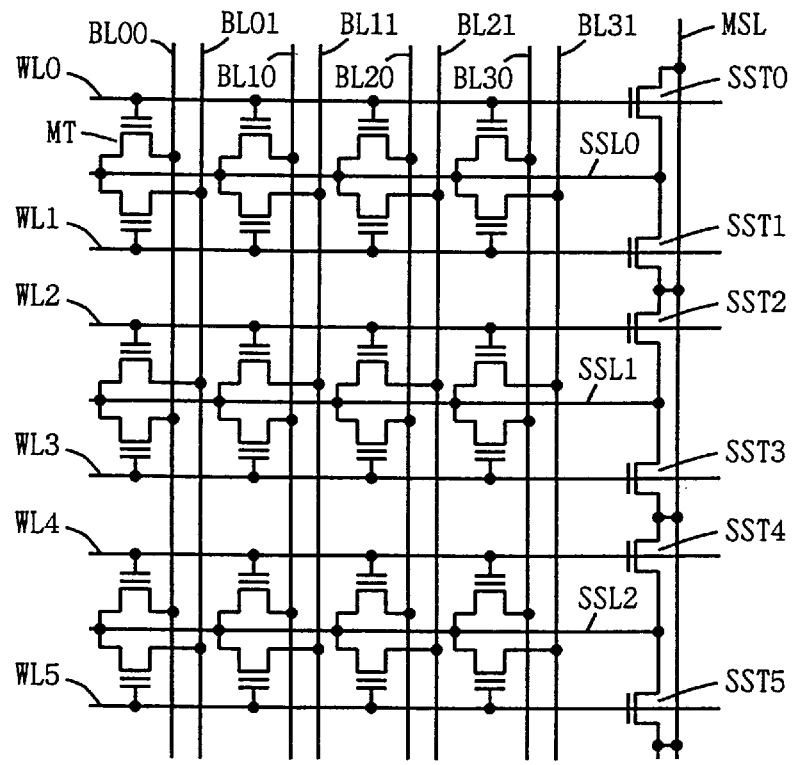
FIG. 54 shows a structure of a main portion of a nonvolatile semiconductor memory device according to an embodiment 9 of the invention.

FIG. 54 shows a structure of a main portion of a non-volatile semiconductor memory device according to an embodiment 9 of the invention. In FIG. 54, word lines WL are arranged corresponding to the respective rows of memory cells. Two bit lines BLi0 and BLi1 (i=0–3) are arranged corresponding to each column of the memory cells. Sub-source lines SSLj (j=0–2) are arranged corresponding to the respective sets each including adjacent word lines. Source line select transistors SST0–SST5 are arranged corresponding to respective word lines WL0–WL5 for selectively connecting sub-source lines SSL0–SSL2 to main source line MSL.

In the arrangement shown in FIG. 50, memory cells in each column sharing a sub-source line are connected to different bit lines BLi0 and BLi1 arranged corresponding to a memory cell column. More specifically, memory cell MT connected to word line WL0 is connected to bit line BLi0, and memory cell MT connected to word line WL1 is connected to bit line BLi1. Memory cell MT connected to word line WL2 is connected to bit line BLi1, and memory cell MT connected to word line WL3 is connected to bit line BLi0. Memory cell MT connected to word line WL4 is connected to bit line BLi0, and memory cell MT connected to word line WL5 is connected to BLi1. Thus, in the direction of a memory cell column, a manner of connection between the memory cells and the bit lines is cyclically changed with a cycle of memory cells of 4 bits. In other words, memory cells MT in each column can be divided into sets, each of the sets including adjacent memory cells MT of two bits, and memory cells in alternate sets are connected to the same bit line.

In the arrangement shown in FIG. 50, for only one of memory cells connected to the same bit line, sub-source line SSL is connected to main source line MSL when a word line is selected. For example, when word line WL0 is selected, bit lines BL00, BL10, BL20 and BL30 are connected to sub-source line SSL0 and main source line MSL through memory cells MT. Memory cells MT connected to word line WL1 are connected to bit lines BL01, BL11, BL21 and BL31. On each of selected bit lines BL00, BL10, BL20 and BL30, the current flows only through selected memory cell of one bit at the maximum, and memory cell data can be precisely read out without an influence by a memory cell in the over-low Vth state even if the memory cell in the over-low Vth state is present in the same column.

In the arrangement shown in FIG. 54, bit line selection can be achieved by selecting a bit line group based on lowest two bits of the row address signal for word line selection. For example, if lowest two bits of a row address signal for specifying a word line are (0, 0) or (1, 1), and designate word line WL0 or WL3, bit line BLi0 is selected. If lowest bits of the address signal for specifying a word line is (0, 1) or (1, 0), bit line BLi1 is selected. Thereafter, the bit line in a corresponding column is selected in accordance with a column address signal. Thereby, accurate data reading can likewise be performed in the structure wherein memory cell columns are grouped in accordance with the groups of word lines, and the bit lines are arranged corresponding to the respective column groups.

In the structure shown in FIG. 54, sub-bit lines may be arranged in place of bit lines BL. Even in this case, a section select signal applied to a section select transistor may be merely combined with a word line group specifying signal, whereby data reading can be performed even if the sub-bit lines in multiple are arranged corresponding to each memory cell column.

Bit Line Layout 1

Figure 55:
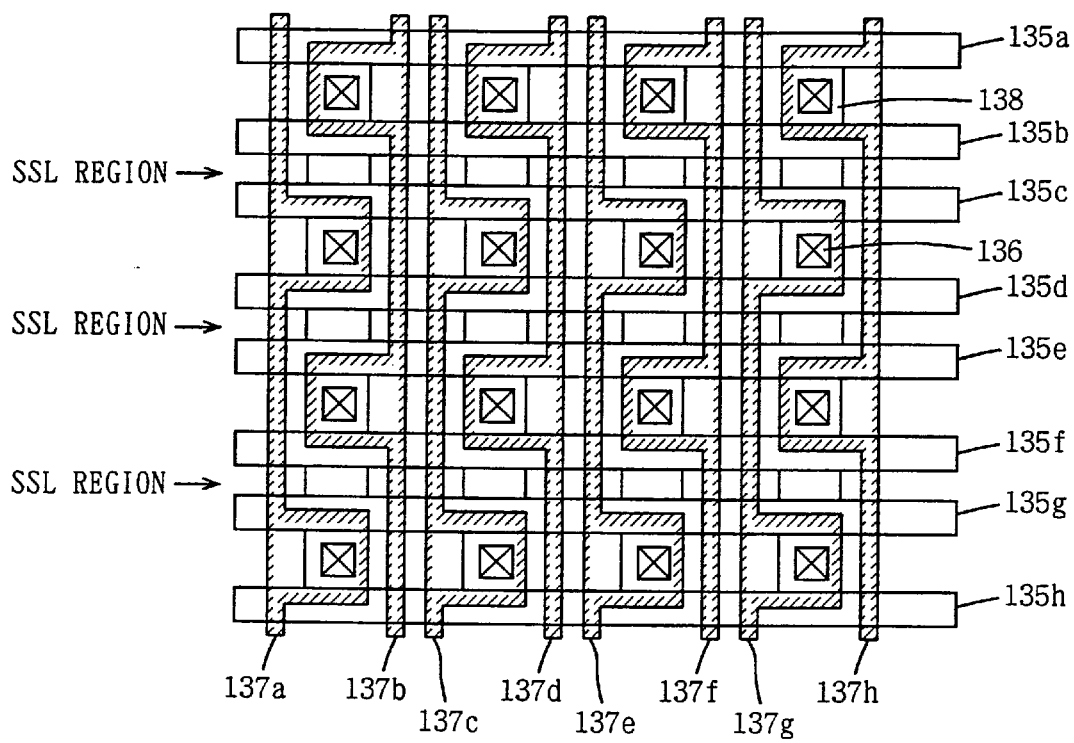
FIG. 55 shows a first layout of bit lines shown in FIG. 54.

FIG. 55 shows a first layout of the bit lines. In the bit line divided structure wherein bit lines to be arranged in one column are divided into two columns as shown in FIG. 55, conductive layers 135a–135h forming word lines are arranged in a row direction, and conductive layers 137a–137h for the bit lines extending in a column direction are arranged in such a manner that two conductive layers are arranged for each column of the memory cells. Active regions 138, for forming the memory cells are formed extending in the column direction. Each of conductive layers 137a–137h forming the bit lines is electrically connected to active region 138 through contact holes 136 located at alternate positions and are aligned together with other contact holes 136 in the column directions. In this arrangement, each contact hole 136 is shared by memory cells of two bits arranged adjacently in the column direction. Each sub-source line is for two word lines and extends along the word lines. The adjacent memory cells not sharing contact hole 136 shares a sub-source line, and are connected to different bit line conductive layers, respectively. These conductive layers 137a–137h are made of the same interconnection layer.

In the arrangement shown in FIG. 55, conductive layers forming two bit lines are arranged corresponding to each memory cell column, and each of the conductive layers forming two bit lines in each column is electrically connected to contact holes 136 at alternate positions. Thereby, memory cells in each column can be easily arranged such that the memory cells sharing a sub-source line are connected to different bit lines, respectively.

Bit Line Layout 2

Figure 56:
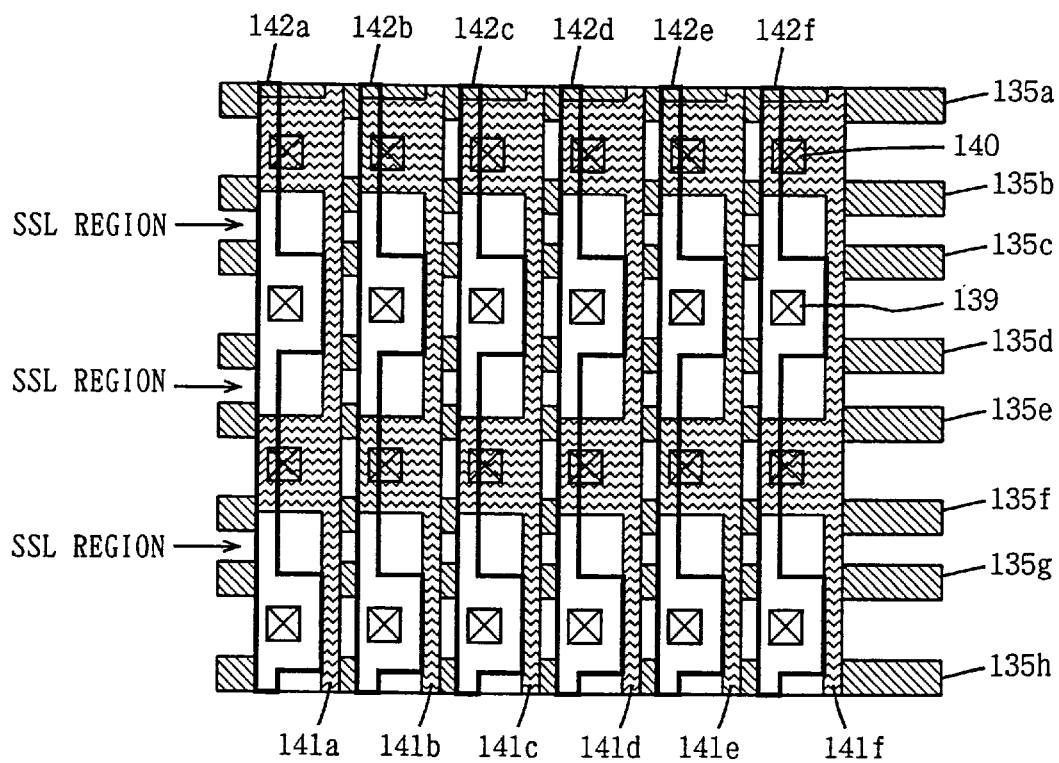
FIG. 56 shows a second layout of bit lines shown in FIG. 54.

FIG. 56 schematically shows a second layout of the divided bit line structure of the embodiment 8 of the invention. In FIG. 56, conductive layers 135a–135h forming word lines are arranged in a row direction, and conductive layers 141a–141f forming first bit lines are arranged corresponding to the memory cell columns, respectively. Conductive layers 142a–142f forming second bit lines are arranged corresponding to the memory cells and are located above first conductive layers 141a–141f.

Conductive layers 141a–141f are electrically connected to underlying active regions through contact holes 140, and conductive layers 142a–142f are electrically connected to underlying active regions through contact holes 139. The memory cells at opposite sides of each region (SSL region) where a sub-source line is arranged are connected to different bit line conductive layers, respectively. Owing to employment of the bit lines of double-layer structure, two bit lines can be arranged corresponding to each memory cell column without increasing an occupied area in the plan layout. Since upper conductive layers 142a–142f are in contact with the underlying active regions through the regions of contact holes 139, upper conductive layers 142a–142f are merely required not to be in contact with lower conductive layers 141a–141f through these regions. Therefore, two bit lines can be arranged for each memory cell column with a sufficient margin. In this double layer structure, formation of bit lines requires the step of forming conductive layers 141a–141f at a first level and the step of forming conductive layers 142a–142f at the upper level. However, if an interconnection line disposed at the same layer as the upper or lower conductive layer may be formed in another circuit such as a peripheral circuit, the step of forming the interconnection line for another circuit can be utilized, and the bit lines of the double layer structure can be achieved without increasing the number of manufacturing steps.

Layout 3 of Divided Bit Line Structure

Figure 57:
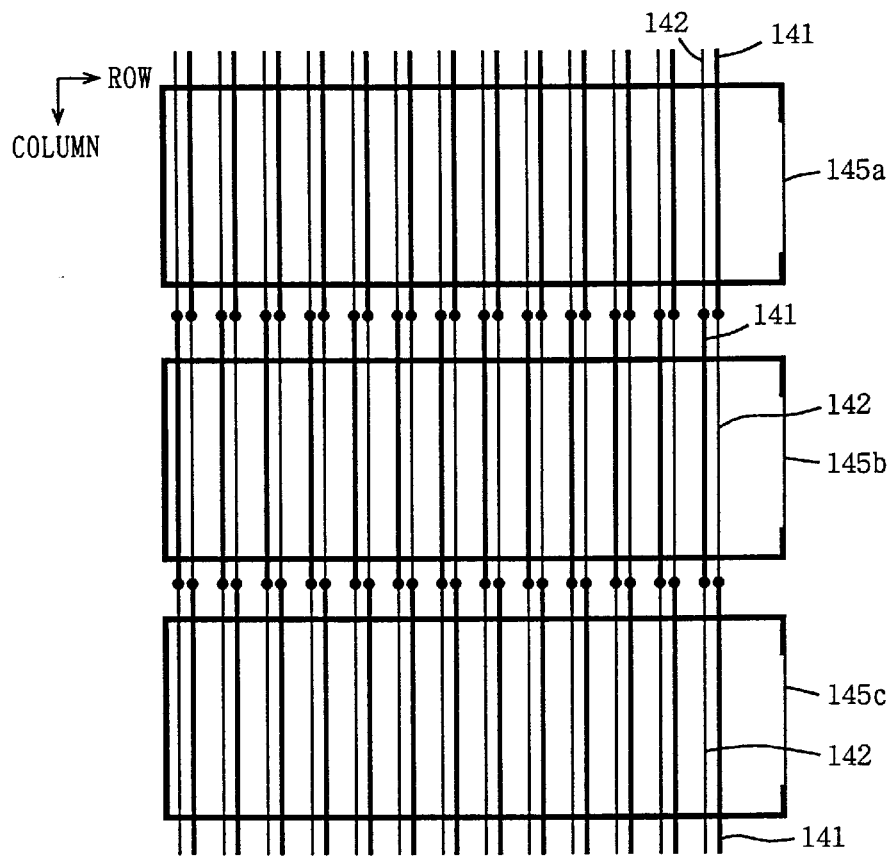
FIG. 57 shows a third arrangement of bit lines in the nonvolatile semiconductor memory device shown in FIG. 54.

FIG. 57 schematically shows a third layout of the divided bit line structure. According to the layout shown in FIG. 57, the memory cell array is divided into a plurality of sub-arrays 145a–145c aligned in the column direction. Each of sub-arrays 145a–145c has word lines and sub-source lines, extending in the row direction, but these are not shown in FIG. 57 for simplicity reason. In a nonvolatile semiconductor memory device such as a NOR type flash memory, one bit line is connected to many memory cells. In case of employing the double layer bit line structure as shown in FIG. 56, the bit lines may have different electric characteristics. In view of this, interconnection layers for the bits lines are switched every memory sub-arrays. More specifically, conductive layers 141 and 142 arranged in memory sub-array 145a are connected to opposite conductive layers 142 and 141 in sub-array 145b. In other words, conductive layer 141 in memory sub-array 145a is connected to upper conductive layer 142a in sub-array 145b, and upper word line 142 in sub-array 145a is connected to lower conductive layer 141 in sub-array 145b.

Likewise, lower conductive layer 141 in sub-array 145b is connected to upper conductive layer 142 in sub-array 145c, and upper conductive layer 142 in sub-array 145c is connected to lower conductive layer 141 in sub-array 145c. For each bit line (divided bit lines), therefore, the lower and upper conductive layers are alternately used in units of sub-arrays, so that the bit lines in each column can have substantially uniform electric characteristics such as a line resistance and a line capacitance, and therefore deterioration of characteristics due to delay in signal propagation or the like can be prevented.

The structure shown in FIG. 57 includes three divided memory sub-arrays 145a–145c. However, the array may be divided into four or more sub-arrays. By dividing the memory array into even number of sub-arrays, each bit line of the divided structure can include the upper and lower conductive layers equal in number, and therefore can have more uniform electric characteristics through its entire length.

The sub-arrays 145a–145c are merely required to share the bit lines.

Layout 4 of Divided Bit Lines

Figure 58:
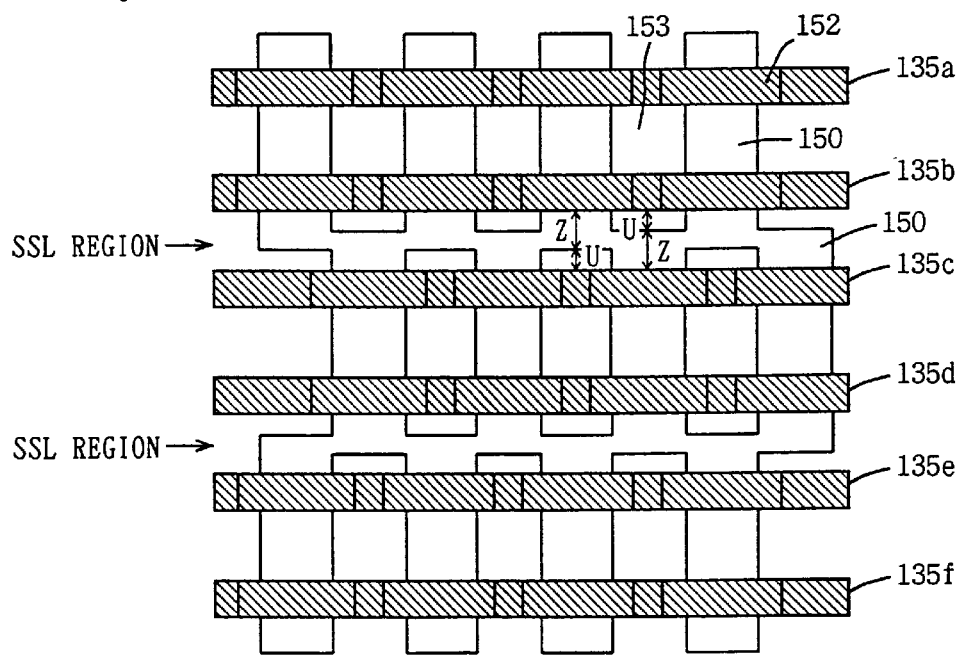
FIG. 58 schematically shows an arrangement of memory cells in the nonvolatile semiconductor memory device shown in FIG. 54.

FIG. 58 schematically shows a fourth layout of the divided bit line structure. In FIG. 58, conductive layers 135a–135f to be word lines are arranged in a row direction. Active regions 150 for forming memory cells are arranged in a column direction. Active regions 150 in the column direction are in a staggered arrangement wherein a region 150 for adjacent memory cells of two bits is shifted from an active region 150 adjacent in the direction of a word line by one column. Isolation regions 153 are arranged between these active regions. The isolation region 153 is provided with an insulating film, which in turn may be a thin insulating film such as a thermal oxide film.

As shown in FIG. 58, active region 150 is shifted every memory cells of two bits by one column in the row direction. Thereby, the bit lines can be easily formed of the interconnection layers at the same layer because drain contacts are shifted every two word lines by one column in the column direction. Owing to the staggered arrangement of active regions 150, memory cell columns can be arranged in accordance with the minimum pitch of interconnection lines. Further, the interconnection line width of a bit line can be sufficiently increased.

In the staggered arrangement shown in FIG. 58, a word line and floating gate must be spaced from an end of isolation region 153 by a distance U, and must be spaced from an end of the active region by a distance Z. If the distance Z is 0, the source region of a memory cell transistor does not exist, and it is impossible to flow the channel current. If the distance U between the end of the isolating and insulating film and a word line is 0, the word line and the floating gate cause coupling with the source region of an adjacent memory cell, and a sufficient electric field cannot be formed between the floating gate and the drain region. This is because deterioration occurs in a coupling ratio determined by a ratio of the capacitance between a word line and a floating gate to the capacitance between a drain and the floating gate, and intended programming/erase characteristics cannot be achieved due to this deterioration. If distance U is negative, the channel length excessively decreases so that a short channel effect occurs, and the transistor characteristics shift from the intended characteristics.

In the structure shown in FIG. 58, the active regions adjacent to each other in the row direction are continuously formed. Even in the structure wherein active regions 150 have continuous portions in the sub-source line formation regions (SSL regions), no problem arises provided that foregoing distances U and Z are sufficient long.

Figure 59:
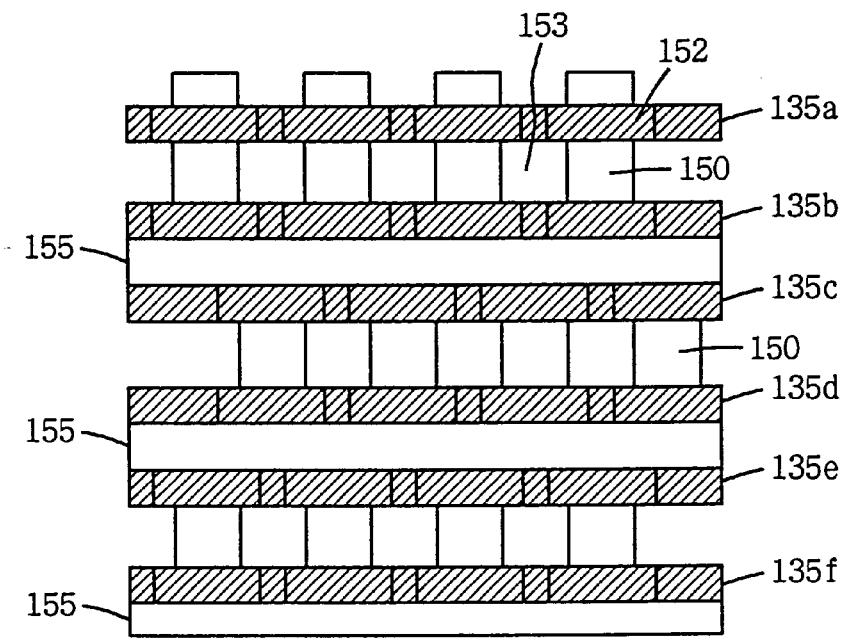
FIG. 59 shows sub-source line formation regions in the memory cell arrangement shown in FIG. 58.

FIG. 59 shows an arrangement of sub-source lines for the arrangement shown in FIG. 58. In FIG. 59, diffusion regions 155 to be sub-source lines are formed by a self-align source (SAS) method and more specifically in a self-aligned manner using conductive layers 135b, 135c, 135d, 135e and 135f to be word lines, as a mask. In the arrangement shown in FIG. 59, an isolating and insulating film is formed under conductive layers 135a, 135b, 135c, 135d, 135e and 135f to be word lines. Therefore, distance U shown in FIG. 58 can be sufficiently large although diffusion regions 155 forming the sub-source lines are formed in a self-aligned manner.

Accordingly, the diffusion regions for forming the sub-source lines and the source regions can be easily formed even in the staggered arrangement in which memory cells of two bits are shifted by one column in the row direction from adjacent memory cells as shown in FIG. 58.

Figure 60:
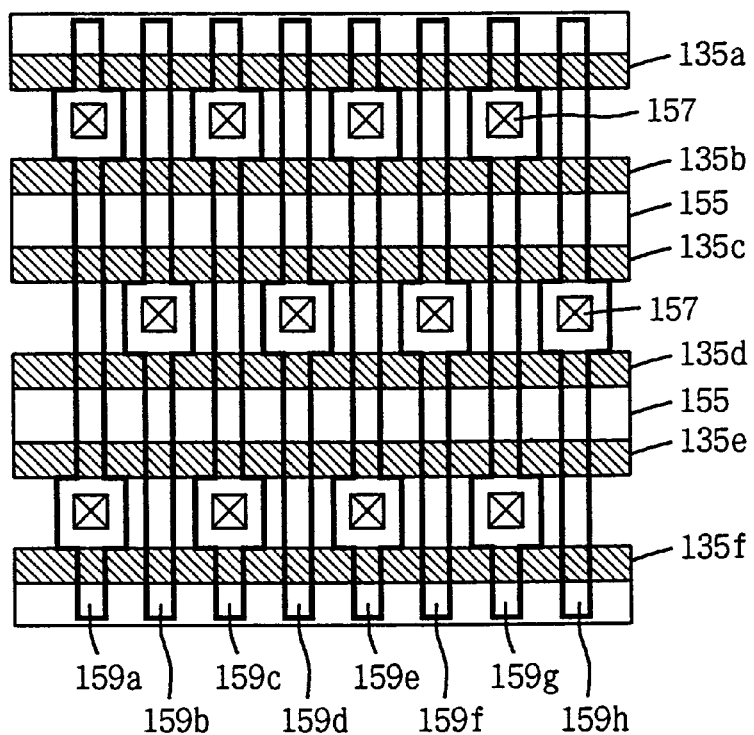
FIG. 60 schematically shows an arrangement of bit lines for the memory cell arrangement shown in FIG. 58.

FIG. 60 shows a first example of the bit line arrangement for the arrangement shown in FIG. 58. In FIG. 60, conductive layers 159a–159h to be bit lines, are arranged corresponding to the respective columns of the active regions. Conductive layers 159a–159h are formed at the same interconnection layer, and have portions overlapping with the active regions (not shown in FIG. 60) and electrically connected to these active regions through contact holes 157, respectively. Owing to this arrangement, the active regions for forming the memory cells can be arranged in accordance with an allowable minimum interconnection pitch of conductive layers 159a–159h, and increase in cell array area can be suppressed.

After forming conductive layers 135a–135f to be word lines, diffusion regions 155 to be the sources and sub-source lines are formed in a self-aligned manner using these word lines as a mask. Thereafter, conductive layers 159a–159h to be bit lines as well as contact holes 137 are formed such that the memory cells sharing a sub-source line are connected to different bit lines.

Figure 61:
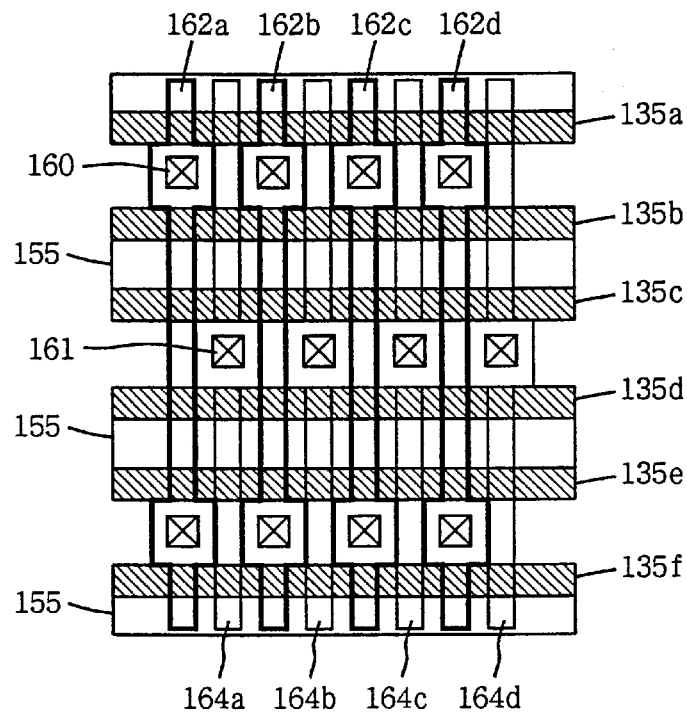
FIG. 61 shows a second arrangement of the bit lines for the memory cell arrangement shown in FIGS. 58 and 59.

FIG. 61 shows a second example of the bit line arrangement for the arrangement shown in FIG. 58. For the arrangement shown in FIG. 61, conductive layers 135a–135f to be word lines are formed, and then diffusion regions 155 to be the source and sub-source lines are formed. Thereafter, processing is performed to form conductive layers 162a–162d to be first bit lines for alternate columns of the memory cells. Then, conductive layers 164a–164d to be second bit lines and to be located above conductive layers 162a–162d to be the bit lines, are formed corresponding to the other columns of the active regions. Conductive layers 162a–162d are electrically connected to corresponding active regions (not shown in FIG. 61) through contact holes 160, respectively, and conductive layers 164a–164d are electrically connected at their portions overlapping with the active regions to the corresponding active regions through contact holes 161, respectively.

As shown in FIG. 61, the divided bit line structure employs conductive layers 162a–162d and conductive layers 164a–164d formed in different interconnection layers. Thereby, the influence by an interconnection pitch can be minimized, and the memory cells are arranged in the row direction with a small pitch so that increase in cell array area can be suppressed. In the arrangement shown in FIG. 61, the interconnection pitch merely depends on the area of the regions required for forming contact holes 160 and 161.

In the arrangement shown in FIG. 61, conductive layers may be arranged in an alternating manner in the bit line extending direction as shown in FIG. 57, whereby divided bit lines can have the same electric characteristics. In this structure, the contact holes may be aligned in the row direction within the portion where different conductive layers are connected as for one bit line (a divided bit line). In this case, the area occupied by the contact holes for this mutual connection between different conductive layers may increase the interconnection line pitch. In this case, however, the regions of the respective contact holes may be shifted in the row direction with respect to the column direction whereby increase in interconnection line pitch can be suppressed.

According to the embodiment 9 of the invention, as described above, the memory cells sharing a sub-source line are connected to different bit lines. Therefore, even if a memory cell in the over-low Vth state is present in a certain column, data of the memory cells in the same column can be precisely read out without an influence by this memory cell in the over-low Vth state.

[Embodiment 10]

Figure 62:
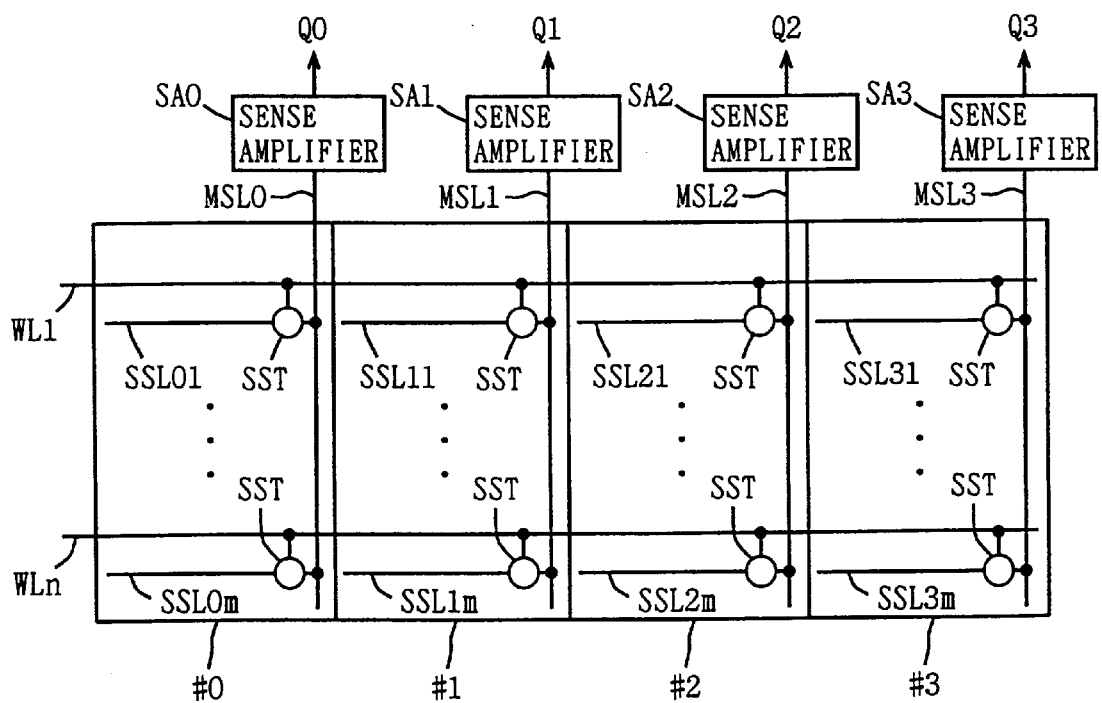
FIG. 62 schematically shows a structure of a main portion of a nonvolatile semiconductor memory device according to an embodiment 10 of the invention.

FIG. 62 schematically shows a whole structure of a nonvolatile semiconductor memory device according to an embodiment 10 of the invention. In FIG. 62, the memory cell array is divided into four sub-array regions #0–#3 aligned in a row direction. Word lines WL1–WLn are arranged commonly to these sub-array regions #0–#3. Sub-source lines are arranged only for each of the sub-array regions. In sub-array region #0, sub-source lines SSL01–SSL0m are arranged corresponding to word lines WL1–WLn. In sub-array region #1, sub-source lines SSL11–SSL1m are arranged corresponding to word lines WL1–WLn. In sub-array regions #2 and #3, sub-source lines SSL21–SSL2m and SSL31–SSL3m are likewise arranged corresponding to word lines WL1–WLn. Sub-source lines SSL (SSL01–SSL3m) extend in the row direction only within the corresponding sub-array regions, and sub-source lines in different sub-array regions are isolated from each other.

Source line select transistors SST are arranged corresponding to sub-source lines SSL01–SSL3m, respectively. Source line select transistors SST are coupled to main source lines MSL0–MSL3 provided corresponding to respective sub-array regions #0–#3. Sense amplifiers SA0–SA3 for data reading are arranged corresponding to main source lines MSL0–MSL3, respectively. Sense amplifiers SA0–SA3 are arranged corresponding to output data bits Q0–Q3, respectively. Sub-source lines SSL01–SSL3m may be arranged corresponding to word lines WL1–WLn, respectively, or may be commonly used by adjacent word lines.

In reading out of data, only a selected bit line is connected to the ground voltage level, and remaining unselected bit lines are set to the open state. Only the source line select transistor SST connected to a selected word line is connected to the main source line. Sense amplifiers SA (SA1–SA3) determine whether currents flow through main source lines MSL (MSL0–MSL3) or not, respectively. If the current flows, it is determined that a selected memory cell is the memory cell in the low threshold voltage state. If sub-source lines SSL are provided corresponding to word lines WL (WL1–WLn), respectively, data reading can be performed accurately without being affected by the unselected memory cells. Even if each sub-source line is shared between adjacent two word lines, the leak current of memory cell of only one bit exerts an influence, and accurate data reading can be likewise performed.

Each bit line not shown in FIG. 62 is merely supplied with a voltage during programming and reading, and a circuit portion for applying the voltage to a bit line during writing and reading is not required to have a large current supplying ability, and therefore a transistor of a reduced size can be used therefor. Thus, an area occupied by the circuit can be reduced. In each of sense amplifiers SA0–SA3, it is necessary to determine whether a current flows during data reading, and therefore a relatively large current driving ability is required.

Figure 63:
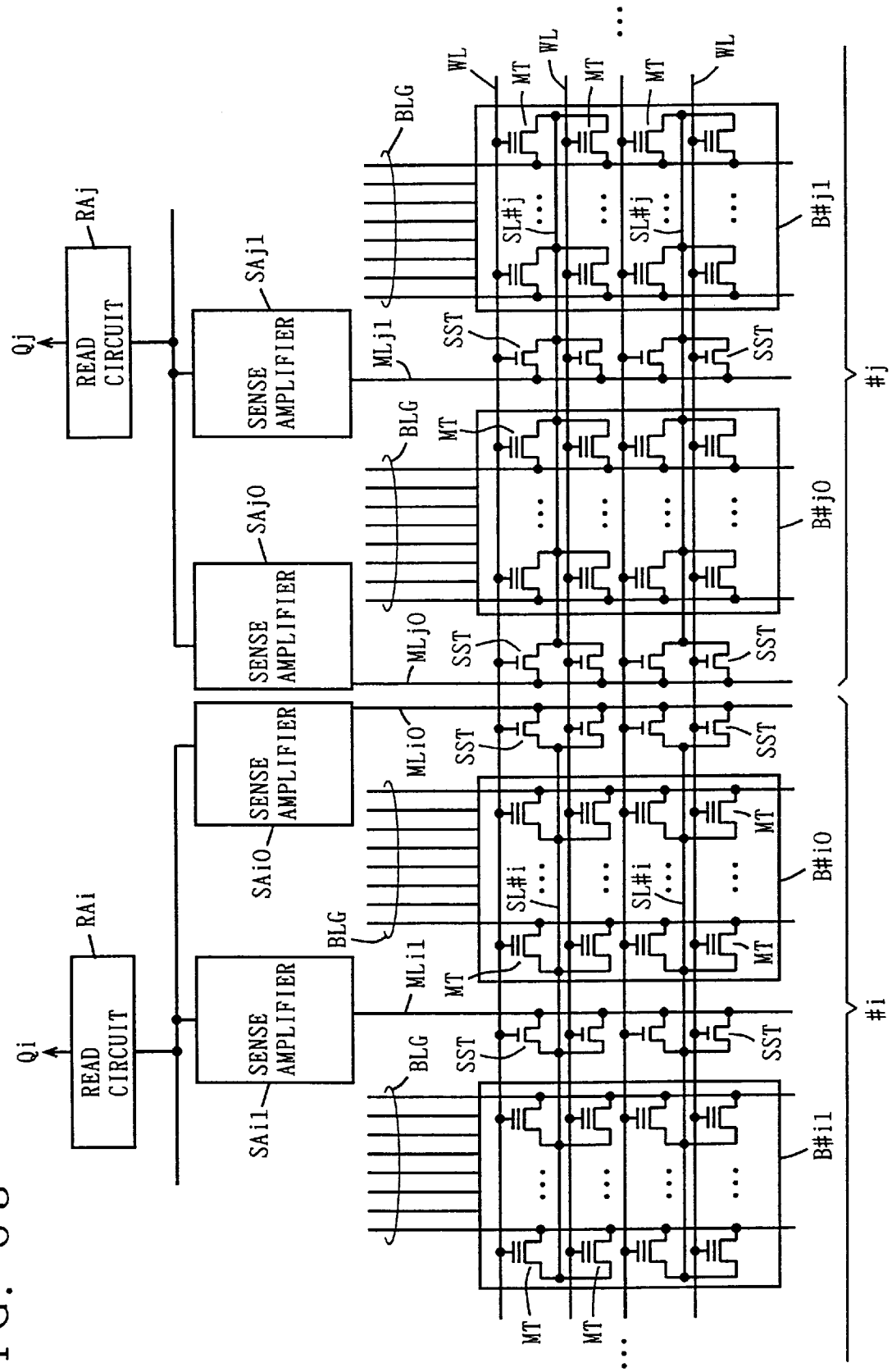
FIG. 63 shows a more specific structure of the main portion of the nonvolatile semiconductor memory device shown in FIG. 62.

FIG. 63 shows more specific structures of the sub-array regions of the nonvolatile semiconductor memory device shown in FIG. 62. Specifically, FIG. 63 shows structures of two sub-array regions #i and #j.

In FIG. 63, each of sub-array regions #i and #j is divided into memory blocks aligned in the row direction and each having a predetermined number of memory cells. In FIG. 63, sub-array region #i is divided into memory blocks B#i0, B#i1, . . . , and sub-array region #j is divided into memory blocks B#j0, B#j1, . . . . Each memory block B# (e.g., B#i0) has the memory cells of, e.g., 8 bits aligned in the row direction.

In the arrangement shown in FIG. 63, sub-source line SL is arranged corresponding to each set of adjacent word lines WL. Sub-source line SL#i included in sub-array region #i extends in the row direction only within the same sub-array region #i. Likewise, sub-source line SL#j in sub-array region #j extend in the row direction only within the same sub-array region #j.

Main source lines MLi0, MLi1, MLj0 and MLj1 are arranged corresponding to memory blocks B#i0, B#i1, B#j0 and B#j1, respectively. Source line select transistors SST are arranged corresponding to crossings between these main source lines MLi0, MLi1, MLj0 and MLj1 and sub-source lines SL#i and SL#j.

Corresponding to respective main source lines MLi0, MLi1, MLj0 and MLj1, there are arranged sense amplifiers SAi0, SAi1, SAj0 and SAj1 each determining whether a current flows through the corresponding main source line or not and producing a signal representing the result of determination. Sense amplifiers SAi0, SAi1, . . . provided corresponding to sub-array #i are commonly connected to a read circuit RAi, and sense amplifiers SAj0 and SAj1 provided corresponding to sub-array region #j are commonly connected to a read circuit RAj. Each of read circuits RAi and RAj determines that a memory cell in the low threshold voltage state is selected, and produces data (e.g., of logic "1") representing the low threshold voltage state, when corresponding sense amplifier SA (genericily indicating SAi0, SAj0, . . . ) generates a signal representing that a current flows through the corresponding main source line.

A bit line group BLG provided corresponding to memory block B# (generally representing B#i0, . . . , B#j1) is coupled through a column select gate (not shown) to the write circuit and the read voltage generating circuit, which in turn supplies the ground voltage in the read operation.

In the arrangement shown in FIG. 63, each of sub-array regions #i and #j is divided into a plurality of memory blocks B# aligned in the row direction and each having a predetermined number of bits. When a selected memory cell is in the low threshold voltage state, a current flows from main source line ML (MLi1, . . . , MLj1) to sub-source line SL# (SL#i and SL#j), and the current further flow to the bit line through the selected memory cell. This is detected by sense amplifier SA. Generally, a relatively large current flows through the main source line nearest to the selected memory cell, and the corresponding sense amplifier detects absence or presence of the flowing current.

By dividing each of sub-array regions #i and #j into the plurality of memory blocks, the distance between a selected memory cell and a main source line is reduced so that the resistance of sub-source line SL# decreases. Therefore, the read current can be accurately produced on a main source line without an influence by the interconnection line resistance.

Figure 64:
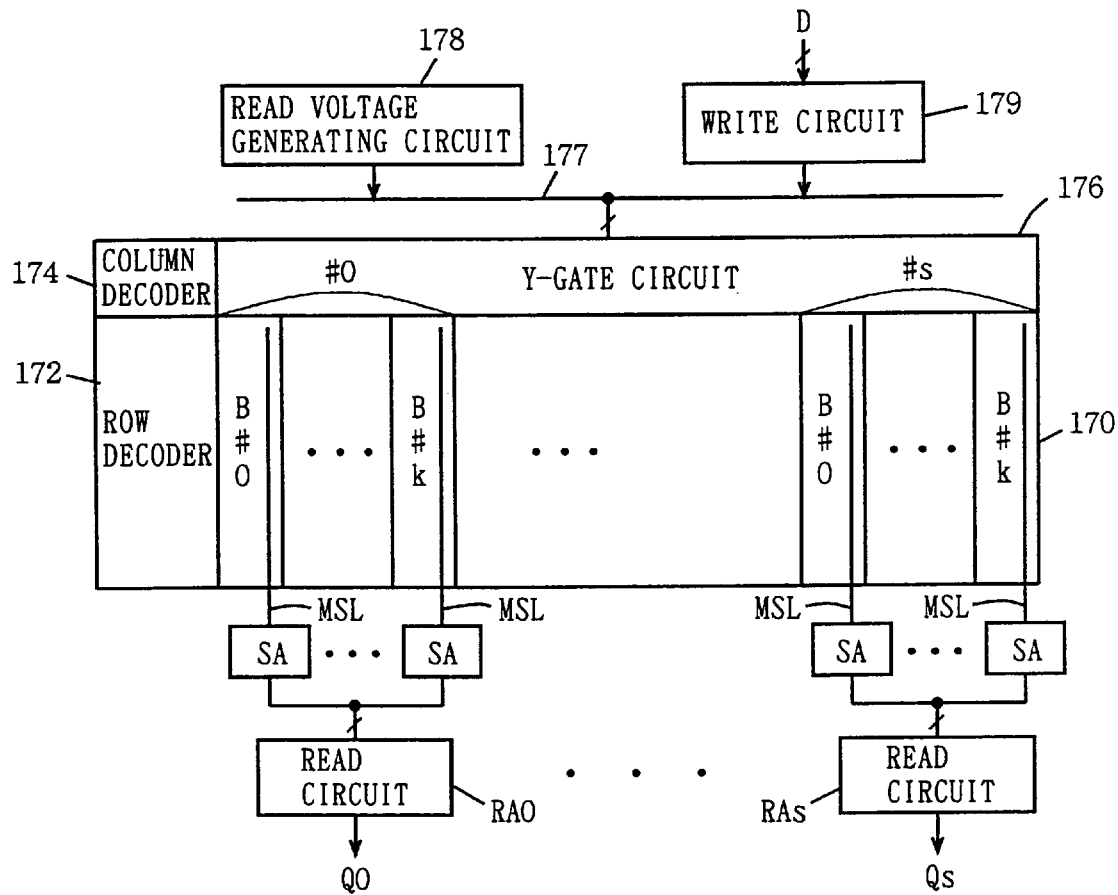
FIG. 64 shows more specifically a whole structure of the nonvolatile semiconductor memory device shown in FIG. 62.

FIG. 64 shows a whole structure of a nonvolatile semiconductor memory device according to an embodiment 10 of the invention. In FIG. 64, memory cell array 170 is divided into a plurality of sub-array regions #0–#s. Each of sub-array regions #0–#s is divided into a plurality of memory blocks B#0–B#k. Main source line MSL is provided for each of memory blocks B#0–B#k. Sense amplifier SA is provided for each main source line MSL. The sense amplifier groups for sub-array regions #0–#s are coupled to corresponding read circuits RA0–RAs, respectively. Read circuits RA0–RAs may be formed of logic circuits, or may have structures in which outputs of the corresponding sense amplifiers are transmitted through wired-connections.

For memory cell array 170, there are arranged a row decoder 172 for selecting a word line corresponding to an addressed row, a column decoder 174 for producing a column select signal for selecting the addressed designated column in each of memory sub-array regions #0–#s, and a Y-gate circuit 176 for selecting one column in each of sub-array regions #0–#s in accordance with the column select signal from column decoder 174. A column (bit line or main bit line) selected by Y-gate circuit 176 is coupled through a bus 177 to a read voltage generating circuit 178, which in turn produces the ground voltage during data reading, and to a write circuit 179, which in turn transmits externally applied data during data writing. Write circuit 179 may be configured to transmit the externally applied data onto selected columns to have the data latched at each of selected columns. Write circuit 179 may also be configured to produce the programming voltage. The structure employable for write circuit 179 depends on the structure of the nonvolatile semiconductor memory device.

Figure 65:
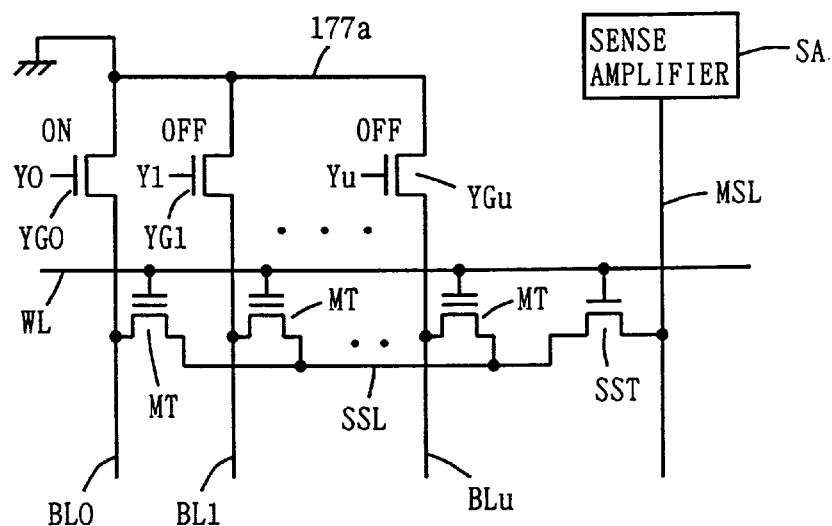
FIG. 65 schematically shows a structure of a main portion of the nonvolatile semiconductor memory device shown in FIG. 64 in data reading.

FIG. 65 schematically shows a structure of a portion of one row in one memory block during data reading. In FIG. 65, bit lines BL0–BLu are coupled to a signal line 177a through column select gates YG0–YGu receiving column select signals Y0–Yu from column decoder 174 on their gates, respectively. Memory cells MT are arranged at crossings between bit lines BL0–BLu and word line WL. Sub-source line SSL is arranged commonly to these memory cells MT. Sub-source line SSL is coupled to main source line MSL through source line select transistor SST.

In data reading, a column select signal from column decoder 714 (see FIG. 64) turns on one of Y-gates YG0–YGu. FIG. 65 shows a state wherein Y-gate YG0 is on. In this state, the ground voltage from read voltage generating circuit 178 shown in FIG. 64 is transmitted onto bit line BL0 provided corresponding to the selected column. Other bit lines BL1–BLu are in a floating state because corresponding Y-gates are off. A voltage, e.g., of about 3.3 V is transmitted onto word line WL, and source line select transistor SST is turned on to couple the main source line MSL to sub-source line SSL. When selected memory cell MT is in the low threshold voltage state, a current flows from main source line MSL to bit line BL0 through source line select transistor SST, sub-source line SSL and memory cell MT. Sense amplifier SA detects this current flow. When selected memory cell MT is in the high threshold voltage state, memory cell MT is off, and the current does not flow through main source line MSL. All bit lines BL1–BLu are in the floating state and cut off the current paths so that data of the selected memory cell can be precisely read out.

In the structures shown in FIGS. 62 and 63, the sub-source lines are divided corresponding to the output data bits. However, a sub-source line may be further divided in sub-array region corresponding to one bit. More specifically, the outputs of sense amplifiers SAi0, SAi1, SAj0 and SAj1 shown in FIG. 63 may be coupled to a common read circuit, from which data of one bit is read.

The above structure has been described, by way of example, in connection with the structure of the array of NOR type flash memory. However, a similar structure can be applied to the structure of DINOR type flash memory.

[Modification]

Figure 66:
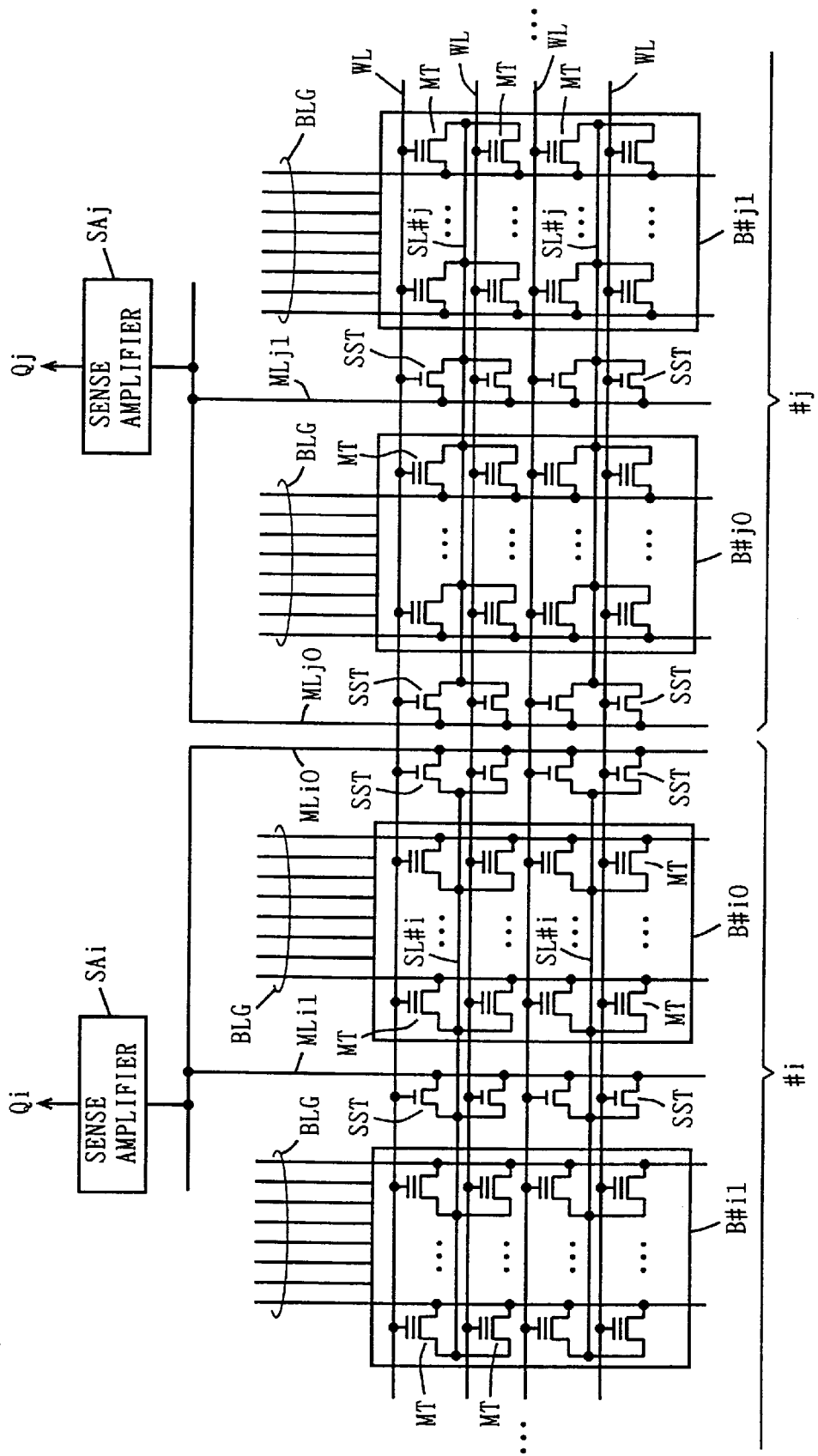
FIG. 66 shows a structure of a modification of the embodiment 10 of the invention.

FIG. 66 schematically shows a structure of a modification of a nonvolatile semiconductor memory device according to the embodiment 10 of the invention. The nonvolatile semiconductor memory device shown in FIG. 66 differs from the nonvolatile semiconductor memory device shown in FIG. 63 in the following points. Sense amplifier SAi and SAj are provided one for each of sub-array regions #i and #j. Each of sense amplifiers SAi and SAj is commonly coupled to the main source lines of a corresponding sub-array region. Thus, sense amplifier SAi is commonly coupled to main source lines MLi0, MLi1, . . . in sub-array region #i. Sense amplifier SAj is commonly coupled to main source lines MLj0, MLj1, . . . in sub-array region #j.

Even in the structure of one sense amplifier SA (SAi or SAj) for each sub-array region, the current flows through a main source line when a selected memory cell is in the low threshold voltage state, and therefore detection can be performed sufficiently. In the structure shown in FIG. 66, only one sense amplifier is required for each sub-array region, and it is not necessary to provide an individual sense amplifier for each memory block. Therefore, an area occupied by the circuits can be reduced.

According to the embodiment 10 of the invention, as described above, data is read out depending on whether a current flows through a main source line or not. Therefore, a bit line is merely required to transmit the voltage, and therefore it is possible to reduce the current driving ability of the circuit portion applying the read voltage onto a bit line in reading so that the transistor size and thus the circuit scale can be reduced.

[Embodiment 11]

Figure 67A:
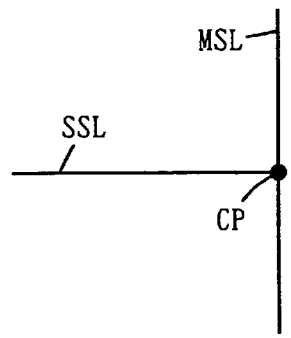
FIGS. 67A to 67C schematically show a structure of a portion directly coupling a main source line and a sub-source line.
Figure 67B:
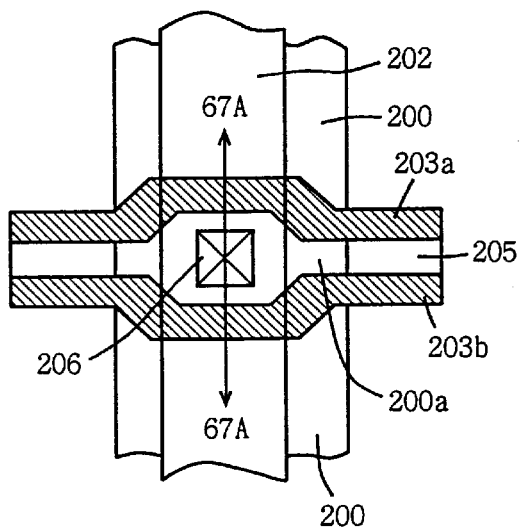
Figure 67C:
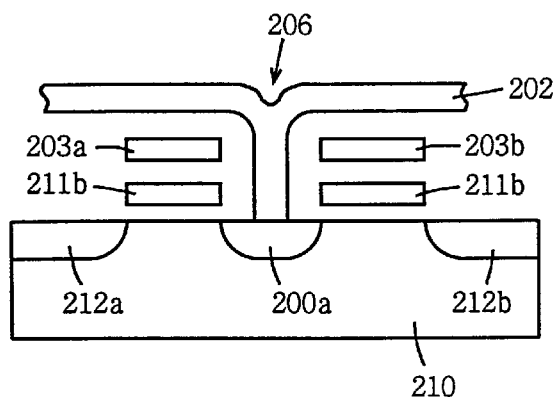

FIGS. 67A–67C schematically show a structure of a sub-source line connection. In FIG. 67A, main source line MSL is directly connected to sub-source line SSL at a crossing CP. In the arrangement shown in FIG. 67A, sub-source lines SSL in a memory cell array are commonly supplied with a voltage from main source line MSL, and selective transmission of the voltage to sub-source lines is not performed.

FIG. 67B schematically shows a plan layout of crossing CP shown in FIG. 67A. In FIG. 67B, an active region 200 is formed at crossing CP similarly to the memory cell for the following reason. Since a memory cell is also arranged at the vicinity of crossing CP, the pattern layout thereof is repeated to maintain the repetition regularity by the above provision of active region 200. Conductive layers 203*a* and 203*b* to be word lines are formed across active region 200. A low resistance conductive layer 202, which is made of polycrystalline silicon or metal of a low resistance such as aluminum, is arranged along active region 200. Low resistance conductive layer 202 has a connection through a contact hole 206 in a region between conductive layers 203*a* and 203*b* to be word lines. In this region, a space between conductive layers 203*a* and 203*b* to be word lines is increased for forming contact hole 206. An active region 200*a* having a connection to the layer 202 through contact hole 206 is connected to a diffusion region 205 which in turn extends in the row direction between conductive layers 203*a* and 203*b*. Diffusion layer 205 functions as sub-source line SSL.

FIG. 67C schematically shows a sectional structure taken along line 67A—67A in FIG. 67B. In FIG. 67C, impurity regions 212*a*, 200*a* and 212*b* are formed at a surface of a semiconductor substrate region 210 with a space between each other. Active region 200 is formed of these impurity regions 212*a*, 200*a* and 212*b*, and has a periphery surrounded by an isolating and insulating film.

A conductive layer 211*b*, which is located at the same layer as the floating gate, is formed above the channel region between impurity regions 212*a* and 200*a* with a gate insulating film (not shown) thereunder. Conductive layer 203*a* to be a word line is formed on conductive layer 211*b* with interlayer insulating film (not shown) thereunder.

A conductive layer 211*b*, which is located at the same layer as the floating gate electrode, is formed above the channel region between impurity regions 200*a* and 212*b* with the gate insulating film (not shown) thereunder. Conductive layer 203*b* to be a word line is formed on conductive layer 211*b* with the interlayer insulating film (not shown) thereunder. Impurity region 200*a* is connected to conductive layer 202 through contact hole 206.

As shown in FIG. 67C, a structure similar to the memory cell is formed at the crossing CP between main source line MSL and sub-source line SSL. The purpose of this is merely to maintain the repetition regularity in pattern. The memory cell structure is formed at crossing CP is not positively utilized in the prior art. This invention positively utilizes this cell structure at crossing CP.

Figure 68A:
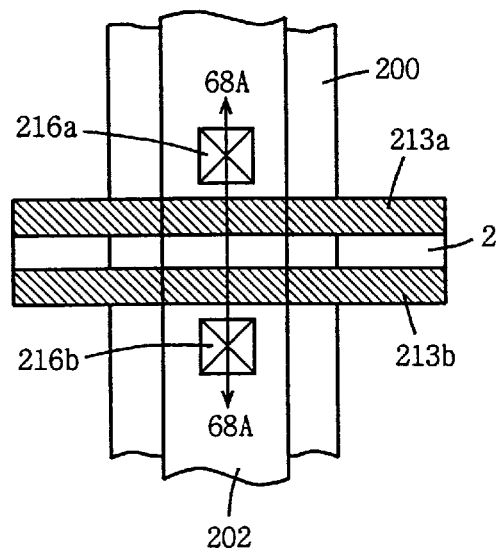
FIGS. 68A and 68B schematically show a structure of a source line select transistor according to an embodiment 11 of the invention.

FIG. 68A schematically shows a plan layout of the source line select transistor according to the embodiment 11 of the invention. In FIG. 68A, conductive layers 213*a* and 213*b* to be word lines which extending linearly are formed across active region 200. Diffusion layer 205 to be a sub-source line is formed between conductive layers 213*a* and 213*b*. Conductive layer 202 of a low resistance to be a main source line is arranged in an extending direction of active region 200, and is electrically connected to active region 200 through contact holes 216*a* and 216*b* formed outside conductive layers 213*a* and 213*b*.

The layout shown in FIG. 68A differs from the layout shown in FIG. 67B in the position of the contact holes and, more specifically, in that the contact hole is formed not between the conductive layers to be word lines but outside these conductive layers. Since it is not necessary to arrange the contact hole between conductive layers 213a and 213b, conductive layers 213a and 213b to be word lines can extend linearly.

Figure 68B:
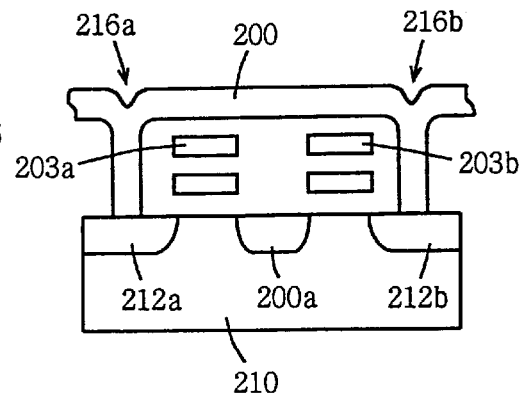

FIG. 68B schematically shows a sectional structure taken along line 68A—68A in FIG. 68. In FIG. 68B, portions corresponding to those in FIG. 67C bear the same reference numerals, and will not be described below. In FIG. 68B, low resistance conductive layer 202 is connected to impurity regions 212a and 212b through contact holes 216a and 216b, respectively. Impurity region 200a is not connected to low resistance conductive layer 202, and is merely connected to diffusion layer 205 shown in FIG. 68A.

As shown in FIG. 68B, the position of contact hole is changed in the structure of the direct connection between the main source line and the sub-source line. By this mere change, a floating gate field effect transistor having the same structure as the memory cell can be used as a source line select transistor. In this case, only change in position of contact holes is required, and no additional manufacturing step is required.

Structure 2 of Source Line Select Transistor

If the source line select transistor is formed of a field effect transistor of a single gate type, which in turn has a single gate electrode, instead of a field effect transistor of a multi-gate type such as a floating gate field effect transistor, the memory cell and the source line select transistor have different structures and therefore different electrical characteristics. Accordingly, it is necessary to arrange an isolating region between the memory cell and the source line select transistor. This is required because processing such as implantation of impurity ions must be performed in different steps and that the transistors sizes are different. Description will now be given on a manufacturing method in the case where an MOS transistor of the single gate type is used as the source line select transistor.

Figure 69A:
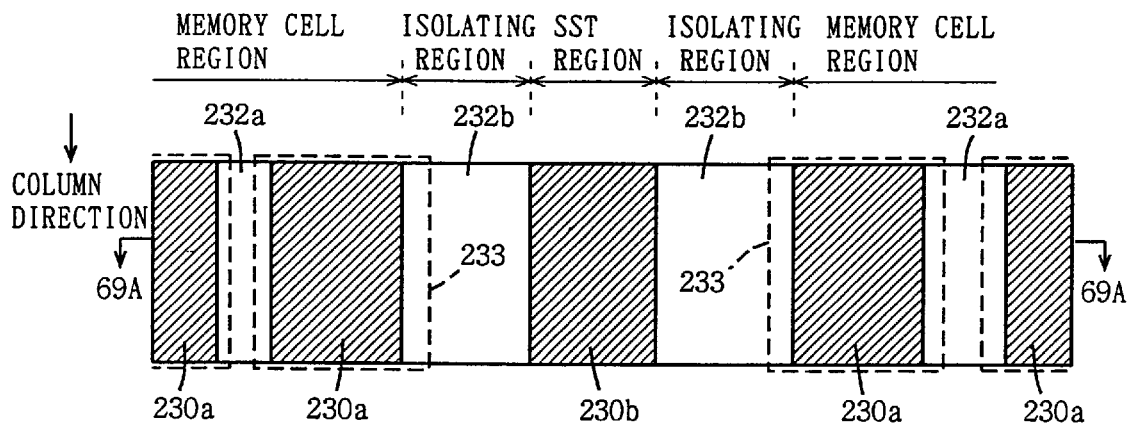
FIGS. 69A and 69B represent a step in a method of manufacturing a nonvolatile semiconductor memory device according to the embodiment 11 of the invention.

In FIG. 69A, active regions 230a which extend in the column direction for forming memory cell transistors are arranged in a memory cell region, and active regions 230b are also formed along the column direction for forming the source line select transistors. Isolation regions each made of a relatively wide oxide film 232b are formed between the memory cell regions and the regions for forming source line select transistors (SST regions). Thermal oxide films 232a for element isolation are likewise formed between memory cell transistors.

After forming the active regions, conductive layer 230a to be a floating gate is so formed in the memory cell region as to cover each active region. Conductive layer 230a is then patterned along the bit line extending i.e., the column direction.

Figure 69B:
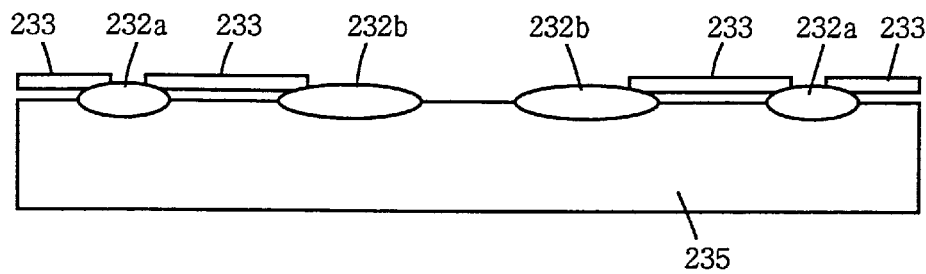

FIG. 69B schematically shows a sectional structure taken along line 69A—69A in FIG. 69A. As shown in FIG. 69B, thermal oxide films 232a and 232b are formed at the surface of a semiconductor substrate region 235 with a space between each other, as shown in FIG. 69B. In contact with these thermal oxide films, conductive layers 233 to be floating gates are formed on semiconductor substrate region 235. In the region for forming a source line select transistor, no floating gate is required, and therefore the substrate region (active region) is held in the exposed state (it is masked when forming the floating gate).

Figure 70A:
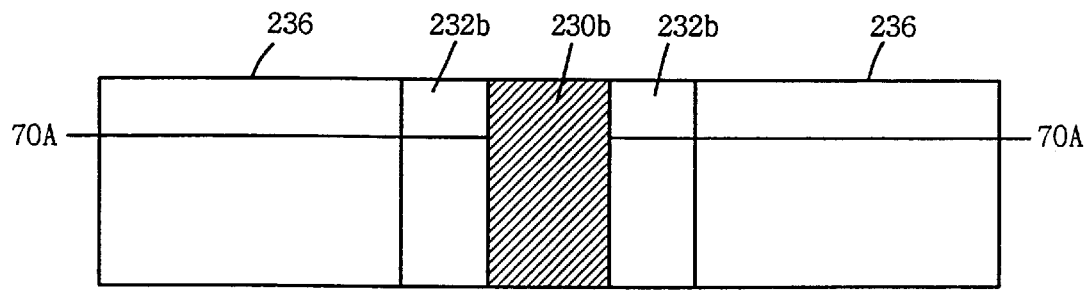
FIGS. 70A and 70B represent a step in the method of manufacturing the nonvolatile semiconductor memory device according to the embodiment 11 of the invention.

Then, as shown in FIG. 70A, over the entire surface an interlayer insulating film such as an ONO film which has a multilayer structure of an oxide film, a nitride film and an oxide film is formed, and then a resist film 236 covering the memory cell regions is formed. FIG. 70A does not show the interlayer insulating film formed of, e.g., an ONO film. Resist film 236 completely covers conductive layers 230a to be floating gate electrodes formed on thermal oxide films 232b formed at the isolating regions.

Figure 70B:
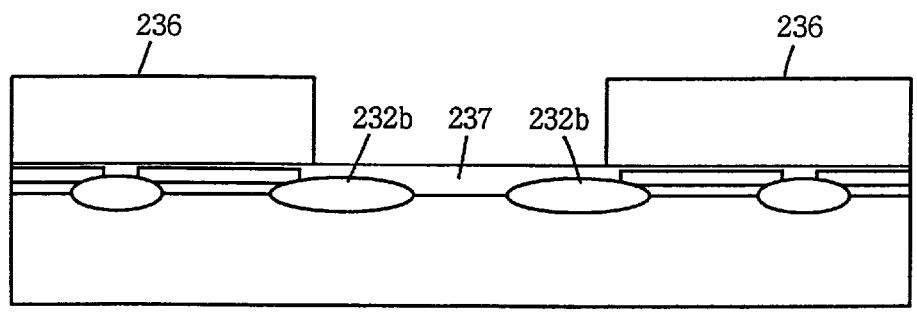

FIG. 70B schematically shows a sectional structure taken along line 70A—70A in the plan layout shown in FIG. 70A. As shown in FIG. 70B, resist film 236 is formed covering the memory cell region and a portion of the isolating region. The interlayer insulating film made of, e.g., an ONO film is formed at the portion under resist film 236 as well as isolating region and source line select transistor formation region.

Using resist film 236 as a mask, etching is performed to remove the interlayer insulating film which is present between the conductive layers to be a floating gate electrode and a word line at an upper layer.

Figure 71:
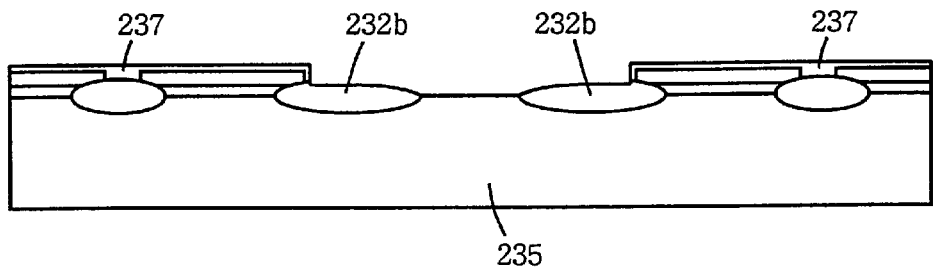
FIG. 71 is a cross section depicting the method of manufacturing the nonvolatile semiconductor memory device according to the embodiment 11 of the invention.

The interlayer insulating film (which will be referred to as the "ONO film" hereinafter) formed of the ONO film is required at the portions where the floating gate electrodes are formed, but is not required at the peripheral circuit portions as well as the section select transistor portions in the DINOR type flash memory. Similarly to removal by etching at the SST region, therefore, etching is effected on the peripheral circuit portion and the section select transistor region. Since the ONO film has a multilayer structure including the oxide films and the nitride film, this step of removing the ONO film includes a step of etching the nitride film and a step of etching the oxide film using, e.g., hydrofluoric acid (HF). Therefore, as shown in FIG. 71, the surface of thermal oxide film 232b formed at the isolating region is partially removed by the etching performed for ONO film 237. The lowest layer (oxide film) of ONO film 237 which in turn is removed in this step is in contact with the peripheral circuit region and the region to be a channel region of the source line select transistor. Therefore, it is necessary that the removal of the oxide film at the lowest layer of ONO film 237 does not damage the surface of semiconductor substrate 235. Therefore, the above removal is performed by an oxide film wet etching method using liquid etchant of, e.g., hydrofluoric acid.

Figure 72:
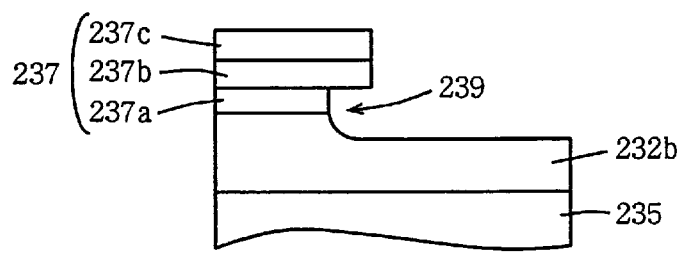
FIG. 72 shows, on an enlarged scale, a structure of a boundary of an isolating and insulating film shown in FIG. 71.
Figure 73:
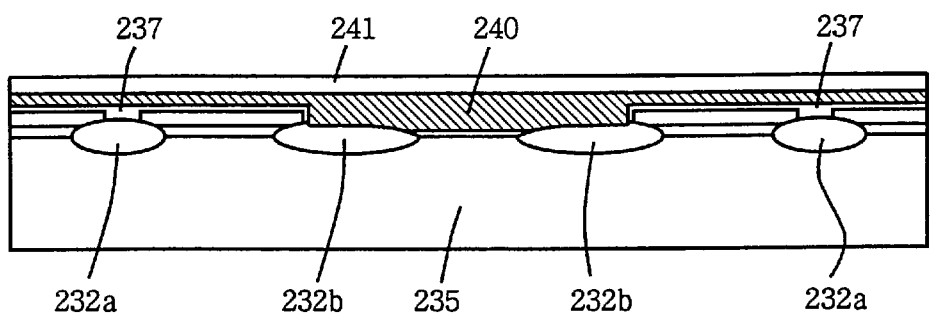
FIG. 73 shows a step in the method of manufacturing the nonvolatile semiconductor memory device according to the embodiment 11 of the invention.

As shown in FIG. 72, the ONO film has the multilayer structure formed of oxide film 237a, nitride film 237b and oxide film 237c. When an oxide film etching with liquid etchant is performed to remove isolation oxide film 232b, nitride film 237b formed on lowest oxide film 237a in ONO film 237 is not etched away because the nitride film has an extremely low etching rate to liquid etchant (e.g., hydrofluoric acid) used for etching the oxide film. As shown in FIG. 72, a lateral hole 239 is formed at an edge of isolating oxide film 230b. After removing ONO film 237 by etching, the gate insulating film is formed at the SST region as shown in FIG. 73, and then conductive layer 240 to be a word line is formed and patterned. Thereafter, an interlayer insulating film 241 is formed on conductive layer 240 to be a word line.

Figure 74A:
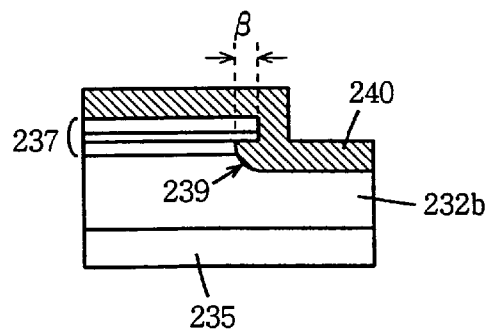
FIGS. 74A and 74B show, on an enlarge scale, a structure of the boundary of the isolating and insulating film in the step shown in FIG. 73.
Figure 74B:
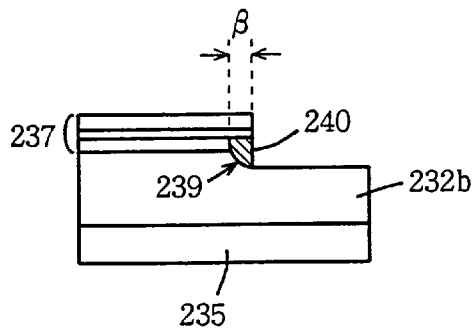

When conductive layer 240 to be a word line is formed, conductive layer 240 is deposited in lateral hole 239 of thermal oxide film 232b formed at the isolating region. In FIG. 74A, a reference character "β" represents a quantity of the conductive layer deposited in lateral hole 239. The conductive layer 240 deposited in lateral hole 239 cannot be removed by merely effecting anisotropic etching on conductive layer 240 because ONO film 237 functions as a mask. As a result, conductive layer 240 remains in lateral hole 239 as shown in FIG. 74B. Since conductive layer 240 remaining in lateral hole 239 extends in the column direction, it may cause a short circuit between the word lines. Therefore, it is necessary to remove conductive layer 240 remaining in lateral hole 239. This removal is performed by utilizing a step of effecting etching on the ONO film and the electrode layer to be the floating gates, which are masked with the conductive layer patterned into a word line, as shown in FIG. 75.

As shown in FIG. 73, conductive layer 240 to be a word line and interlayer insulating film 241 thereon are formed and then patterned. Using interlayer insulating film 241 thus patterned as a mask, etching is effected on conductive layer 233 to be a floating gate and is also effected on ONO film 237.

Figure 75:
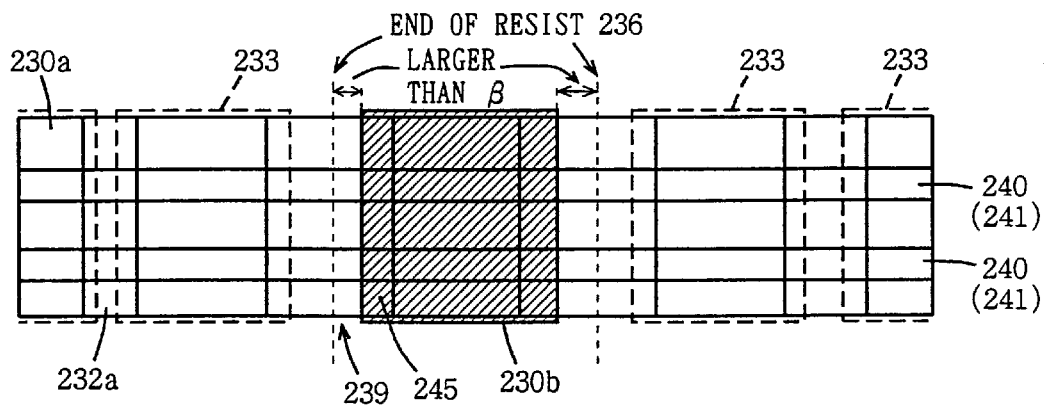
FIG. 75 represents a step in the method of manufacturing the nonvolatile semiconductor memory device according to the embodiment 11 of the invention.

In the step of patterning the floating gate and the underlying ONO film, a mask 245 is formed to cover the select transistor formation region as shown in FIG. 75. Mask 245 thus formed has an end, located between the end of resist film 236 formed as shown in FIGS. 70A and 70B and the end of active region 230b of the source line select transistor formation region, and covers active region 230b. In this state, etching is effected for patterning the floating gate and the ONO film. In this step, ONO film 237 in the structure shown in FIG. 71 is removed from the region for forming the source line select transistor so that the substrate surface is exposed, and then the gate insulating film is formed.

Patterning of the gate insulating film in this source line select transistor formation region may be performed in either of steps before and after etching away electrode layer 233 to be a floating gate and overlaid ONO film 237, using conductive layer 240 to be a word line and overlaid interlayer insulating film 241 as a mask.

Figure 76:
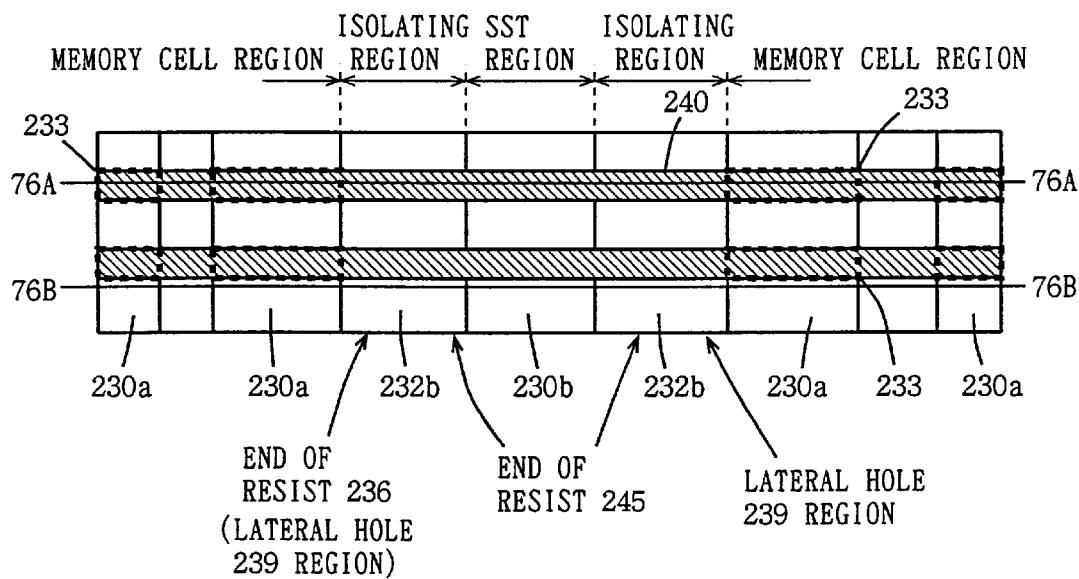
FIG. 76 represents a step in the method of manufacturing the nonvolatile semiconductor memory device according to the embodiment 11 of the invention.

Etching in a self-aligned manner is effected on conductive layer 240 to be word lines (or insulating film 241 at an upper layer) so that electrode layer 233 to be the floating gate is formed under conductive layer 240 forming the word line as shown in FIG. 76. At the same time, the overlying ONO film is likewise removed through the step of etching the oxide film, nitride film and oxide film in a self-aligned manner. At the same time, the region having lateral hole 239 in the isolating region is removed by etching the region between the word lines. In this state, therefore, the sectional structure taken along line 76A—76A in FIG. 76A is the same as that shown in FIG. 73. FIG. 73 shows a state wherein the gate insulating film of the single gate field effect transistor is already formed in the source line select transistor formation region (SST region).

Figure 77:
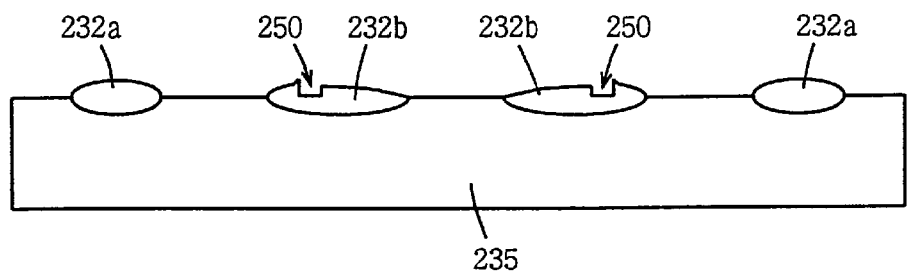
FIG. 77 schematically shows a cross section taken along line 76B—76B in FIG. 76.
Figure 78:
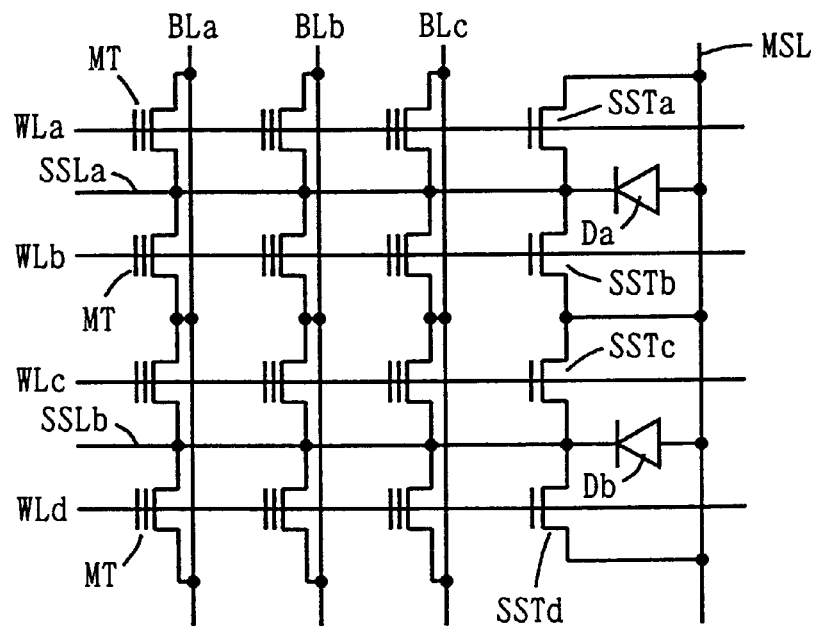
FIG. 78 shows a structure of a main portion of a conventional nonvolatile semiconductor memory device.
Figure 79:
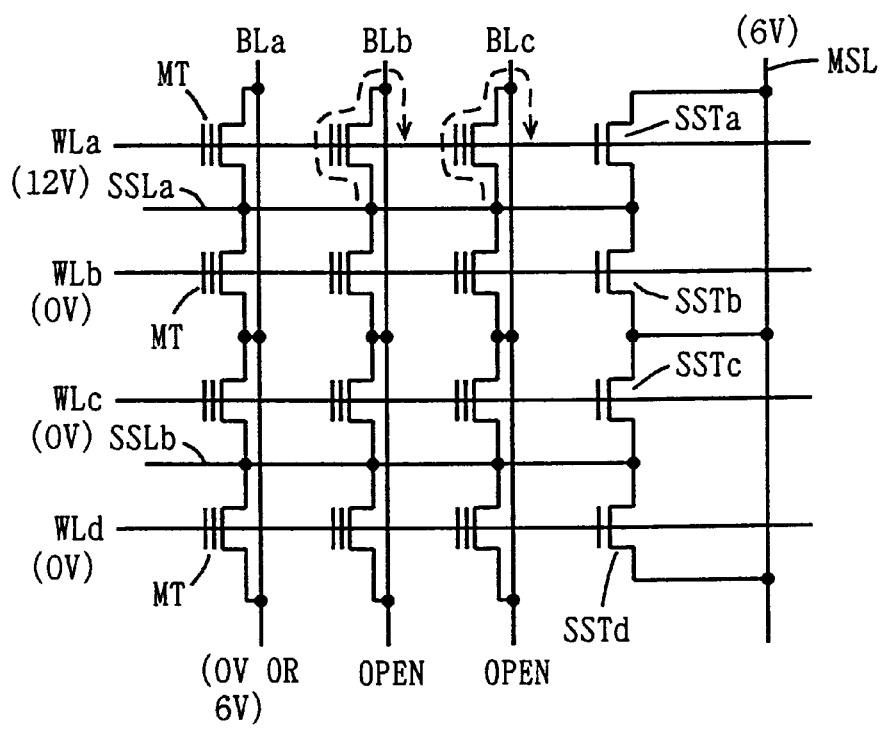
FIG. 79 shows another structure of the conventional nonvolatile semiconductor memory device.

A sectional structure taken along line 76B—76B in FIG. 76 is shown in FIG. 77. In the region wherein the conductive layer to be the word line is not formed, the gate insulating film (including the gate insulating film of the source line select transistor) formed of the ONO film on the surface of semiconductor substrate region 235 is entirely removed by etching, as shown in FIG. 77. During the process of etching away the ONO film and conductive layer 233 to be the floating gate, region 239 of isolating oxide film 232b having the lateral hole is exposed at a portion between the word lines, and therefore is likewise subjected to the etching. Therefore, as shown in FIG. 77, a region 250 not having lateral hole 239 is likewise removed by the etching because it is not covered with resist 245, and conductive layer 240 deposited in lateral hole 239 is removed by etching as shown in FIG. 74B. The ONO film includes a nitride film, and thus includes a film having a low etching rate to liquid etchant such as hydrofluoric acid (HF). The ONO film is etched and removed for forming the source line select transistors and the single-gate field effect transistors in the peripheral circuit region. Thereafter, on the same region, the ONO film is etched with liquid etchant such as hydrofluoric acid, and conductive layer 233 to be the floating gate is etched away.

Thereby, the portion having lateral hole 239 between conductive layers 240 to be the word lines is removed, and it is possible to prevent a possible short circuit between the adjacent word lines due to conductive layer 240 formed in lateral hole 239. In this case, however, a portion of isolation oxide film 232b, i.e., the portion having lateral hole 239 is removed by etching as shown in FIG. 77, and the portion recessed by the etching has a reduced thickness. Therefore, it is necessary to perform the above etching such that recessed portion 250 in isolating oxide film 232b may not reach semiconductor substrate region 235.

As described above, the two steps are employed for etching the ONO film and the floating gate electrode layer. This is because in lateral hole 239, the nitride film and the oxide film among the films forming the ONO film are formed above conductive layer 240 to be the word line and the above two steps are required for etching and removing both the multi-layered structure (i.e., the oxide film and the nitride film) and conductive layer 240. The lower portion of conductive layer 240 to be the word line remains in lateral hole 239. This does not exert any adverse influence because the conductive layers to be the adjacent word lines are isolated from each other.

Concavity 250 in FIG. 77 is formed by the following reason. The ONO film is etched and removed by successively etching and removing the oxide film, nitride film and oxide film. In the process of etching the lowest oxide film, conductive layer 240 is partially etched (the oxide film and the conductive layer have different etching rates), and then remaining conductive layer 240 is removed by etching when the conductive layer to be the floating gate is etched. Therefore, concavity 250 is formed at the lateral hole formation region. In the portion not covered with resist film or mask 245, the surface of isolating and insulating film 232b is likewise etched during etching of the oxide films of the ONO film in the process of etching the ONO film.

Interlayer insulating film 232a is entirely covered with the ONO film, and therefore is prevented from reducing in thickness. Also, in the step of etching conductive layer 240, isolating oxide film 232a exhibits a low etching rate to etchant which is used for etching conductive layer 240, and is prevented from reducing in thickness.

According to the embodiment 11 of the invention, as described above, the multilayer/single-layer field effect transistors can be used as the source line select transistors without additionally complicated manufacturing steps.

According to the invention, as described above, the source line select transistors are provided corresponding to the word lines, and the memory cell connected to a selected word line is connected to main source line and the corresponding sub-source line. During programming and erasing, voltages on the word lines and bit lines are determined not to apply a programming voltage to the sub-source line. Therefore, the drain disturb stress on the memory cell is reduced during data writing so that programming and erasing can be performed without impairing the reliability of the memory cell. In a selected column, the memory cell of only one bit at the maximum, which is in the over-low Vth state, may affect a selected memory cell so that accurate data reading can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of memory cells arranged in rows and columns, each of the memory cells formed of a floating gate transistor having first and second conduction nodes and a control electrode node;
   a plurality of word lines arranged corresponding to said rows, respectively, each of the word lines connected to the control electrode nodes of memory cells in a corresponding row;
   a plurality of bit lines arranged corresponding to said columns, respectively, each of the bit lines connected to the first conduction nodes of memory cells in a corresponding column;
   a plurality of select transistors arranged in said rows, and being responsive to signal voltages on the word lines arranged in corresponding rows for being selectively turned on to transmit a reference voltage to the second conduction nodes of memory cells in the corresponding rows; and
   voltage setting circuitry for setting voltages on a word line and a bit line connected to a selected memory cell such that the word line is set to a negative voltage level and the bit line is set to a around voltage level in an erasure operation mode of ejecting electrons from the floating gate of the selected memory cell to allow the memory cells connected to said word line to have storage data erased at one time.

2. The nonvolatile semiconductor memory device according to claim 1, wherein
   said voltage setting circuitry includes means for setting the voltages on the word line and the bit line connected to said selected memory cell such that hot electrons in the channel region between the first and second conduction nodes of the selected memory cell are injected into the floating gate of said selected memory cell in said operation mode for injecting electrons into the floating gate of said memory cell, and that a Fowler-Nordheim current flows between the floating gate and the channel region of said selected memory cell in an operation mode for ejecting electrons from the floating gate.

3. The nonvolatile semiconductor memory device according to claim 1, wherein
   said voltage setting circuitry includes means for setting the voltages on the word line and the bit line connected to said selected memory cell such that a Fowler-Nordheim current flows between the channel region formed between the first and second conduction nodes of the selected memory cell and the floating gate of the selected memory cell in said operation mode for injecting electrons into the floating gate of the selected memory cell, and that a Fowler-Nordheim tunneling current flows between the floating gate and the first conduction node in an operation mode for ejecting electrons from said floating gate.

4. The nonvolatile semiconductor memory device according to claim 1, wherein
   said reference voltage is a voltage held at a constant level independently of the operation mode.

5. The nonvolatile semiconductor memory device according to claim 1, wherein
   each of the select transistors is formed of a floating gate field effect transistor.

6. The nonvolatile semiconductor memory device according to claim 5, further comprising:
   circuitry for setting a level of said reference voltage such that, in said operation mode for injecting electrons into the floating gate, electrons are injected into the floating gate of a select transistor arranged in a same row common to said selected memory cell when electrons are injected into the floating gates of all the memory cells in the same row.

7. The nonvolatile semiconductor memory device according to claim 5, further comprising:
   circuitry for setting a level of said reference voltage such that, in said operation mode for ejecting electrons from the floating gate, electrons are ejected from the floating gate of a select transistor arranged in a same row common to said selected memory cell.

8. The nonvolatile semiconductor memory device according to claim 1, wherein
   each of the bit lines has a plurality of sub-bit lines each connected to the first conduction nodes of a plurality of memory cells, and a main bit line provided commonly to said plurality of sub-bit lines; and wherein
   said nonvolatile semiconductor memory device further comprises:
   circuitry for charging said main bit line to a predetermined voltage level, and
   circuitry for connecting said main bit line to a selected sub-bit line among said plurality of sub-bit lines and comparing the voltage on said main bit line with said predetermined voltage after charging said main bit line to the predetermined voltage level.

9. The nonvolatile semiconductor memory device according to claim 1, further comprising:
   capacitance means having a capacitance value substantially equal to that of a bit line of interest on object for measurement included in said plurality of bit lines;
   circuitry for charging said capacitance means to a predetermined voltage level; and
   circuitry for connecting said capacitance means to said bit line of interest, and comparing a voltage on said bit line of interest with a reference voltage.

10. The nonvolatile semiconductor memory device according to claim 1, further comprising:
    circuitry for coupling each of two bit lines selected from said plurality of bit lines to a capacitance means charged to a predetermined voltage level; and
    circuitry for determining whether said two bit lines are at an equal voltage level, after coupling said two bit lines to said capacitance means.

11. The nonvolatile semiconductor memory device according to claim 1, further comprising:
    a plurality of reference voltage transmission lines each provided commonly to the memory cells in a predetermined number of rows and transmitting the reference voltage from the select transistors provided for corresponding predetermined number of rows to the second conduction nodes of memory cells in the corresponding predetermined number of rows; and
    circuitry for setting, in a data read mode, a voltage on an unselected word line in a set of the predetermined number of rows including a selected word line to a voltage level smaller in absolute value to a voltage transmitted onto a selected bit line and opposite in polarity to the voltage on said selected word line.

12. The nonvolatile semiconductor memory device according to claim 1, further comprising:
    a plurality of reference voltage transmission lines provided corresponding to said plurality of word lines, respectively, each of the reference voltage transmission lines provided independently from others for transmitting the reference voltage from the select transistor in a corresponding row to the second conduction nodes of memory cells in the corresponding row.

13. The nonvolatile semiconductor memory device according to claim 1, wherein the memory cells in each of the columns are divided into a plurality of groups, said plurality of bit lines include a plurality of bit lines arranged corresponding to the respective groups in each column and connected to the memory cells in corresponding groups, and said plurality of groups are determined such that the memory cells in adjacent rows belong to different groups.

14. The nonvolatile semiconductor memory device according to claim 1, further comprising:

a plurality of reference voltage transmission lines each provided corresponding to a set including two adjacent rows for transmitting the reference voltage from the select transistors in the rows of a corresponding set to the memory cells in the corresponding set of two adjacent rows, wherein the bit lines are arranged two for each column, and the memory cells in a common column and in different rows sharing a reference voltage transmission line are connected to different bit lines, respectively.

15. The nonvolatile semiconductor memory device according to claim 1, further comprising:

conductive interconnection layers arranged corresponding to the rows, and formed above a substrate having said plurality of memory cells formed thereon, for transmitting the reference voltage from the select transistor in corresponding rows to the second conduction nodes of memory cells in the corresponding rows.

16. The nonvolatile semiconductor memory device according to claim 13, wherein the bit lines arranged corresponding to said plurality of groups in a common column includes conductive interconnection lines arranged in different interconnection layers.

17. The nonvolatile semiconductor memory device according to claim 13, wherein each of the bit lines arranged corresponding to each of said plurality of groups in each columns includes conductive interconnection lines formed at different interconnection layers, and the bit line portions adjacent to each other in a row direction include interconnection lines formed at different interconnection layers.

18. The nonvolatile semiconductor memory device according to claim 14, wherein active regions for forming the memory cells of a column are shifted from each other to be aligned in two lines along a bit line extending direction.

19. The nonvolatile semiconductor memory device according to claim 1, further comprising a main reference voltage line for transmitting said reference voltage to each of said plurality of select transistors; and sense circuitry for performing data reading by detecting a current flowing through said main reference voltage line in a data read mode.

20. The nonvolatile semiconductor memory device according to claim 1, wherein said main reference voltage line comprises a plurality of reference voltage transmission lines each provided for a predetermined number of columns of said columns, said plurality of select transistors includes the select transistors each provided for said predetermined number of columns in each respective row of the memory cells.

* * * * *

UNITED STATES PATENT AND TRADEMARK OFFICE
CERTIFICATE OF CORRECTION

PATENT NO. : 6,144,584
DATED : November 7, 2000
INVENTOR(S) : Yuichi Kunori et al.

It is certified that error appears in the above-identified patent and that said Letters Patent is hereby corrected as shown below:

Column 57, claim 1,
Delete lines 22-29 and replace with

-- voltage setting circuitry for setting voltages on a word line and a bit line connected to a selected memory cell such that the word line is set to a voltage greater in absolute value than a normal operating power supply voltage level and the bit line is set to a level of a voltage equal to a voltage at a substrate region of the memory cells in an erasure operation mode of ejecting electrons from the floating gate of the selected memory cell to allow the memory cells connected to said word line to have storage data erased at one time. --.

Column 57,
Cancel Claim 3.

Signed and Sealed this

Eighteenth Day of December, 2001

Attest:

JAMES E. ROGAN
*Attesting Officer*         *Director of the United States Patent and Trademark Office*